US009634691B2

(12) United States Patent
Song et al.

(10) Patent No.: US 9,634,691 B2
(45) Date of Patent: Apr. 25, 2017

(54) TRANSMITTING SYSTEM AND METHOD OF TRANSMITTING DIGITAL BROADCAST SIGNAL IN TRANSMITTING SYSTEM

(71) Applicant: LG ELECTRONICS INC., Seoul (KR)

(72) Inventors: Won Gyu Song, Seoul (KR); Byoung Gill Kim, Seoul (KR); Jin Woo Kim, Seoul (KR); Hyoung Gon Lee, Seoul (KR); Jae Hyung Song, Seoul (KR); In Hwan Choi, Gyeonggi-do (KR); Chul Kyu Mun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 623 days.

(21) Appl. No.: 14/104,956

(22) Filed: Dec. 12, 2013

(65) Prior Publication Data
US 2014/0108893 A1   Apr. 17, 2014

Related U.S. Application Data

(63) Continuation of application No. 12/961,155, filed on Dec. 6, 2010, now Pat. No. 8,634,347.
(Continued)

(51) Int. Cl.
*H03M 13/05* (2006.01)
*H04H 20/30* (2008.01)
(Continued)

(52) U.S. Cl.
CPC ......... *H03M 13/05* (2013.01); *H03M 13/253* (2013.01); *H03M 13/256* (2013.01);
(Continued)

(58) Field of Classification Search
CPC .. H04H 20/30; H04H 20/57; H04N 21/23439; H04N 21/235; H04N 21/2365;
(Continued)

(56) References Cited

U.S. PATENT DOCUMENTS

| | | | |
|---|---|---|---|
| 2009/0028081 A1* | 1/2009 | Song | H04W 4/06 370/310 |
| 2009/0037792 A1* | 2/2009 | Choi | H04H 20/30 714/755 |

(Continued)

*Primary Examiner* — Khaled Kassim
*Assistant Examiner* — Zhaohui Yang
(74) *Attorney, Agent, or Firm* — Birch, Stewart, Kolasch & Birch, LLP

(57) ABSTRACT

A transmitting system and a method of transmitting digital broadcast signal are disclosed. The method of transmitting digital broadcasting signal in a transmitter includes multiplexing a specified number of mobile data packets, a first scalable number of mobile data packets, and a second scalable number of main data packets, interleaving mobile data in the mobile data packets and main data in the main data packets, transmitting the interleaved mobile and main data during a slot, wherein the data group includes a plurality of first blocks, each first block including a plurality of data segments, specified block of the plurality of first blocks including the mobile data, known data sequence, trellis initialization data and RS parity bytes inserted in pre-determined position of the data group, wherein the data group includes a plurality of regions, wherein the last region includes the first scalable number of mobile data packets.

12 Claims, 61 Drawing Sheets

Related U.S. Application Data

(60) Provisional application No. 61/285,179, filed on Dec. 10, 2009.

(51) Int. Cl.
| | | |
|---|---|---|
| *H04H 20/57* | (2008.01) | |
| *H03M 13/25* | (2006.01) | |
| *H03M 13/29* | (2006.01) | |
| *H03M 13/00* | (2006.01) | |
| *H04N 21/2343* | (2011.01) | |
| *H04N 21/235* | (2011.01) | |
| *H04N 21/2383* | (2011.01) | |
| *H04N 21/2365* | (2011.01) | |
| *H04N 5/38* | (2006.01) | |
| *H03M 13/09* | (2006.01) | |
| *H03M 13/15* | (2006.01) | |

(52) U.S. Cl.
CPC ... *H03M 13/2915* (2013.01); *H03M 13/2966* (2013.01); *H03M 13/6538* (2013.01); *H04H 20/30* (2013.01); *H04H 20/57* (2013.01); *H04N 21/235* (2013.01); *H04N 21/2365* (2013.01); *H04N 21/2383* (2013.01); *H04N 21/23439* (2013.01); *H03M 13/09* (2013.01); *H03M 13/1515* (2013.01); *H04N 5/38* (2013.01)

(58) Field of Classification Search
CPC ..... H04N 21/2383; H04N 5/38; H03M 13/05; H03M 13/09; H03M 13/1515; H03M 13/253; H03M 13/256; H03M 13/2915; H03M 13/2966

See application file for complete search history.

(56) References Cited

U.S. PATENT DOCUMENTS

| | | | |
|---|---|---|---|
| 2009/0041129 A1* | 2/2009 | Suh | H04H 20/55 375/240.25 |
| 2009/0083606 A1* | 3/2009 | Choi | H04H 20/30 714/776 |
| 2009/0228765 A1* | 9/2009 | Lee | H03M 13/2966 714/776 |

* cited by examiner

FIG. 10

| Group Type | Group Division | | Group Format | # pkt / Slot | | Description |
| --- | --- | --- | --- | --- | --- | --- |
| | Primary ABCD / AB | Secondary -/ CD | | M/H | Main | |
| 0 | ABCD / AB | -/ CD | G0 | 118 | 38 | CMM (no Region E) |
| 1-0 | ABCD | E | G1-0 | 156 | 0 | Region ABCD: CMM<br>Region E: EMM |
| 1-1 | ABCD | E | G1-1 | 155 | 1 | |
| 1-2 | ABCD | E | G1-2 | 154 | 2 | |
| 1-4 | ABCD | E | G1-4 | 152 | 4 | |
| 1-8 | ABCD | E | G1-8 | 148 | 8 | |
| 2-0 | AB | CDE | G2-0 | 156 | 0 | Region AB: CMM<br>Region CDE: EMM |
| 2-1 | AB | CDE | G2-1 | 155 | 1 | |
| 2-2 | AB | CDE | G2-2 | 154 | 2 | |
| 2-4 | AB | CDE | G2-4 | 152 | 4 | |
| 2-8 | AB | CDE | G2-8 | 148 | 8 | |
| 3-0 | ABCD | - | G2-0 | 156 | 0 | All Region: EMM |
| 3-1 | ABCD | - | G2-1 | 155 | 1 | |
| 3-2 | ABCD | - | G2-2 | 154 | 2 | |
| 3-4 | ABCD | - | G2-4 | 152 | 4 | |
| 3-8 | ABCD | - | G2-8 | 148 | 8 | |
| 4 | ABCD | - | G3 | 156 | 0 | Increased Bandwidth Mode (Special Use Case)<br>No MPEG2 Headers, No VSB RS parities.<br>Output packet of Pre-processor has 207 bytes not 188 bytes |

Black: A/153-compatible (CMM)
Bold: A/153-non-compatible (EMM)

Note: A Parade consists of Group Divisions from Groups having an identical Group Type

FIG. 46

| Type Indicator (3) | Error Indicator (1) | Stuff Indicator (1) | Pointer Indicator (11) | Payload (N-2) bytes |

FIG. 47
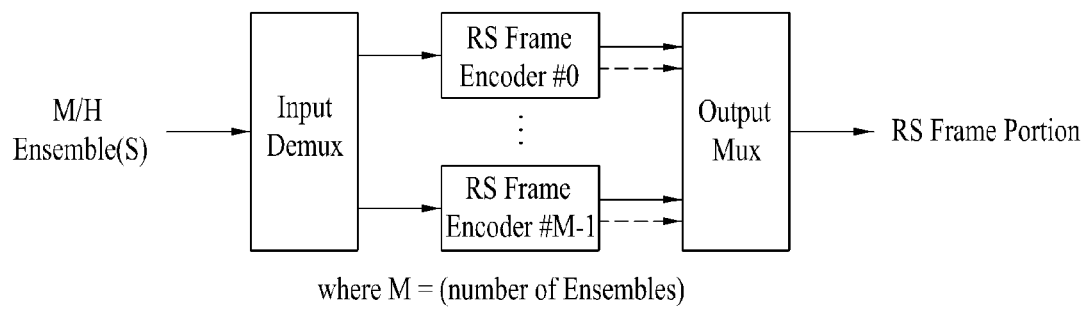
(a)
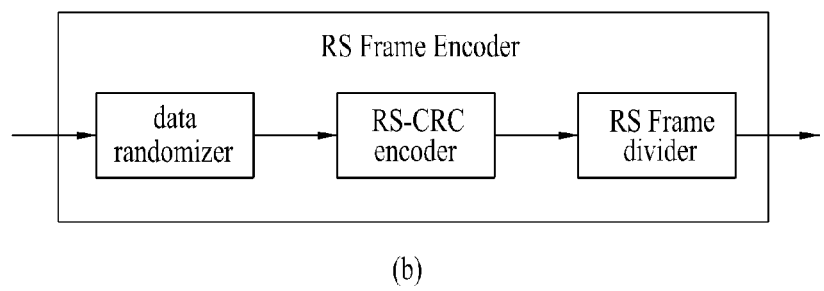
(b)

FIG. 54

```
sig_overlay_data {
  num overlay_parade (4b)
  overlay_parade_map (16b)
  loop 1:num_overlay_parade {
    overlay_parade_id (4b)
  }
  reserved (4b+)
  CRC (8b)
}
→ total 96bits
```

FIG. 56

| Group Type | Group Division | | RS Frame Mode | Group Extension Mode |
|---|---|---|---|---|
| | Prim. | Sec. | | |
| 0 | ABCD | - | 00 | 000 |
| | AB | CD | 01 | 000 |
| 1-0 | ABCD | E | 00 | 001 |
| 1-1 | | | | 010 |
| 1-2 | | | | 011 |
| 1-4 | | | | 100 |
| 1-8 | | | | 101 |
| 2-0 | AB | CDE | 01 | 001 |
| 2-1 | | | | 010 |
| 2-2 | | | | 011 |
| 2-4 | | | | 100 |
| 2-8 | | | | 101 |
| 3-0 | ABCDE | - | 10 | 001 |
| 3-1 | | | | 010 |
| 3-2 | | | | 011 |
| 3-4 | | | | 100 |
| 3-8 | | | | 101 |
| 4 | ABCDE | - | 10 | 111 |

FIG. 57

| Syntax | No. of Bits | Format |
|---|---|---|
| TPC_data { | | |
| Sub-Frame_number | 3 | uimsbf |
| Slot_number | 4 | uimsbf |
| Parade_id | 7 | uimsbf |
| starting_Group_number | 4 | uimsbf |
| number_of_Groups | 3 | uimsbf |
| Parade_repetition_cycle | 3 | uimsbf |
| RS_Frame_mode | 2 | bslbf |
| RS_code_mode_primary | 2 | bslbf |
| RS_code_mode_secondary | 2 | bslbf |
| SCCC_Block_mode | 2 | bslbf |
| SCCC_outer_code_mode_A | 2 | bslbf |
| SCCC_outer_code_mode_B | 2 | bslbf |
| SCCC_outer_code_mode_C | 2 | bslbf |
| SCCC_outer_code_mode_D | 2 | bslbf |
| SCCC_outer_code_mode_E | 2 | bslbf |
| FIC_version | 5 | uimsbf |
| Parade_continuity_counter | 4 | uimsbf |
| TnoG | 5 | uimsbf |
| overlay_group_status | 3 | uimsbf |
| group_extension_mode | 2 | uimsbf |
| reserved | 19 | bslbf |
| } | 1 | |

TRANSMITTING SYSTEM AND METHOD OF TRANSMITTING DIGITAL BROADCAST SIGNAL IN TRANSMITTING SYSTEM

CROSS-REFERENCE TO RELATED APPLICATIONS

This application is a continuation of U.S. patent application Ser. No. 12/961,155, filed on Dec. 6, 2010, which claims the benefit of U.S. Provisional Application No. 61/285,179, filed on Dec. 10, 2009, the contents of which are hereby incorporated by reference herein in their entirety.

BACKGROUND OF THE INVENTION

The Field of the Invention

The present invention relates to a digital broadcasting system for transmitting and receiving a digital broadcast signal, and more particularly, to a transmitting system for processing and transmitting the digital broadcast signal, and a method of processing data in the transmitting system and the receiving system.

Description of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a transmitting system and a method of processing a digital broadcast signal in a transmitting system that substantially obviate one or more problems due to limitations and disadvantages of the related art.

An object of the present invention is to provide a transmission system which is able to transmit additional mobile service data while simultaneously maintaining the compatibility with a conventional system for transmitting a digital broadcast signal, and a method for processing a broadcast signal.

Another object of the present invention is to provide a method of transmitting mobile services that can flexibly respond to changes in a mobile broadcasting system, by processing a partial region of a data group so as to be compatible with the conventional mobile broadcasting system, or by processing the entire region of a data group so as to be used for a new mobile broadcasting system.

Another object of the present invention is to provide a transmission system which additionally inserts mobile service data and known data recognized by an agreement between a transmission system and a reception system into a conventional mobile service data area, thereby enhancing the reception performance of the mobile service data at the reception system, and a method for processing a broadcast signal.

Another object of the present invention is to provide a transmission system which forms continuous known data sequences by interconnecting discontinuous known data belonging to each data group through a concatenated structure of adjacent data groups, thereby enhancing the reception performance of a broadcast signal at a reception system, and a method for processing a broadcast signal.

Another object of the present invention is to provide a transmission system which generates information of additional mobile service data by extending signaling information and transmits the generated information to a reception system, such that the transmission system and the reception end can smoothly communicate with each other, and a method for processing a broadcast signal.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of transmitting a digital broadcasting signal in a transmitter includes multiplexing a specified number of mobile data packets, a first scalable number of mobile data packets, and a second scalable number of main data packets, interleaving mobile data in the mobile data packets and main data in the main data packets, transmitting the interleaved mobile and main data during a slot in which the main data and a data group including the mobile data are transmitted, wherein the data group includes a plurality of first blocks, each first block including a plurality of data segments, specified block of the plurality of first blocks including the mobile data, known data sequence, trellis initialization data and RS parity bytes inserted in pre-determined position of the data group, wherein the data group includes a first region including central 4 first blocks in the data group, a second regions including 2 first blocks being concentric about the first regions, a third region including 2 first blocks being concentric about the first and second region and a fourth region including 2 first blocks being concentric about the first, second and third region, wherein the data group further includes a fifth region in which a plurality of second blocks include the first scalable number of mobile data packets.

At least one data segment in the plurality of data segments is shared between the first and second blocks.

The data group includes RS parity bytes in the last 5 segments of the first blocks in the third region.

The trellis initialization data be inserted prior to known data sequence in the second block.

A sum of the first scalable number and the second scalable number is equal to 38.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 10 illustrates an example of each group type being segmented based upon the size of region E according to an embodiment of the present invention.

FIG. 46 is a diagram illustrating examples of fields allocated to the header region within the mobile service data packet according to the present invention. Examples of the fields include type_indicator field, error_indicator field, stuff_indicator field, and pointer field.

FIGS. 47(a) and 47(b) illustrate a data frame encoder according to an embodiment of the present invention.

FIG. 54 illustrates a bit stream syntax structure of signaling overlay data sig_overlay_data( ) for signaling information associated to an overlay parade according to an embodiment of the present invention.

FIG. 56 illustrates an example of designating a field value by including information on an RS_Frame_mode and information on a group_extension_mode within a TPC according to an embodiment of the present invention.

FIG. 57 illustrates a syntax structure of TPC data according to an embodiment of the present invention.

DESCRIPTION OF THE PREFERRED EMBODIMENTS

Figure 1:
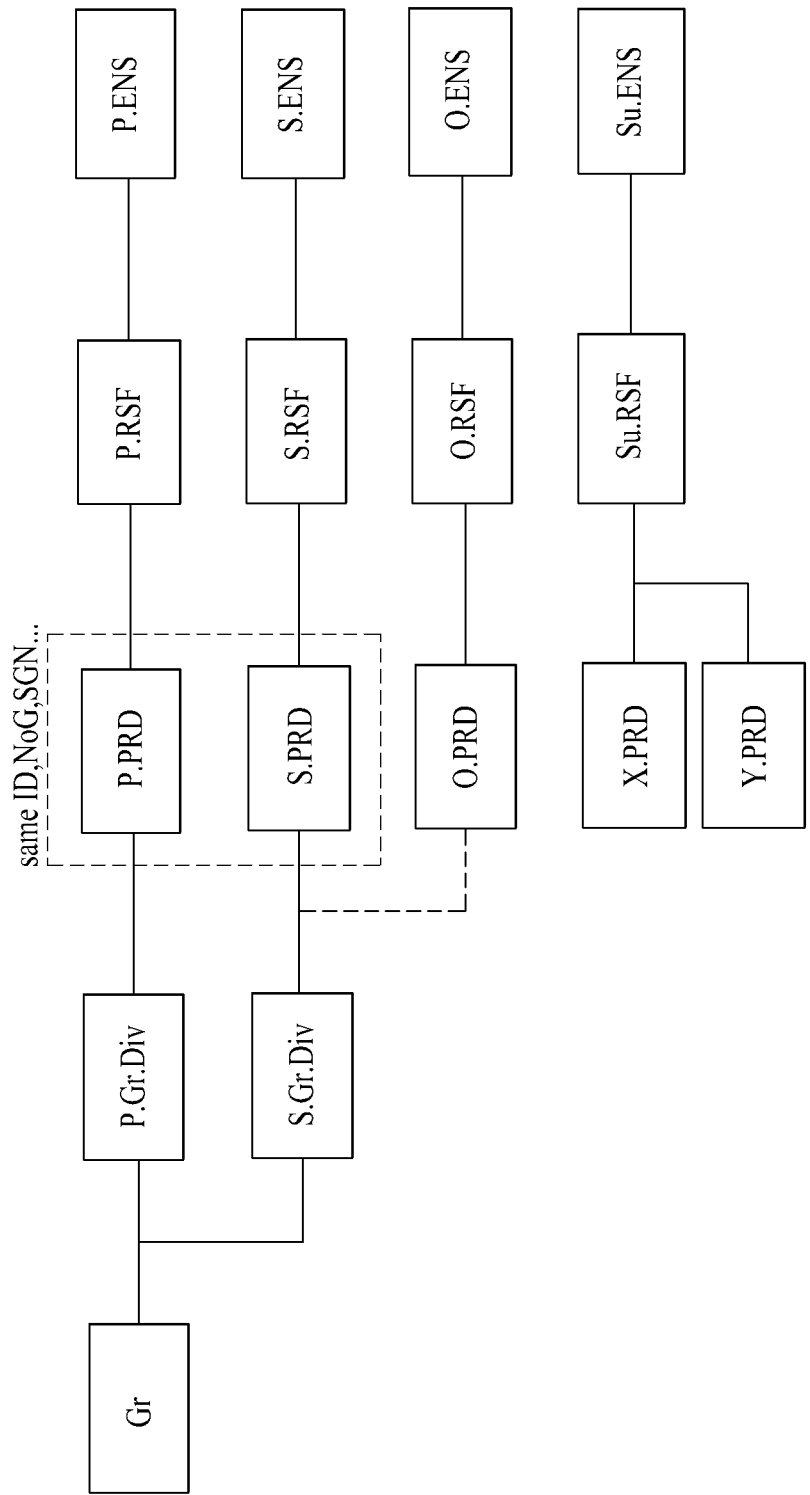
FIG. 1 illustrates the relation between an ensemble, an RS frame, a parade, a group division, and a group according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts.

In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

For convenience of description and better understanding of the present invention, abbreviations and terms to be use in the present invention are defined as follows.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H (or MH)" corresponds to the initials of "mobile" and "handheld" and represents the opposite concept of a fixed-type system. Furthermore, the M/H service data may include at least one of mobile service data and handheld service data, and will also be referred to as "mobile service data" for simplicity. Herein, the mobile service data not only correspond to M/H service data but may also include any type of service data with mobile or portable characteristics. Therefore, the mobile service data according to the present invention are not limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

Additionally, in the embodiment of the present invention, a group (also referred to as an M/H group or a data group) corresponds to a collection (or group) of data packets confined within a slot (also referred to as an M/H slot).

A group division refers to a set of group regions within a slot. Herein, a group division is categorized into a Primary Group Division or a Secondary Group Division. At this point, a collection of primary group divisions within an M/H frame configures (or forms) a primary parade, whereas a collection of secondary group divisions configures (or forms) a secondary parade or an overlay parade.

A group type is determined by the configuration of a group division within a single group.

A parade (also referred to as an M/H parade) refers to a collection of groups that have the same FEC parameters. More specifically, a parade refers to a collection of group divisions of groups having the same group type.

A primary parade (also referred to as a primary M/H parade) corresponds to a collection of primary group divisions, and a secondary parade (also referred to as a secondary M/H parade) corresponds to a collection of secondary group divisions. Each of the secondary group divisions is carried (or transported) through the same slot with its respectively paired primary group division. The secondary parade has the same parade identifier (ID) as its respective primary parade (i.e., the secondary parade shares the same parade ID with its respective primary parade)

An overlay parade (also referred to as an overlay M/H parade) corresponds to a collection of secondary group divisions. And, in this case, the secondary group divisions are not paired with any of the primary group divisions.

An RS frame corresponds to a two(2)-dimensional (2D) data frame, wherein an RS frame payload is RS-CRC encoded.

In a primary RS frame, a primary RS frame parade is RS-CRC encoded. The primary RS frame is transmitted (or carried) through a primary parade.

In a secondary RS frame, a secondary RS frame parade is RS-CRC encoded. The secondary RS frame is transmitted (or carried) through a secondary parade.

In an overlay RS frame, an overlay RS frame payload is RS-CRC encoded. The overlay RS frame is transmitted (or carried) through an overlay parade.

A super RS frame corresponds to an RS frame wherein a super RS frame payload is RS-CRC encoded. The super RS frame is transported (or carried) through two arbitrary parades.

An ensemble (also referred to as an M/H ensemble) refers to a collection of RS frame having the same FEC codes. Herein, each RS frame encapsulates a collection of a collection of IP streams.

A primary ensemble corresponds to a collection of consecutive primary RS frames.

A secondary ensemble corresponds to a collection of consecutive secondary RS frames.

An overlay ensemble corresponds to a collection of consecutive overlay RS frames.

A super ensemble (also referred to as a super M/H ensemble) corresponds to a collection of consecutive super RS frames.

In the embodiment of the present invention, data for mobile services may be transmitted by using a portion of the channel capacity that was used to transmit data for main services. Alternatively, data for mobile service may also be transmitted by using the entire channel capacity that was used to transmit data for main services. The data for mobile services correspond to data required for mobile services. Accordingly, the data for mobile services may include actual mobile service data as well as known data, signaling data, RS parity bytes for error-correcting mobile service data, and so on. In the description of the embodiment of the present invention, the data for mobile services will be referred to as mobile service data or mobile data for simplicity.

The mobile service data may be categorized as mobile service data of a first mobile mode or Core Mobile Mode (CMM) and mobile service data of a second mobile mode or Extended Mobile Mode (EMM) or Scalable Full Channel Mobile Mode (SFCMM).

Furthermore, when the second mobile mode is used along with the first mobile mode, the above-described two modes may be collectively defined as the Scalable Full Channel Mobile Mode (SFCMM).

The first mobile mode is a mode in which Mobile DTV services are transmitted while reserving at least 38 of the 156 packets in each M/H Slot for legacy A/53-compatible services. The second mobile mode is a mode in which Mobile DTV services are transmitted while reserving fewer than 38 of the 156 packets in some or all M/H Slots for legacy A/53-compatible services.

According to the definition of CMM, SFCMM, Ensemble and Parade, the CMM ensemble is a Primary or Secondary Ensemble that is compatible with the CMM system. A CMM Ensemble carries a collection of CMM Services and the SFCMM ensemble is a Primary or Secondary Ensemble that carries a collection of SFCMM Services and is backwards compatible with, but not recognizable by, a CMM receiver/decoder.

And also, the CMM Parade is an M/H Parade that is compatible with the CMM system. A CMM Parade consists of DATA Groups, where each DATA Group does not include the Group Region E and carries an entire RS Frame belonging to the corresponding CMM Ensemble.

The SFCMM Parade is an M/H Parade that is backwards compatible with, but not recognizable by, a CMM system receiver/decoder. An SFCMM Parade consists of DATA Groups, where each DATA Group contains the Group Region E and carries an entire RS Frame belonging to the corresponding SFCMM Ensemble.

The CMM Service is an M/H Service that is compatible with the CMM system. A CMM Service is delivered through a CMM Ensemble. And the CMM Service is an M/H Service that is compatible with the CMM system. A CMM Service is delivered through a CMM Ensemble.

Also, according to an embodiment of the present invention, a group (also referred to as an M/H group or a data group) corresponds to a collection of M/H Encapsulated (MHE) data packets confined within a slot (also referred to as an M/H slot).

A group division corresponds to a collection (or set) of group regions (also referred to as M/H group regions) within a slot. Herein, a group division is categorized into a Primary Group Division or a Secondary Group Division.

A group region corresponds to a collection (or set) of DATA blocks or extended DATA blocks.

A group type is determined by the configuration of a group division within a single group.

Known data—Known data is pre-recognized by an agreement between a transmission system and a reception system, and may be used for channel equalization, etc.

FEC—FEC is an abbreviation of a Forward Error Correction, and is a generic name of technologies wherein a reception end can spontaneously correct an error of a digital signal transmitted from the transmission end to the reception end without retransmission of a corresponding signal by the transmission end.

TPC—TPC is an abbreviation of a Transmission Parameter Channel. TPC is contained in each data group, and then transmitted. The TPC provides information about a data frame and a data group to the reception end, and performs signaling of the provided information.

TS—TS is an abbreviation of a Transport Stream.

RS—RS is an abbreviation of Reed-Solomon.

CRC—CRC is an abbreviation of a Cyclic Redundancy Check.

SCCC—SCCC is an abbreviation of a Serial Concatenated Convolutional Code.

PCCC—PCCC is an abbreviation of a Parallel Concatenated Convolutional Code.

FIC—FIC is an abbreviation of a Fast information channel. FIC carries cross-layer information. This information primarily includes channel binding information between ensembles and services.

Embodiments of the present invention will hereinafter be described with reference to the annexed drawings.

FIG. 1 illustrates the relation between an ensemble, an RS frame, a parade, a group division, and a group according to an embodiment of the present invention.

Referring to FIG. 1, a primary ensemble and a primary RS frame and a primary parade are mapped to a one-to-one-to-one (1:1:1) ratio. A secondary ensemble and a secondary RS frame and a secondary parade are mapped to a one-to-one-to-one (1:1:1) ratio. Also, an overlay ensemble and an overlay RS frame and an overlay parade are mapped to a one-to-one-to-one (1:1:1) ratio. However, a super ensemble and a super RS frame and a super parade are mapped to a one-to-one-to-two (1:1:2) ratio.

According to the embodiment of the present invention, a primary RS frame payload is RS-CRC encoded so as to configure (or form) a primary RS frame. Herein, the primary RS frame is carrier (or transported) through the primary parade. At this point, the primary parade is allocated and transmitted to a plurality of groups. Most particularly, the primary parade is allocated and transmitted to a primary group division of each group.

Also, a secondary RS frame payload is RS-CRC encoded so as to configure (or form) a secondary RS frame. Herein, the secondary RS frame is carrier (or transported) through the secondary parade. At this point, the secondary parade is allocated and transmitted to a secondary group division of each group.

Furthermore, an overlay RS frame payload is RS-CRC encoded so as to configure (or form) an overlay RS frame. Herein, the overlay RS frame is carrier (or transported) through the overlay parade. At this point, the overlay parade is allocated and transmitted to a secondary group division of each group.

More specifically, one group is divided into a primary group division and a secondary group division. At this point, data of a primary parade are allocated to the primary group division. Conversely, data of a secondary parade or data of an overlay parade are allocated to the secondary group division. In other words, one group may transmit data of a primary parade and data of a secondary parade, and the group may also transmit data of a primary parade and data of an overlay parade.

According to another embodiment of the present invention, regions A, B, C, D, and E belonging to a data group may all (or entirely) belong to a primary group division. And, according to yet another embodiment of the present invention, regions A and B within a data group may belong to the primary group division, and regions C, D, and E may belong to the secondary group division.

Figure 2:
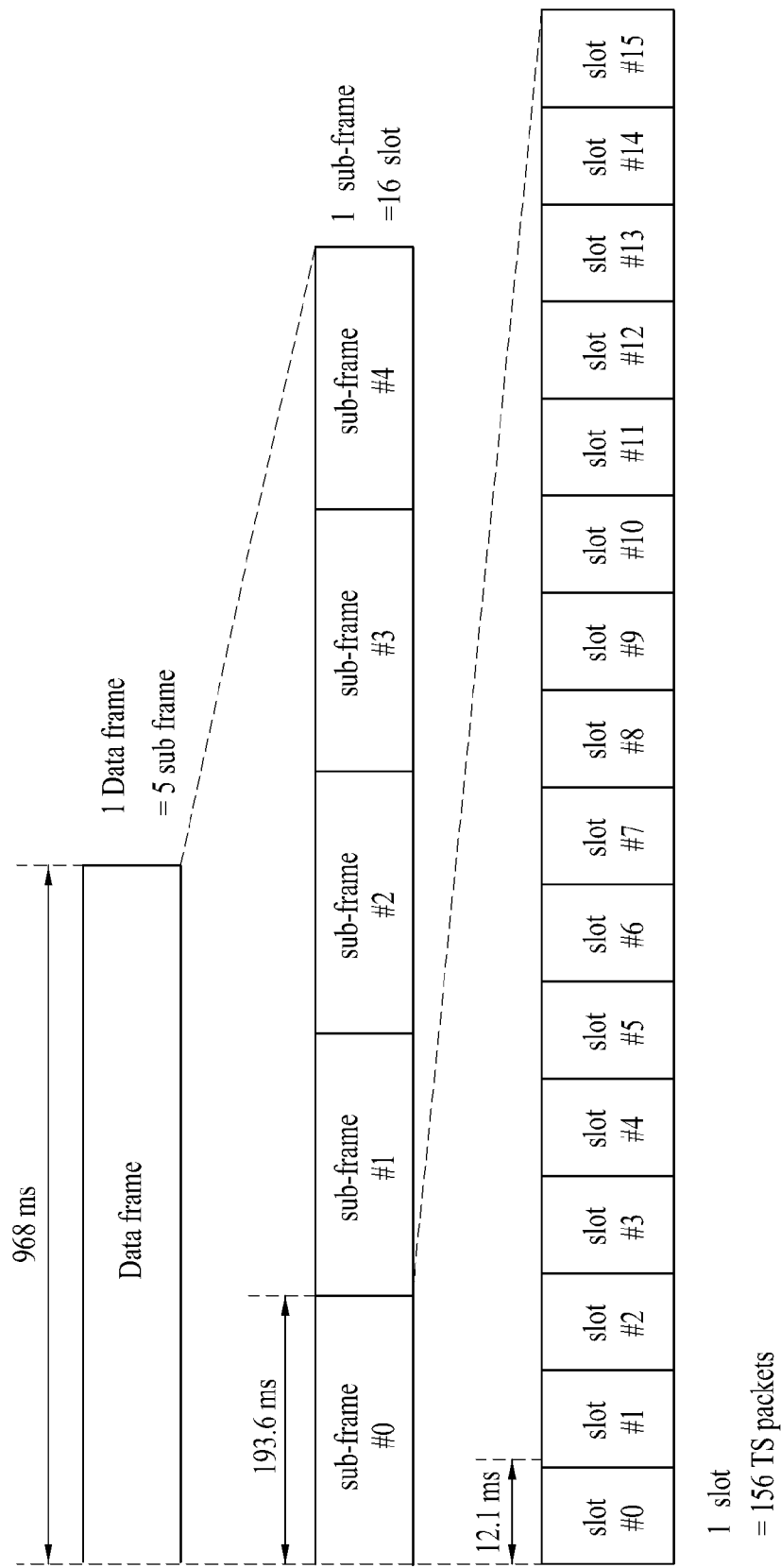
FIG. 2 illustrates a data frame (M/H frame) structure for transmitting/receiving mobile service data according to one embodiment of the present invention.

FIG. 2 illustrates a data frame (M/H frame) structure for transmitting/receiving mobile service data according to one embodiment of the present invention.

In the embodiment of the present invention, the mobile service data are first multiplexed with main service data in data frame units and, then, modulated in a VSB mode and transmitted to the receiving system.

The term "data frame" mentioned in the embodiment of the present invention may be defined as the concept of a time during which main service data and mobile service data are transmitted. For example, one data frame may be defined as a time consumed for transmitting 20 VSB data frames.

At this point, one data frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

In the example shown in FIG. 2, one data frame consists of 5 sub-frames, wherein each sub-frame includes 16 slots. In this case, the data frame according to the present invention includes 5 sub-frames and 80 slots.

Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of payload data as payload data of a segment, a data packet prior to being interleaved may also be used as a data segment.

156 data packets contained in a slot may be composed of 156 main service data packets, may be composed of 118 mobile service data packets and 38 main service data packets, or may be composed of (118+M) mobile service data packets and L main service data packets. In this case, the sum of M and L may be set to 38 according to one embodiment of the present invention. In addition, M may be zero '0' or a natural number of 38 or less.

One data group is transmitted during a single slot. In this case, the transmitted data group may include 118 mobile service data packets or (118+M) mobile service data packets.

That is, a data group may be defined as a set of data units including mobile service data present in one slot. In this case, the mobile service data may be defined as pure mobile service data, or may be defined as the concept that includes data for transmitting mobile service data, such as signaling data, known data, etc.

Figure 3:
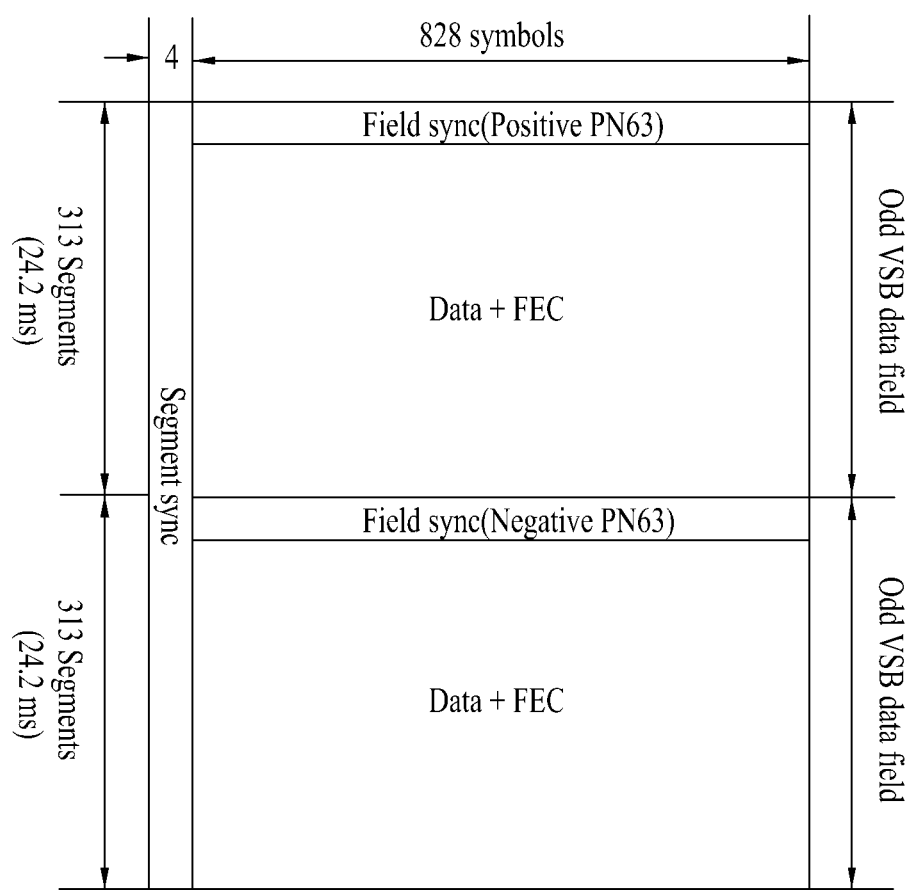
FIG. 3 illustrates an exemplary structure of a VSB frame, wherein one VSB frame consists of 2 VSB fields (i.e., an odd field and an even field). Herein, each VSB field includes a field synchronization segment and 312 data segments.

FIG. 3 illustrates an exemplary structure of a VSB frame, wherein one VSB frame consists of 2 VSB fields (i.e., an odd field and an even field). Herein, each VSB field includes a field synchronization segment and 312 data segments.

The slot corresponds to a basic time period for multiplexing the mobile service data and the main service data. Herein, one slot may either include the mobile service data or be configured only of the main service data.

If one M/H frame is transmitted during one slot, the first 118 data packets within the slot correspond to a data group. And, the remaining 38 data packets become the main service data packets. In another example, when no data group exists in a slot, the corresponding slot is configured of 156 main service data packets.

Meanwhile, when the slots are assigned to a VSB frame, an offset exists for each assigned position.

Figure 4:
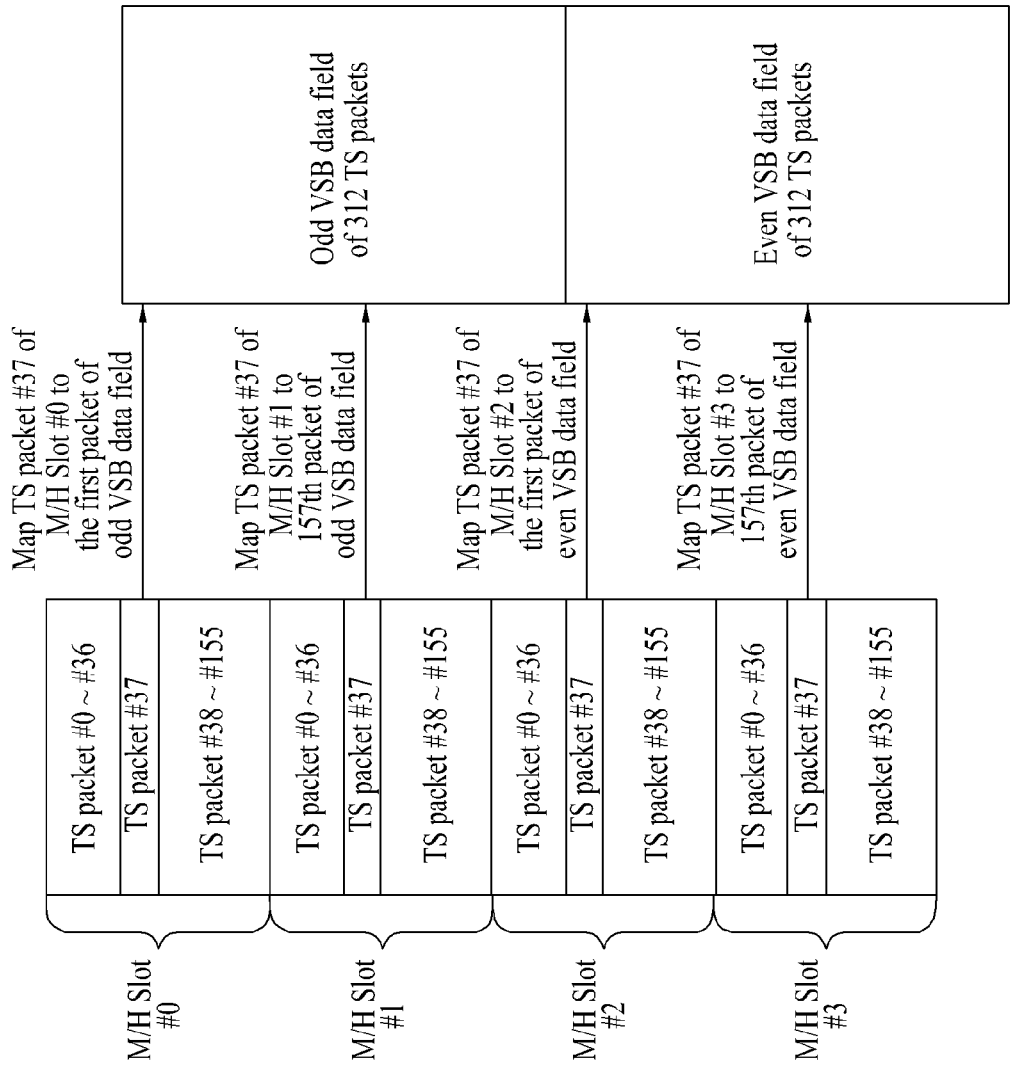
FIG. 4 illustrates a mapping example of the positions to which the first 4 slots of a sub-frame are assigned with respect to a VSB frame in a space region.

FIG. 4 illustrates a mapping example of the positions to which the first 4 slots of a sub-frame are assigned with respect to a VSB frame in a space region. And, FIG. 5 illustrates a mapping example of the positions to which the first 4 slots of a sub-frame are assigned with respect to a VSB frame in a time region.

Figure 5:
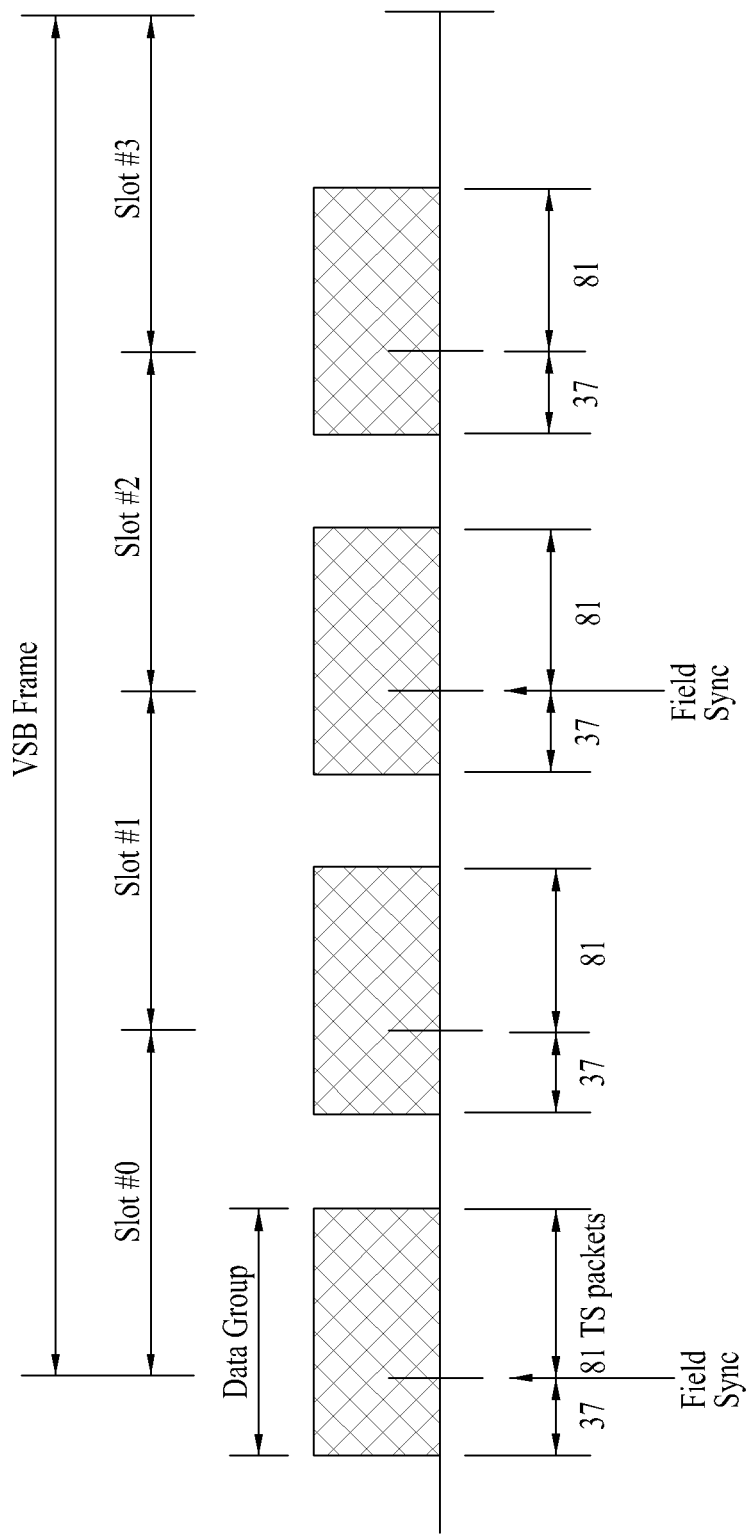
FIG. 5 illustrates a mapping example of the positions to which the first 4 slots of a sub-frame are assigned with respect to a VSB frame in a time region.

Referring to FIG. 4 and FIG. 5, a 38th data packet (TS packet #37) of a 1st slot (Slot #0) is mapped to the 1st data packet of an odd VSB field. A 38th data packet (TS packet #37) of a 2nd slot (Slot #1) is mapped to the 157th data packet of an odd VSB field. Also, a 38th data packet (TS packet #37) of a 3rd slot (Slot #2) is mapped to the 1st data packet of an even VSB field. And, a 38th data packet (TS packet #37) of a 4th slot (Slot #3) is mapped to the 157th data packet of an even VSB field. Similarly, the remaining 12 slots within the corresponding sub-frame are mapped in the subsequent VSB frames using the same method.

Meanwhile, one data group may be divided into at least one or more hierarchical regions. And, depending upon the characteristics of each hierarchical region, the type of mobile service data being inserted in each region may vary. For example, the data group within each region may be divided (or categorized) based upon the receiving performance.

According to the embodiment of the present invention, a data group prior to being processed with data interleaving is divided into regions A, B, C, and D. At this point, the data group may further include region E. Herein, the size of region E is variable, and each group may include a number of data packets equal to or less than 38. More specifically, according to the embodiment of the present invention, region E may include a maximum of 38 data packets within a single group.

Figure 6:
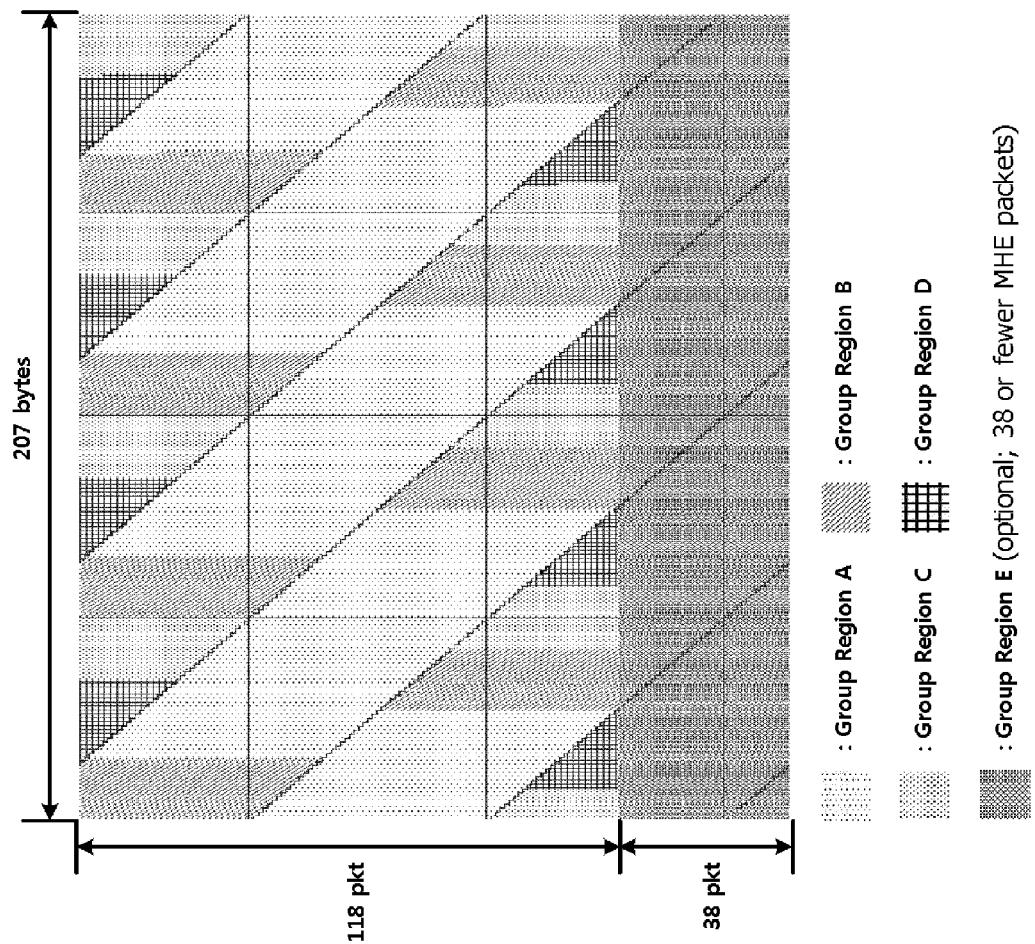
FIG. 6 illustrates a data group including (118+M) mobile service data packets according to an embodiment of the present invention.

FIG. 6 illustrates a data group including (118+M) mobile service data packets according to an embodiment of the present invention.

Referring to FIG. 6, the data group includes A, B, C, D and E regions. The data group is contained in a slot including 156 packets. That is, a predetermined number of packets contained in one slot form the data group, and such packets include mobile service data.

After 118 mobile service data packets fixed in the data group are interleaved, the data group is divided into A, B, C and D regions.

Meanwhile, a variable number (M) of mobile service data packets capable of being contained in the data group are contained in an additional region E. In the case where the data group in one slot is composed of 118 mobile service data packets, the E region can be defined as a specific region acquired when mobile service data packets are added to the region composed of only main service data packets. In other words, the E region may include a scalable number of mobile service data packets in one slot.

The mapping format of the mobile service data packets in the E region may be changed according to the intention of a designer. In other words, according to one embodiment of the present invention, when the number of mobile service data packets is 38 or less (i.e., M<38) as shown in FIG. 6, a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the E region are spaced apart from one another at intervals of a predetermined distance.

Also, the mobile service data being allocated to one group may be broadly divided into two types of mobile modes. Herein, one of the mobile modes is referred to as a first mobile mode or a Core Mobile Mode (CMM), and the other mobile mode is referred to as a second mobile mode or an Extended Mobile Mode (EMM) or a Scalable Full Channel Mobile Mode (SFCMM). Furthermore, the first mobile mode and the second mobile mode may be collectively referred to as the Scalable Full Channel Mobile Mode (SFCMM). At this point, the mobile service data of the first mobile mode and the mobile service data of the second mobile mode may be encoded at a coding rate of ½, ⅓, or ¼.

The first mobile mode corresponds to a mode that is compatible with the conventional mobile broadcasting system. And, the second mobile mode may be either compatible or non-compatible with the conventional mobile service data. However, the second mobile mode corresponds to a mode that transmits data that cannot be recognized (or acknowledged) by the conventional mobile broadcasting system.

Only mobile service data of the first mobile mode may be allocated to one group, or only mobile service data of the second mobile mode may be allocated to the one group. Alternatively, both the mobile service data of the first mobile mode and the mobile service data of the second mobile mode may both be allocated to one group.

Figure 7:
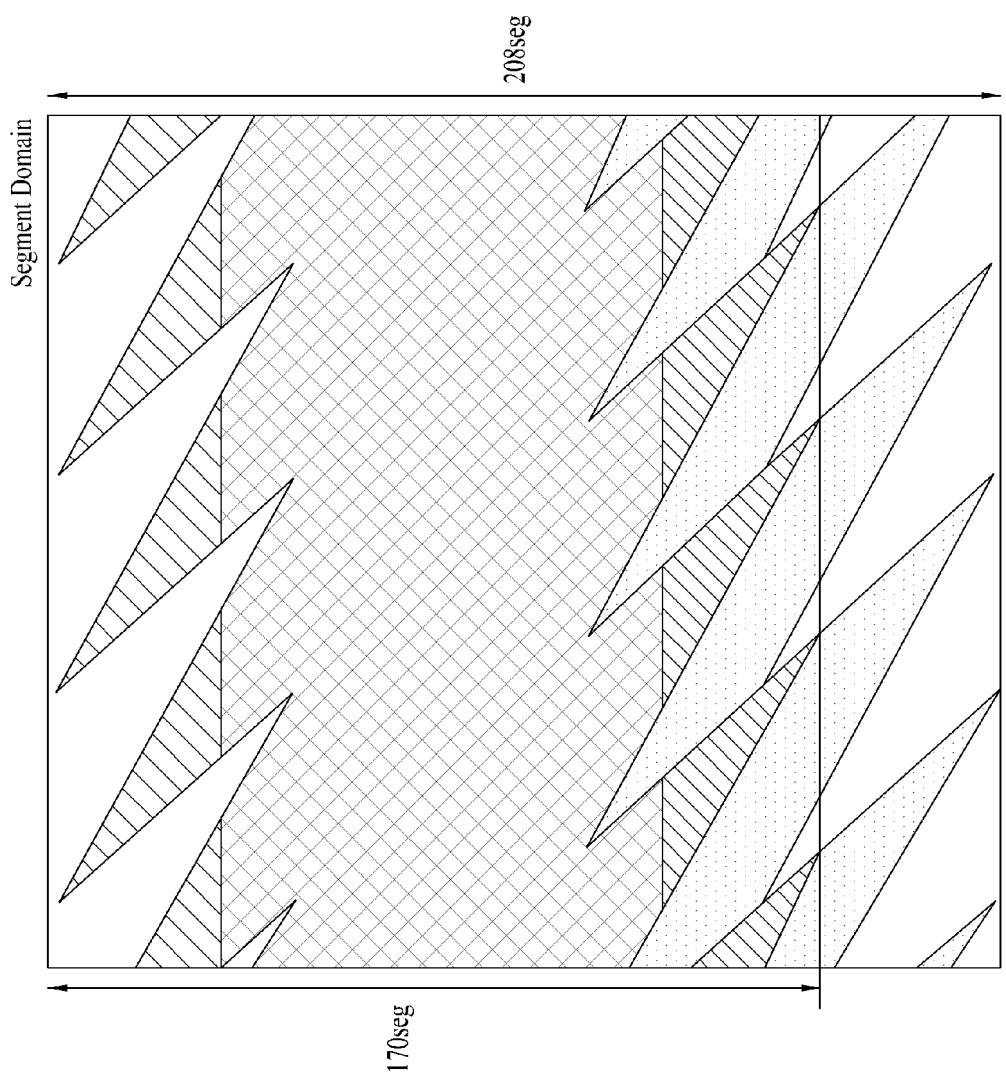
FIG. 7 illustrates a structure of a data group after being processed with interleaving according to the embodiment of the present invention, wherein the data group includes (118+M) number of mobile service data packets.

FIG. 7 illustrates a structure of a data group after being processed with interleaving according to the embodiment of the present invention, wherein the data group includes (118+M) number of mobile service data packets.

A data group structure shown in FIG. 7 is transmitted to the receiving system. More specifically, one data packet is data-interleaved and dispersed (or distributed) to a plurality of segments, thereby being transmitted to the receiving system. FIG. 7 shows an example of a single group distributed to 208 data segments. At this point, since one data packet of 207 bytes has the same data size of one data segment, a packet prior to being data-interleaved may be used as the concept of a packet.

Figure 8:
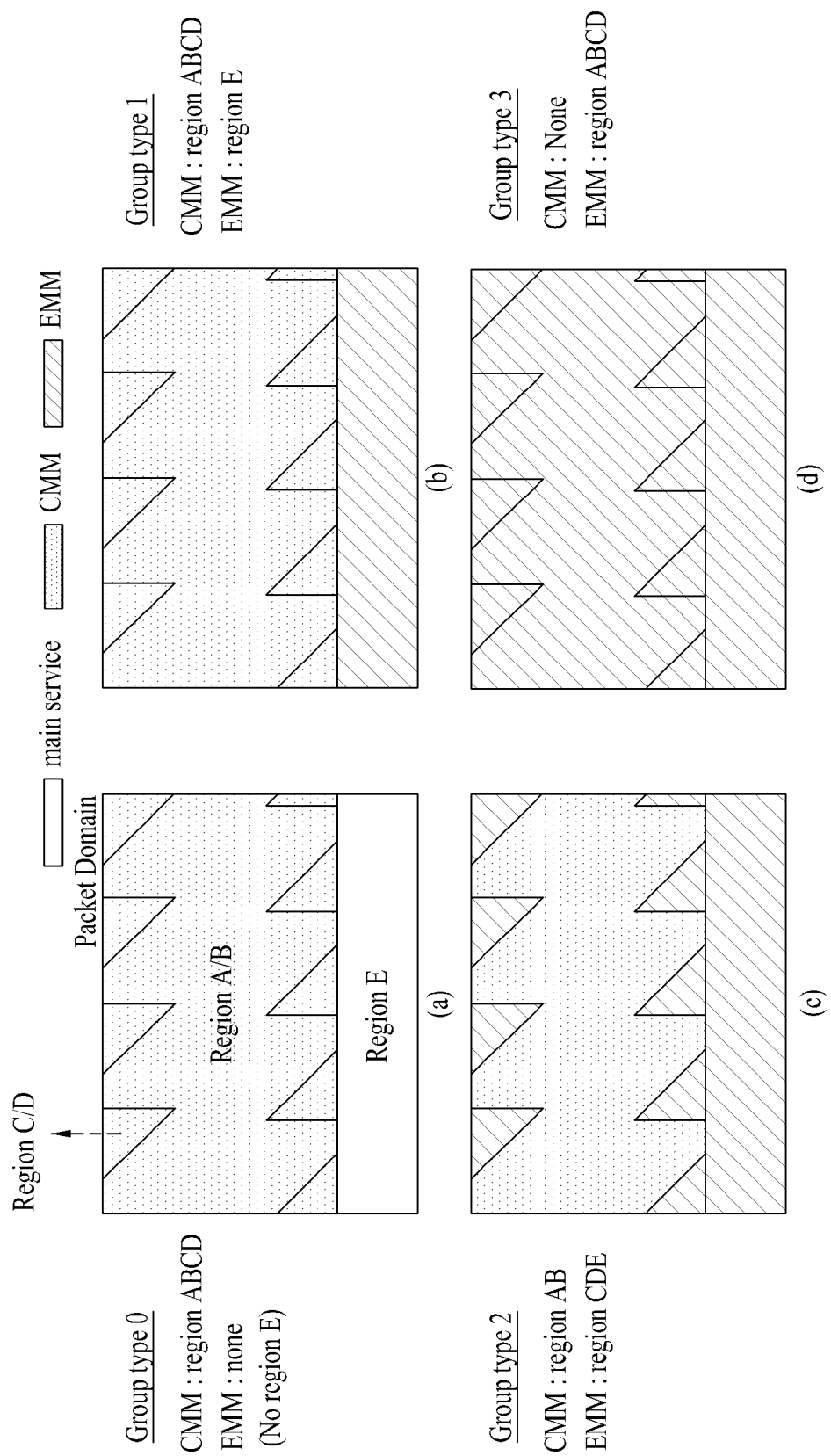
FIGS. 8(a)-8(d) illustrate various examples of mobile service data of a first mobile mode and mobile service data of a second mobile mode being allocated to a group.

FIG. 8 illustrates various examples of mobile service data of the first mobile mode and mobile service data of the second mobile mode being allocated to a group.

According to the embodiment of the present invention, as shown in FIG. 8, the mobile service data of the first mobile mode and the mobile service data of the second mobile mode are allocated as shown in (a) to (d) of FIG. 8.

(a) of FIG. 8 shows an example wherein the mobile service data of the first mobile mode are allocated to regions A, B, C, and D within the data group, and wherein the mobile service data of the second mobile mode are not allocated. In this case, region E does not exist in the group, and main service data are allocated (or assigned) to the respective region. According to the embodiment of the present invention, this exemplary case will be referred to as group type 0. More specifically, when it is assumed that the number of mobile service data packets forming one data group corresponds to (118+M), then in case (a) of FIG. 8, the value of M is equal to 0.

(b) of FIG. 8 shows an example wherein the mobile service data of the first mobile mode are allocated (or assigned) to regions A, B, C, and D within the data group, and wherein the mobile service data of the second mobile mode are allocated to region E. According to the embodiment of the present invention, this exemplary case will be referred to as group type 1. More specifically, the mobile service data being transmitted through regions A, B, C, and D within the data group may be validly used in the conventional mobile broadcasting system.

(c) of FIG. 8 shows an example wherein the mobile service data of the first mobile mode are allocated (or assigned) to regions A and B, within the data group, and wherein the mobile service data of the second mobile mode are allocated to regions C, D, and E. According to the embodiment of the present invention, this exemplary case will be referred to as group type 2. More specifically, the mobile service data being transmitted through regions A and B within the data group may be received and validly decoded by the conventional mobile broadcasting system. However, the mobile service data being transmitted through regions C, D, and E within the data group are not processed as valid information by the conventional mobile broadcasting system.

(d) of FIG. 8 shows an example wherein the mobile service data of the second mobile mode are allocated to regions A, B, C, D, and E within the data group, and wherein the mobile service data of the first mobile mode are not allocated. According to the embodiment of the present invention, this exemplary case will be referred to as group type 3. Herein, the mobile service data being transmitted through regions A, B, C, D, and E within the data group are not processed as valid information by the conventional mobile broadcasting system.

As described above, the group type is decided depending upon how the 156 data packets being included in one data group are used. In other words, the group type is decided depending upon which one of regions A, B, C, and D will be used for the mobile service data of the second mobile mode.

Meanwhile, one data group may include a maximum of 156 data packets. Herein, among the 156 data packets, 118 data packets are assigned to regions A, B, C, and D, and a portion of the remaining 38 data packets or all of the remaining 38 data packets are assigned to region E. At this point, none of the data packets may be assigned to region E. In this case, as shown in (a) of FIG. 8, region E does not exist in the corresponding data group. In the data group that does not include a region E, mobile service data of the first mobile mode are assigned (or allocated) to the 118 data packets included in region A, B, C, and D, and main service data are assigned to the remaining 38 data packets. More specifically, in the data group that does not include region E, mobile service data of the second mobile mode are not assigned.

This indicates that only the mobile service data of the second mobile mode are assigned to region E within the data group, as shown in (b) to (d) of FIG. 8. More specifically, the mobile service data of the first mobile mode Furthermore, in a data group including region E, the mobile service data of the second mobile mode may be further assigned to at least one of regions A, B, C, and D.

If the mobile service data of the second mobile mode are assigned to all of the regions A, B, C, D, and E, as shown in (d) of FIG. 8, mobile service data of the first mobile mode cannot be assigned to the corresponding data group. With the exception for the case wherein the mobile service data of the second mobile mode are assigned to all of the regions A, B, C, D, and E, as shown in (d) of FIG. 8, the mobile service data of the first mobile mode are assigned to at least one of regions A, B, C, and D.

Also, even when region E does not exist is a specific data group, the number of data packets included in region E may vary. More specifically, region E may include a number of data packets ranging from a minimum of 0 data packet to a maximum of 38 data packets.

Figure 9:
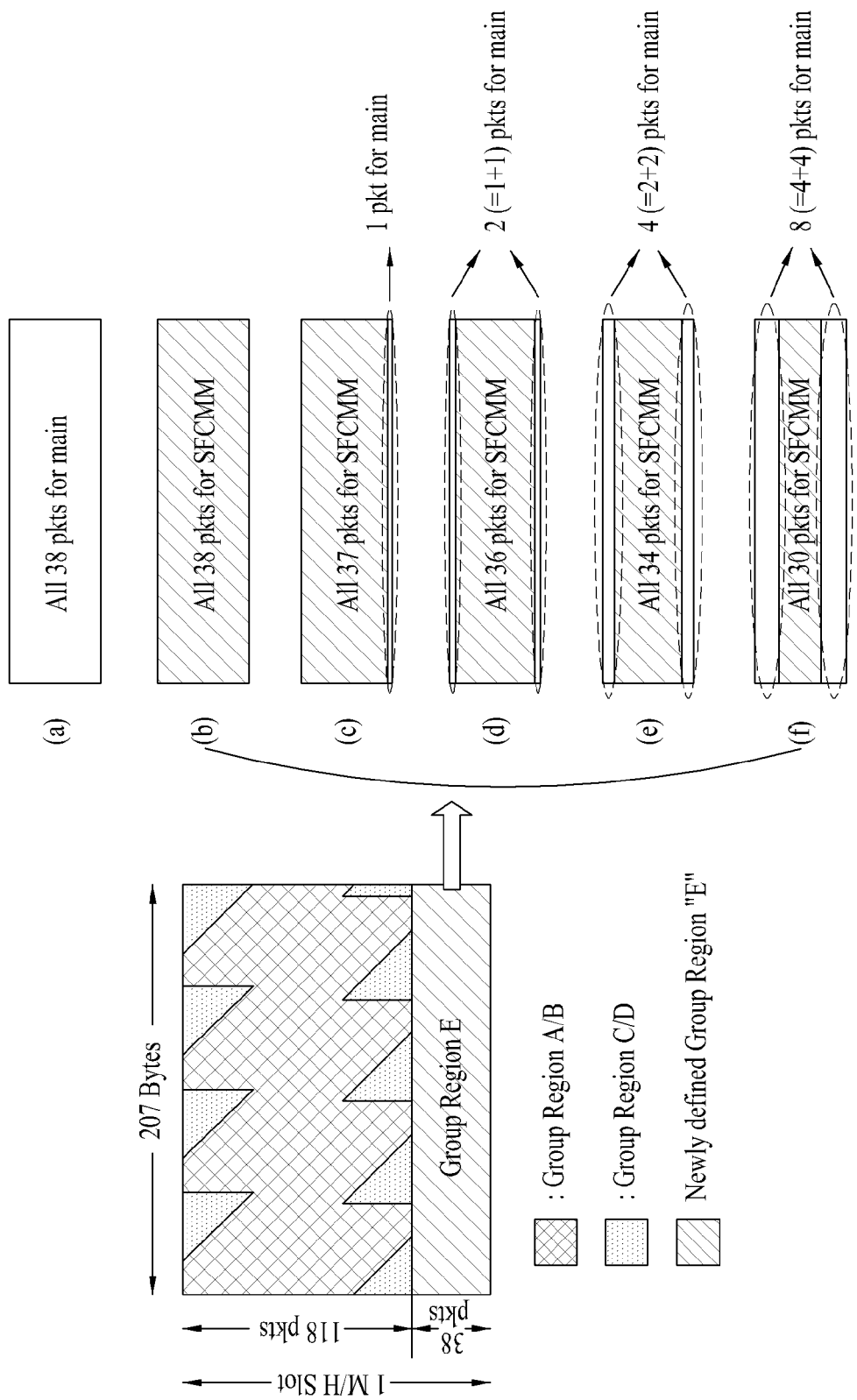
FIGS. 9(a)-9(f) illustrate an example of a mobile service data packet being allocated to region E within the data group according to an embodiment to the present invention.

FIG. 9 illustrates an example of a mobile service data packet being allocated to region E within the data group according to an embodiment to the present invention.

(a) of FIG. 9 shows an example of region E not being assigned (or allocated). Herein, main service data are assigned to the 38 data packets within the corresponding data group. More specifically, data packets that are used for mobile services of the second mobile mode do not exist. In this case, according to the embodiment of the present invention, regions, A, B, C, and D of the corresponding group are also not used for the mobile services of the second mobile mode.

(b) of FIG. 9 shows an example of 38 data packets being assigned to region E. In this case, main service data are not assigned to the corresponding group. More specifically, the 38 data packets that are included in region E may be used for mobile services of the second mobile mode.

(c) of FIG. 9 shows an example of 37 data packets being assigned to region E. In this case, main service data are assigned to one data packet within the corresponding data group. According to the embodiment of the present invention, among the 38 data packets, the slowest data packet (i.e., the data packet chronologically placed in the last position) is excluded from region E, and the one data packet that is excluded from region E is used for the main service. More specifically, the 37 data packets included in region E may be used for the mobile services of the second mobile mode.

(d) of FIG. 9 shows an example of 36 data packets being assigned to region E. In this case, main service data are assigned to two data packets within the corresponding data group. According to the embodiment of the present invention, among the 38 data packets, the fastest data packet (i.e., the data packet chronologically placed in the first position) and the slowest data packet (i.e., the data packet chronologically placed in the last position) are excluded from region E, and the two data packets that are excluded from region E are used for the main services. More specifically, the 36 data packets included in region E may be used for the mobile services of the second mobile mode.

(e) of FIG. 9 shows an example of 34 data packets being assigned to region E. In this case, main service data are assigned to four (4) data packets within the corresponding data group. According to the embodiment of the present invention, among the 38 data packets, the two fastest data packets (i.e., the two data packets chronologically placed in the first two positions) and the two slowest data packets (i.e., the two data packets chronologically placed in the last two positions) are excluded from region E, and the four data packets that are excluded from region E are used for the main services. More specifically, the 34 data packets included in region E may be used for the mobile services of the second mobile mode.

(f) of FIG. 9 shows an example of 30 data packets being assigned to region E. In this case, main service data are assigned to eight (8) data packets within the corresponding data group. According to the embodiment of the present invention, among the 38 data packets, the four fastest data packets (i.e., the four data packets chronologically placed in the first four positions) and the four slowest data packets (i.e., the four data packets chronologically placed in the last four positions) are excluded from region E, and the eight data packets that are excluded from region E are used for the main services. More specifically, the 30 data packets included in region E may be used for the mobile services of the second mobile mode.

More specifically, among the remaining 38 data packets excluding the 118 data packets within the data group, region E includes the data packets that are used for the mobile service of the second mobile mode.

According to the embodiment of the present invention, each group type is further segmented based upon the size of region E.

Meanwhile, a variable number (M) of mobile service data packets capable of being contained in the data group are contained in an additional region E. In the case where the data group in one slot is composed of 118 mobile service data packets, the E region can be defined as a specific region acquired when mobile service data packets are added to the region composed of only main service data packets. In other words, the E region may include a scalable number of mobile service data packets in one slot.

The mapping format of the mobile service data packets in the E region may be changed according to the intention of a designer. In other words, according to one embodiment of the present invention, when the number of mobile service data packets is 38 or less (i.e., M<38), a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the E region are spaced apart from one another at intervals of a predetermined distance.

FIG. 10 illustrates an example of each group type being segmented based upon the size of region E according to an embodiment of the present invention.

At this point, group type 0 corresponds to when region E does not exist, and, in this case, further segmentation is not performed. In the data group of group type 0, a primary group division includes regions A, B, C, and D or includes regions A and B. Also, either a secondary group division does not exist, or a secondary group division includes regions C and D.

Depending upon the size of region E, group type 1 may be further segmented to 5 group types (i.e., group types 1-0, 1-1, 1-2, 1-4, and 1-8). In the data group of group type 1, a primary group division includes regions A, B, C, and D, and a secondary group division includes region E.

At this point, group type 1-0 (G1-0) corresponds to a group type configured by combining (b) of FIG. 8 and (b) of FIG. 9. Herein, the mobile service data of the second mobile mode are assigned (or allocated) only to region E, and region E includes 38 data packets. Group type 1-1 (G1-1) corresponds to a group type configured by combining (b) of FIG. 8 and (c) of FIG. 9. Herein, the mobile service data of the second mobile mode are assigned (or allocated) only to region E, and region E includes 37 data packets. Group type 1-2 (G1-2) corresponds to a group type configured by combining (b) of FIG. 8 and (d) of FIG. 9. Herein, the mobile service data of the second mobile mode are assigned (or allocated) only to region E, and region E includes 36 data packets. Group type 1-4 (G1-4) corresponds to a group type configured by combining (b) of FIG. 8 and (e) of FIG. 9. Herein, the mobile service data of the second mobile mode are assigned (or allocated) only to region E, and region E includes 34 data packets. And, group type 1-8 (G1-8) corresponds to a group type configured by combining (b) of FIG. 8 and (f) of FIG. 9. Herein, the mobile service data of the second mobile mode are assigned (or allocated) only to region E, and region E includes 30 data packets.

Depending upon the size of region E, group type 2 may be further segmented to 5 group types (i.e., group types 2-0, 2-1, 2-2, 2-4, and 2-8). In the data group of group type 2, a primary group division includes regions A and B, and a secondary group division includes regions C, D, and E.

At this point, group type 2-0 (G2-0) corresponds to a group type configured by combining (c) of FIG. 8 and (b) of FIG. 9. Herein, the mobile service data of the second mobile mode are assigned (or allocated) only to regions C, D, and E. Herein, region E includes 38 data packets. Group type 2-1 (G2-1) corresponds to a group type configured by combining (c) of FIG. 8 and (c) of FIG. 9. Herein, the mobile service data of the second mobile mode are assigned (or allocated) only to regions C, D, and E. Herein, region E includes 37 data packets. Group type 2-2 (G2-2) corresponds to a group type configured by combining (c) of FIG. 8 and (d) of FIG. 9. Herein, the mobile service data of the second mobile mode are assigned (or allocated) only to regions C, D, and E. Herein, region E includes 36 data packets. Group type 2-4 (G2-4) corresponds to a group type configured by combining (c) of FIG. 8 and (e) of FIG. 9. Herein, the mobile service data of the second mobile mode are assigned (or allocated) only to regions C, D, and E. Herein, region E includes 34 data packets. And, group type 2-8 (G2-8) corresponds to a group type configured by combining (c) of FIG. 8 and (f) of FIG. 9. Herein, the mobile service data of the second mobile mode are assigned (or allocated) only to regions C, D, and E. Herein, region E includes 30 data packets.

Depending upon the size of region E, group type 3 may be further segmented to 5 group types (i.e., group types 3-0, 3-1, 3-2, 3-4, and 3-8). In the data group of group type 3, a primary group division includes regions A, B, C, D, and E, and a secondary group division does not exist.

At this point, group type 3-0 (G3-0) corresponds to a group type configured by combining (d) of FIG. 8 and (b) of FIG. 9. Herein, the mobile service data of the second mobile mode are assigned (or allocated) only to regions A, B, C, D, and E. Herein, region E includes 38 data packets. Group type 3-1 (G3-1) corresponds to a group type configured by combining (d) of FIG. 8 and (c) of FIG. 9. Herein, the mobile service data of the second mobile mode are assigned (or allocated) only to regions A, B, C, D, and E. Herein, region E is configured of 37 data packets. Group type 3-2 (G3-2) corresponds to a group type configured by combining (d) of FIG. 8 and (d) of FIG. 9. Herein, the mobile service data of the second mobile mode are assigned (or allocated) only to regions A, B, C, D, and E. Herein, region E includes 36 data packets. Group type 3-4 (G3-4) corresponds to a group type configured by combining (d) of FIG. 8 and (e) of FIG. 9. Herein, the mobile service data of the second mobile mode are assigned (or allocated) only to regions A, B, C, D, and E. Herein, region E includes 34 data packets. And, group type 3-8 (G3-8) corresponds to a group type configured by combining (d) of FIG. 8 and (f) of FIG. 9. Herein, the mobile service data of the second mobile mode are assigned (or allocated) only to regions A, B, C, D, and E. Herein, region E includes 30 data packets.

More specifically, the group format of group type 2 and the group format group type 3 are identical to one another. In other words, the same group map may be used for group type 2 and group type 3.

In FIG. 10, group type 4 (G3) is not further segmented to a lower-level group type. And, in this case, the 156 data packets are all used for the mobile service data. At this point, mobile service data are also assigned to an MPEG header and RS parity bytes positions within the 156 data packets.

In other words, in the case where the data group does not include main service data, the RS parity and the MPEG header for backward compatibility need not be used, such that an area reserved for the RS parity and the MPEG header is allocated to an area for mobile service data and forms a block contained in the E region.

At this point, a parade includes group divisions of groups having the same group type. For example, an arbitrary primary parade is configured of primary group divisions of groups corresponding to group type 1-1. In other words, the data of one parade are assigned and transmitted to group divisions of groups having the same group type. For example, the data of an arbitrary primary parade are assigned and transmitted to a primary group division of groups having the same group type.

Meanwhile, the primary parade and the second parade according to the embodiment of the present invention share the same parade identifier and the same Number Of Group (NOG). Herein, the NOG refers to a number of groups within one subframe. For example, when the NOG of the primary parade is equal to 4, the NOG of the secondary parade should also be equal to 4. More specifically, the secondary parade always forms a pair with the primary parade and is dependent to the primary parade. Therefore, each of the secondary parades is transmitted through the same slot as that of its paired primary parade.

Conversely, the overlay parade is not paired with the primary parade. More specifically, although the secondary parade and the overlay parade are both transmitted through a secondary group division within a group, the overlay parade is not dependent to the corresponding primary parade. Therefore, each of the primary parade and the overlay parade has a different parade identifier, and the NOG of each of the primary parade and the overlay parade may either be identical to one another or be different from one another. More specifically, the NOG boundary of the primary parade may be different from the NOG boundary of the overlay parade. Nevertheless, the overlay parade includes secondary group divisions of groups having the same group type. In other words, the data of the overlay parade are transmitted through the secondary group divisions of groups having the same group type. Accordingly, in order to have the receiving system receive and process the overlay parade, signaling information of the overlay parade is required. The signaling information may correspond to a number of overlay parades being assigned to one subframe, an identifier of each overlay parade, and so on. According to the embodiment of the present invention, the signaling information of the overlay parade is inserted in at least one of a field synchronization region and a signaling information region within a group, so as to be transmitted. The signaling method of the overlay parade will be described in detail later on.

At this point, a method of assigning (or allocating) groups to each slot may be identically applied to all subframes within a single M/H frame. Alternatively, the method of assigning (or allocating) groups to each slot may be differently applied for each subframe. At this point, when it is assumed that group assignment (or allocation) is identically applied to all subframes within the M/H frame, the number of groups being assigned to one M/H frame becomes a multiple of 5.

Also, according to the embodiment of the present invention, a plurality of groups included in one parade is assigned to be spaced apart as far away from one another as possible within the subframe. Thus, the data may be able to respond with robustness against burst errors that may occur within a subframe.

For example, when it is assumed that 3 groups are assigned (or allocated) to one subframe, each group is assigned to a first slot (Slot #0), a fifth slot (Slot #4), and a ninth slot (Slot #8) within the corresponding subframe. Accordingly, when it is assumed that 16 groups are assigned to one subframe by using the above-described assignment (or allocation) rule, the 16 groups are assigned by the order of Slot #0, Slot #4, Slot #8, Slot #12, Slot #2, Slot #6, Slot #10, Slot #14, Slot #1, Slot #5, Slot #9, Slot #13, Slot #3, Slot #7, Slot #11, and Slot #15.

Equation 1 below shows the above-described rule for assigning a plurality of groups to one sub-frame in the form of a mathematical equation 1.

$$j=(4i+O) \bmod 16 \quad \text{[Equation 1]}$$

Herein, $O=0$ if $i<4$,
$O=2$ else if $i<8$,
$O=1$ else if $i<12$,
$O=3$ else.

Also, j indicates the slot number within one subframe. Herein, j may have a value ranging from 0 to 15. Furthermore, i represents a group number. Herein, i may have a value also ranging from 0 to 15.

At this point, groups respective to one parade may be assigned to one subframe. Alternatively, groups respective to a plurality of parades may also be assigned to one subframe. The assignment of groups respective to a plurality of parades is no different from (or identical to) the assignment of group respective to a single parade. More specifically, groups within another parade being assigned to one M/H frame are respectively assigned at a cycle period of 4 slots. At this point, the group of the other parade may be assigned in a type of circular method starting from a slot that is not assigned with a group of a previous parade.

Furthermore, according to the embodiment of the present invention, when a plurality of parades is assigned to one subframe, the overlay parade is first assigned.

At this point, the corresponding group may include only primary group divisions, or may include both primary group divisions and secondary group divisions. Also, data of a primary parade may be assigned to the primary group divisions, and data of a secondary parade or an overlay parade may be assigned to the secondary group divisions. More specifically, data of one parade or data of two parades may be assigned to one group.

Figure 11:
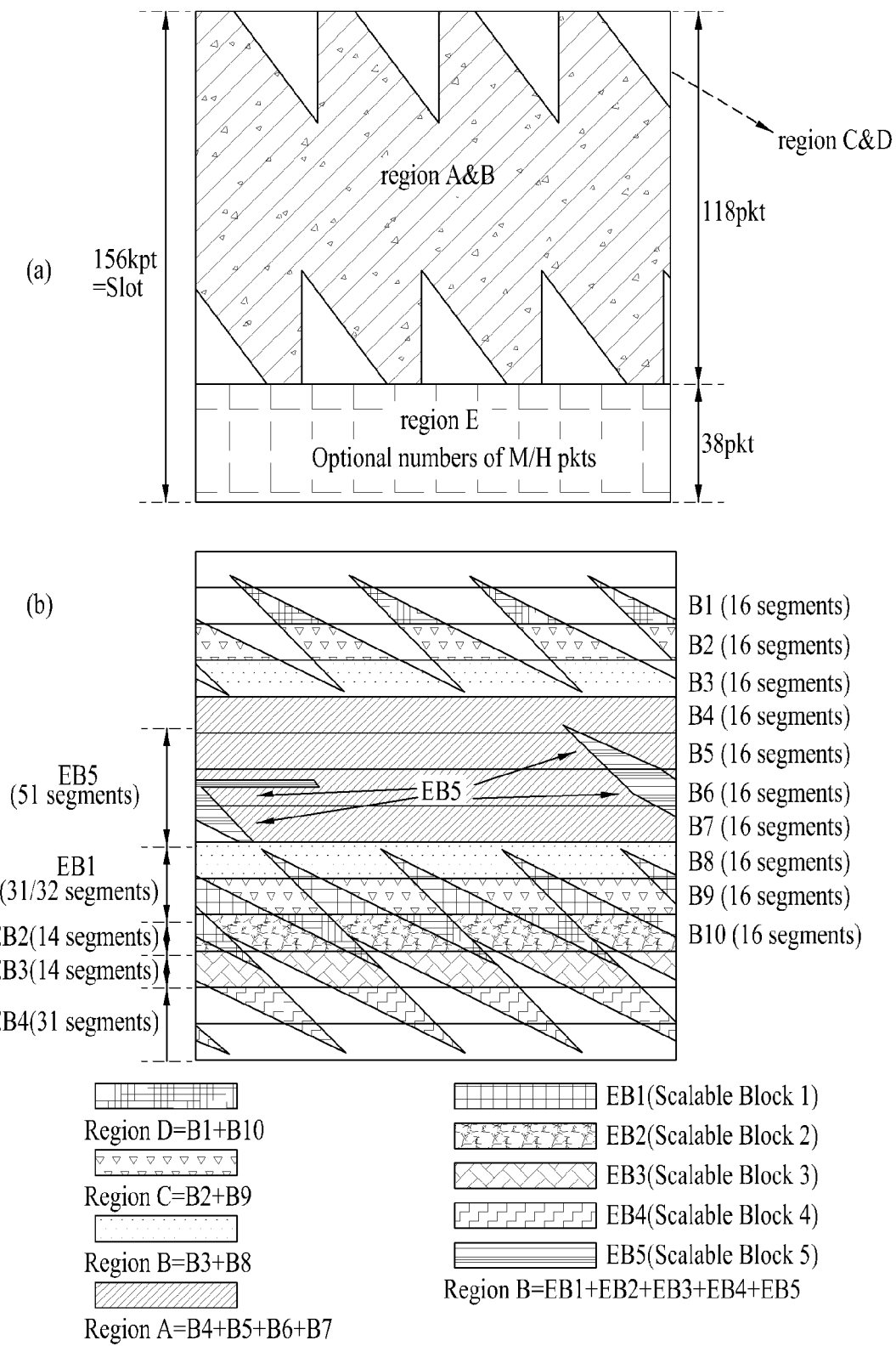
FIGS. 11(a) and 11(b) illustrate a data group including (118+M) mobile service data packets according to an embodiment of the present invention.

FIG. 11 illustrates a data group including (118+M) mobile service data packets according to an embodiment of the present invention.

Referring to FIG. 11 (a), the data group includes A, B, C, D and E regions. The data group is contained in a slot including 156 packets. That is, a predetermined number of packets contained in one slot form the data group, and such packets include mobile service data.

After 118 mobile service data packets fixed in the data group are interleaved, the data group is divided into A, B, C and D regions as shown in FIG. 4.

Meanwhile, a variable number (M) of mobile service data packets capable of being contained in the data group are contained in an additional region E. In the case where the data group in one slot is composed of 118 mobile service data packets, the E region can be defined as a specific region acquired when mobile service data packets are added to the region composed of only main service data packets. In other words, the E region may include a scalable number of mobile service data packets in one slot.

The mapping format of the mobile service data packets in the E region may be changed according to the intention of a designer. In other words, according to one embodiment of the present invention, when the number of mobile service data packets is 38 or less (i.e., M<38) as shown in FIG. 11(a), a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the E region are spaced apart from one another at intervals of a predetermined distance.

FIG. 11(b) illustrates a structure acquired after the data group including the E region as shown in FIG. 11(a) is interleaved.

As can be seen from FIG. (b) of 11, the data group including 118 mobile service data packets can be divided into four regions A, B, C and D. The A region is located at the center of the data group, and the B region is located at the exterior of the A region using the A region as a reference line. The C region is located at the exterior of the B region on the basis of the A and B regions. The D region is located at the exterior of the C area on the basis of the A, B, and C regions. The data group further includes the E region in which a plurality of blocks includes the scalable number of mobile data packets.

Referring to FIG. 11(b), 10 blocks (B1~B10) contained in the data group form A, B, C and D regions using the same pattern as in the data group shown in FIG. 5. However, the E region including M scalable mobile service data packets is formed as an additional block.

As can be seen from FIG. 11(b), the E region belonging to the data group may be contained in a plurality of blocks, and respective blocks may correspond to a scalable number of VSB segments. Mobile service data additionally transmitted through the E region is distributed to 4 or 5 blocks.

Meanwhile, in the case where the data group does not include main service data, the E region includes a block which includes an area of a place-holder that includes not only an RS parity but also an MPEG header for backward compatibility with a conventional digital broadcast system. In other words, in the case where the data group does not include main service data, the RS parity and the MPEG header for backward compatibility need not be used, such that an area reserved for the RS parity and the MPEG header is allocated to an area for mobile service data and forms a block contained in the E region.

Although 5 blocks are contained in the E region as shown in FIG. 11(b), the scope or spirit of the present invention is not limited only thereto. That is, the number of segments contained in each block of the E region may be scalable, such that the number of blocks contained in the E regions may also be scalable.

In the meantime, according to the present invention, the E region contained in the data group is determined by M scalable mobile service data packets, such that an appropriate number of mobile service data packets can be transmitted according to an amount of mobile service data to be transmitted, resulting in an increased transmission efficiency.

In addition, additional mobile service data packets are transmitted through the E regain of the data group, such that the demand of a user who desires to use a high-quality mobile service that requires a large amount of data can be satisfied.

In the description of the present invention, blocks included in regions A, B, C, and D may also be referred to as "first blocks" or "B1, B2, . . . ", and blocks included in region E may also be referred to as "second blocks" or "E blocks (EB)" or "scalable blocks".

Referring to 1-(b) of FIG. 11, one segment may be shared by a plurality of blocks that are different from one another. As shown in block B8, block B9, and block EB0, block B8 and block B9 each includes 16 segments, and block EB0 includes 31 or 32 segments. When seen in the row direction, the 31 or 32 segments included in the block EB0 correspond to segments including the data included in block B8 and block B9. More specifically, in a data group, one segment may be shared by a mobile data block and a scalable block.

Figure 12:
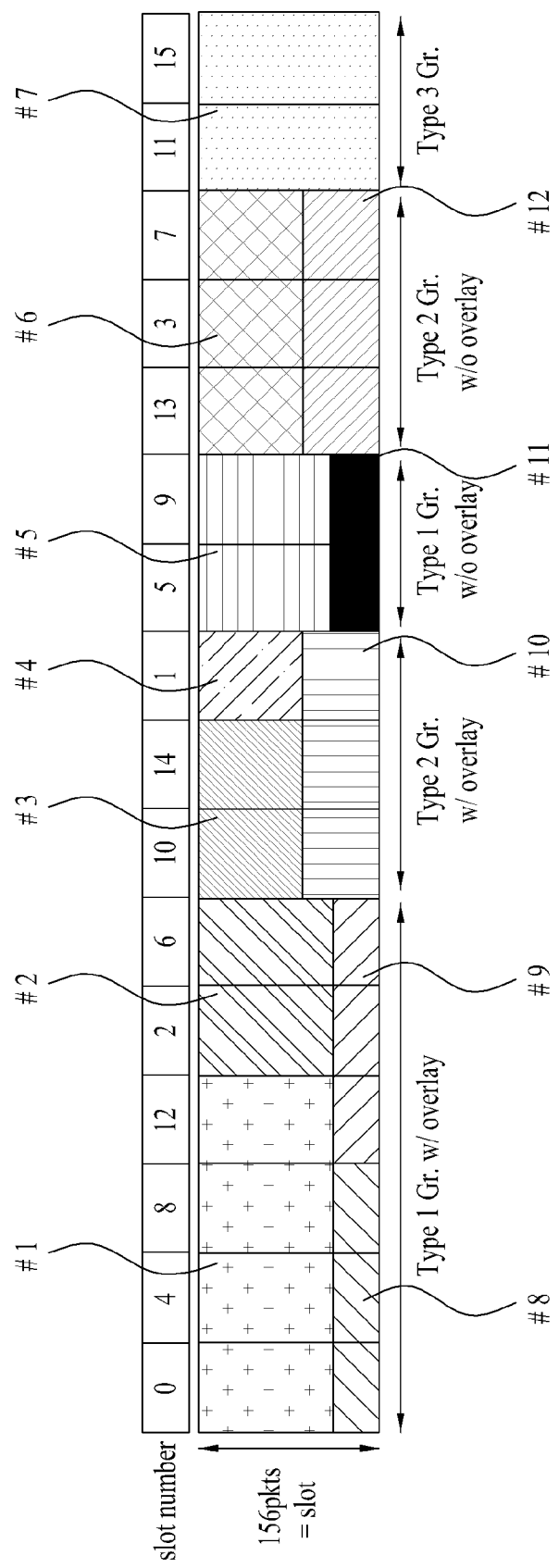
FIG. 12 illustrates an example of allocating a plurality of parades to one subframe within an M/H frame according to an embodiment of the present invention.

FIG. 12 illustrates an example of allocating a plurality of parades to one subframe within an M/H frame according to an embodiment of the present invention.

As shown in FIG. 12, groups of a plurality of parades may be assigned to slot positions according to the assignment rule of Equation 1.

Referring to FIG. 12, 7 primary parades (Parade #1 to Parade #7), 3 overlay parades (Parade #8 to Parade #10), and 2 secondary parades (Parade #11 and Parade #12) are assigned to 16 slots.

At this point, groups of group type 1 are assigned to Slot #0, Slot #4, Slot #8, Slot #12, Slot #2, and Slot #6, and groups of group type 2 are assigned to Slot #10, Slot #14, and Slot #1. Also, groups of group type 1 are assigned to Slot #5 and Slot #9, groups of group type 2 are assigned to Slot #13, Slot #3, and Slot #7, and groups of group type 3 are assigned to Slot #11 and Slot #15. More specifically, the secondary group division of the groups being assigned to Slot #0, Slot #4, Slot #8, Slot #12, Slot #2, and Slot #6 includes region E. And, mobile service data of the second mobile mode are transmitted to region E.

For example, data of primary parade #1 are assigned to a primary group division of the groups being assigned to Slot #0, Slot #4, Slot #8, and Slot #12, and data of primary parade #2 are assigned to a primary group division of the groups being assigned to Slot #2 and Slot #6. More specifically, the NOG of primary parade #1 is equal to 4, and the NOG of primary parade #2 is equal to 2. Conversely, data of overlay parade #8 are assigned to a secondary group division of the groups being assigned to Slot #0, Slot #4, and Slot #8, and data of overlay parade #9 are assigned to a secondary group division of the groups being assigned to Slot #12, Slot #2, and Slot #6. More specifically, the NOG of overlay parade #8 is equal to 3, and the NOG of overlay parade #9 is also equal to 3. As described above, the overlay parades are not dependent to the primary parades. And, accordingly, the NOG values are also different from one another. In some cases, however, the NOG values may be identical. Nevertheless, the parade identifiers are different from one another.

In another example, since the groups assigned to Slot #0, Slot #4, Slot #8, Slot #12, Slot #2, and Slot #6 correspond to the same group type (e.g., group type 1), the groups assigned to Slot #0, Slot #4, Slot #8, Slot #12, Slot #2, and Slot #6 may be included in a single overlay parade as a collection of secondary group divisions of the groups assigned to Slot #0, Slot #4, Slot #8, Slot #12, Slot #2, and Slot #6.

Furthermore, data of primary parade #3 are assigned to the primary group division of the groups being transmitted to Slot #10 and Slot #14. And, data of primary parade #4 are assigned to the primary group division of the group being transmitted to Slot #1. More specifically, the NOG of primary parade #3 is equal to 2, and the NOG of primary parade #4 is equal to 1. Conversely, data of overlay parade #10 are assigned to a secondary group division of the groups being assigned to Slot #10, Slot #14, and Slot #1. More specifically, the NOG of overlay parade #10 is equal to 3.

In yet another example, data of primary parade #5 are assigned to the primary group division of the groups being transmitted to Slot #5 and Slot #9. And, data of secondary parade #11 are assigned to the secondary group division of the groups being transmitted to Slot #5 and Slot #9. More specifically, the NOG of primary parade #5 and the NOG of secondary parade #11 are both equal to 2. As described above, the secondary parade forms a pair with the primary parade, and the primary parade and the secondary parade share the same NOG and the same parade identifier.

In yet another example, data of primary parade #6 are assigned to the primary group division of the groups being transmitted to Slot #13, Slot #3, and Slot #7. And, data of secondary parade #13 are assigned to the secondary group division of the groups being transmitted to Slot #13, Slot #3, and Slot #7. More specifically, the NOG of primary parade #6 and the NOG of secondary parade #13 are both equal to 3.

In yet another example, the groups being transmitted to Slot #11 and Slot #15 are included in the primary group division, and data of the primary parade #7 are assigned to the primary group division. More specifically, the primary group division of the groups being transmitted to Slot #11 and Slot #15 includes regions A, B, C, D, and E. And, mobile service data of the second mobile mode are assigned to regions A, B, C, D, and E.

As described above, groups of a plurality of parades may be assigned to one M/H frame. And, the assignment of the groups in one subframe is performed in series (or serially performed) from left to right having a group space of 4 slots. Also, when an overlay parade is included in the plurality of parades being assigned to one subframe, the groups of the overlay parade are assigned first. In case of FIG. 12, the groups of group type 1 including the secondary group division having data of overlay parade #8 assigned thereto are assigned first. Then, the groups of group type 1 including the secondary group division having data of overlay parade #9 assigned thereto are assigned afterwards. Thereafter, the groups of group type 2 including the secondary group division having data of overlay parade #10 assigned thereto are assigned. In case a plurality of overlay parades are assigned to one subframe, the order of assignment may be arbitrarily decided, or the order of assignment may be decided based upon a pre-arranged agreement.

Figure 13:
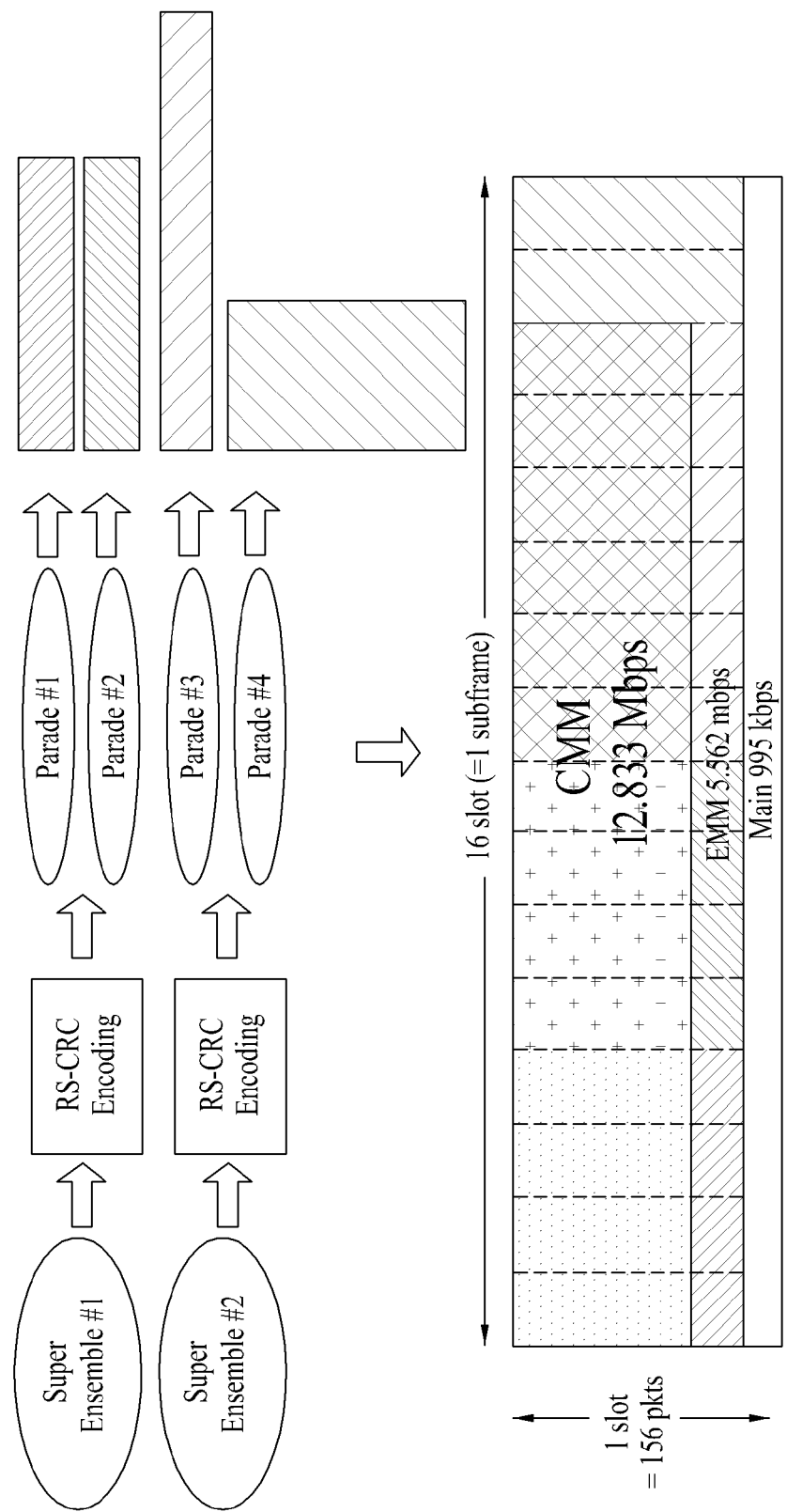
FIG. 13 illustrates the relation between a super ensemble, a super RS frame, and two parades according to an embodiment of the present invention.

FIG. 13 illustrates the relation between a super ensemble, a super RS frame, and two parades according to an embodiment of the present invention.

The super RS frame payload corresponds to a super RS frame, which is processed with RS-CRC encoding. Also, the super RS frame is transmitted through 2 random parades. At this point, the parade type of the two parades may be identical to one another or may be different from one another.

More specifically, super RS frame payload #1 is RS-CRC encoded so as to form super RS frame #1. And, super RS frame #1 is transmitted through parade #1 and parade #2. At this point, the parade types of parade #1 and parade #2 may not be identical to one another. For example, parade #1 may correspond to a secondary parade, and parade #2 may correspond to an overlay parade. In other words, parade #1 and parade #2 may be used to form one super RS frame.

Also, super RS frame payload #2 is RS-CRC encoded so as to form super RS frame #2. And, super RS frame #2 is transmitted through parade #3 and parade #4. At this point, also, the parade types of parade #3 and parade #4 may not be identical to one another. For example, parade #3 may correspond to a secondary parade, and parade #4 may correspond to a primary parade. In other words, parade #3 and parade #4 may be used to form one super RS frame.

As described above, the parade types of the two parades that transmit a single super RS frame are independent from one another.

Figure 14:
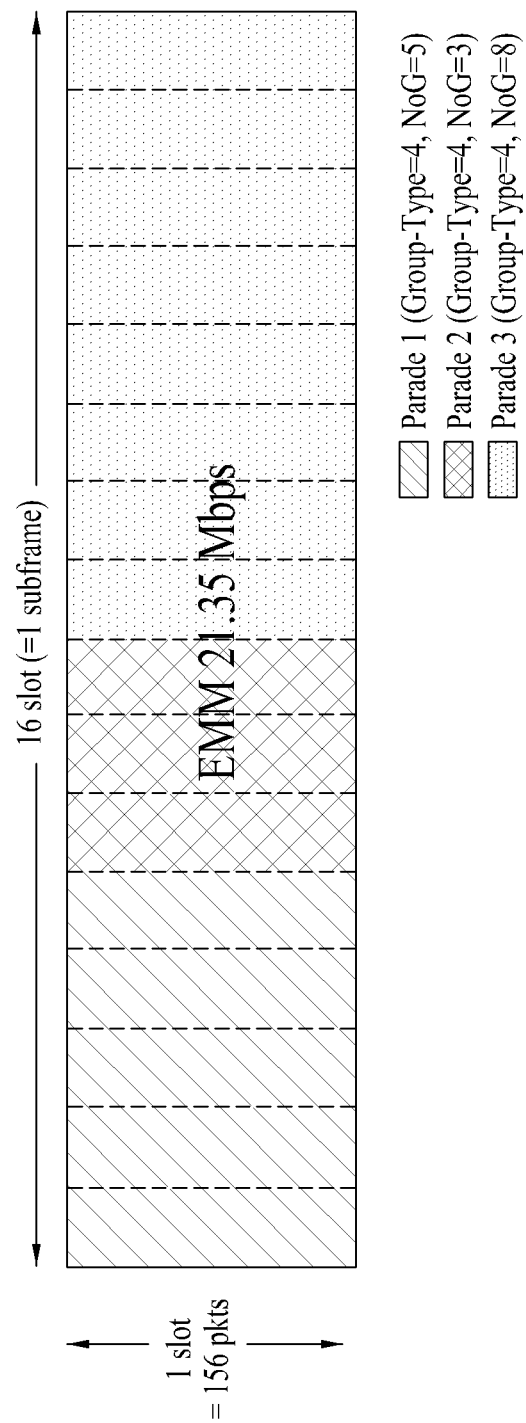
FIG. 14 illustrates an example of allocating parade #1 of group type 4 and having an NOG of 5, parade #2 of group type 4 and having an NOG of 3, and parade #3 of group type 4 and having an NOG of 8 to a subframe according to an embodiment of the present invention.

FIG. 14 illustrates an example of allocating parade #1 of group type 4 and having an NOG of 5, parade #2 of group type 4 and having an NOG of 3, and parade #3 of group type 4 and having an NOG of 8 to a subframe according to an embodiment of the present invention.

When it is assumed that the conventional data transmission rate is equal to 19.39 Mbps, and if the group corresponds to group type 4, the data transmission rate of group type 4 becomes greater than 19.39 Mbps. FIG. 14 shows an example of the data transmission rate increasing to 21.35 Mbps.

Meanwhile, among the above-described group types, group type 4 corresponds to a 100% full-channel mobile mode. Herein, the mobile service data being assigned to the group of group type 4 are not required to be backward compatible with the main service. Also, in order to increase the mobile channel capacity, only the actual mobile service data are assigned to the group of group type 4, and, accordingly, the MPEG header (i.e., TS packet header) or RS parity bytes are not assigned. More specifically, mobile service data are also assigned MPEG header and RS parity bytes positions.

Figure 15:
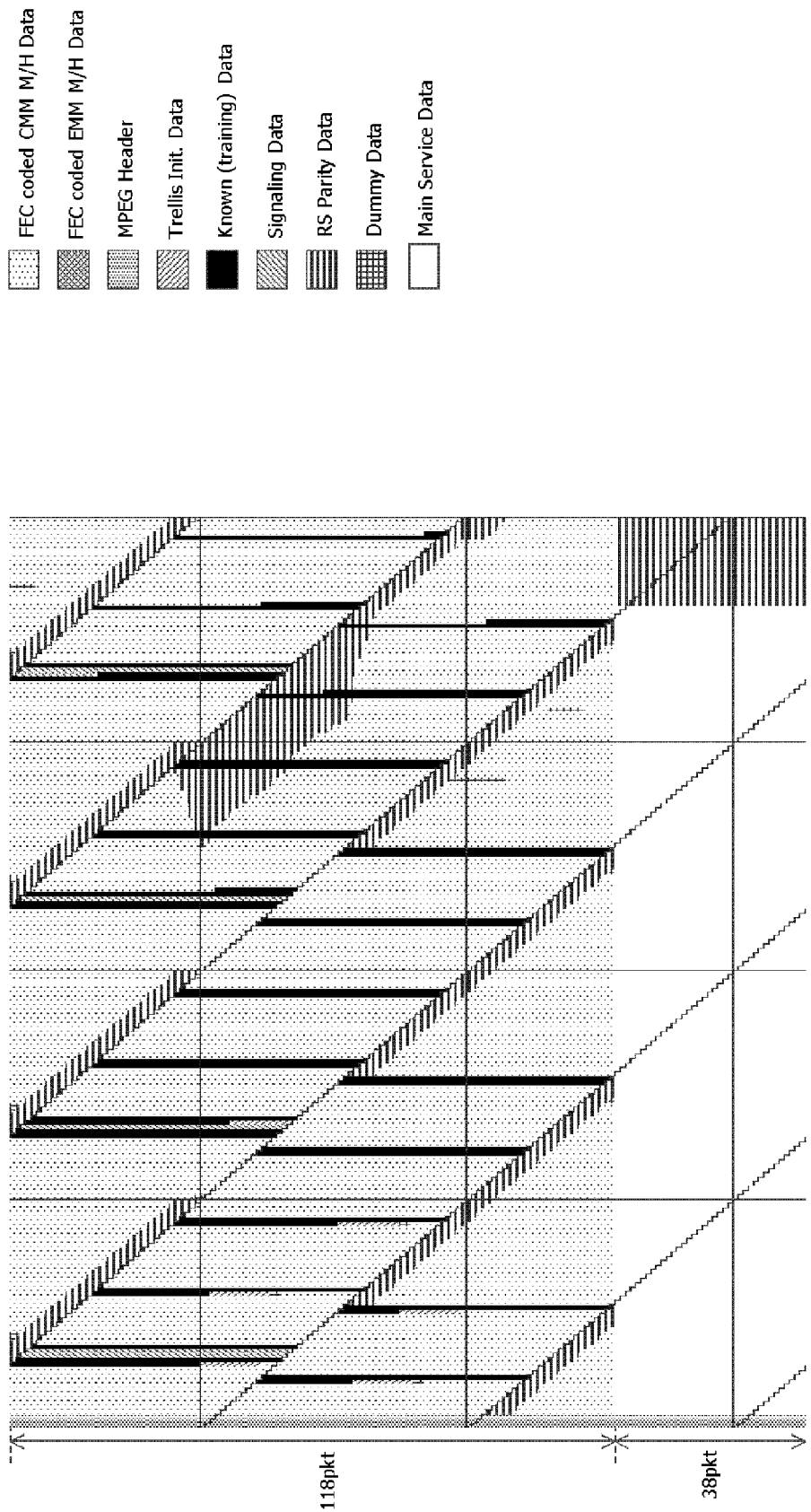
FIG. 15 illustrates group type 0 of data group, according to an embodiment of the present invention.

FIG. 15 illustrates group type 0 of data group, according to an embodiment of the present invention.

According to FIG. 15, a structure acquired before a data group is interleaved, when the data group includes 118 mobile service data packets.

Referring to FIG. 15, the data group includes 118 TS packets that include at least one of FEC-encoded mobile service data, MPEG header, trellis initialization data, known data, signaling data, RS parity bytes and dummy data. For convenience of description and better understanding of the present invention, a TS packet contained in the data group is defined as a mobile service data packet according to the present invention.

The data group shown in FIG. 15 includes 118 mobile service data packets, such that it can be recognized that the slot via which the above-mentioned data group is transmitted is used for transmitting 38 main service data packets.

Figure 16:
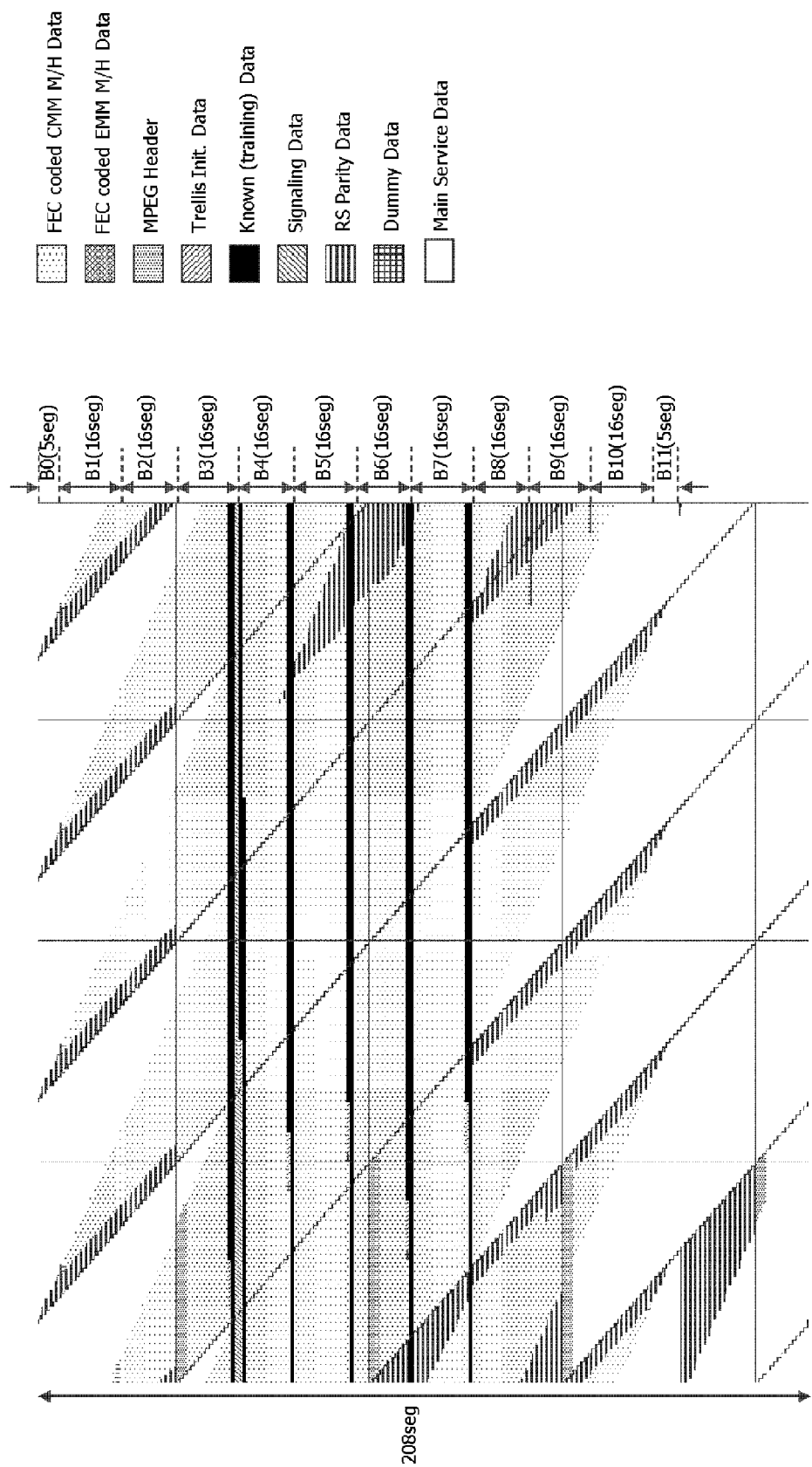
FIG. 16 illustrates a structure acquired after a group type 0 of data group data group is interleaved, when the data group includes 118 mobile service data packets, according to an embodiment of the present invention.

FIG. 16 illustrates a structure acquired after a group type 0 of data group data group is interleaved, when the data group includes 118 mobile service data packets, according to an embodiment of the present invention.

Referring to FIG. 16, the data group including 118 mobile service data packets is interleaved such that a data group including 170 segments is formed.

In this case, the above-mentioned example in which 118 mobile service data packets are distributed to 170 segments has been disclosed only for illustrative purposes and better understanding of the present invention. The number of data segments formed after the data group is interleaved may be changed to another according to the degree of interleaving.

FIG. 16 shows an example of dividing a data group prior to being data-interleaved into 10 data blocks (i.e., data block 1 (B1) to data block 10 (B10)). In other word, data block can be defined as a transmission block containing mobile service data or main and mobile service data in segment level. In this example, each data block has the length of 16 segments. Referring to FIG. 16, only the RS parity bytes are allocated to a portion of 5 segments before the data block 1 (B1) and 5 segments behind the data block 10 (B10). The RS parity bytes are excluded in regions A to D of the data group.

More specifically, when it is assumed that one data group is divided into regions A, B, C, and D, each data block may be included in any one of region A to region D depending upon the characteristic of each data block within the data group. At this point, according to an embodiment of the present invention, each DATA block may be included in any one of region A to region D based upon an interference level of main service data.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 16, data block 4 (B4) to data block 7 (B7) correspond to regions without interference of the main service data. data block 4 (B4) to data block 7 (B7) within the data group shown in FIG. 16 correspond to a region where no interference from the main service data occurs. In this example, a long known data sequence is inserted at both the beginning and end of each data block. In the description of the present invention, the region including data block 4 (B4) to data block 7 (B7) will be referred to as "region A (=B4+B5+B6+B7)". As described above, when the data group includes region A having a long known data sequence inserted at both the beginning and end of each data block, the receiving system is capable of performing equalization by using the channel information that can be obtained from the known data. Therefore, the strongest equalizing performance may be yielded (or obtained) from one of region A to region D.

In the example of the data group shown in FIG. 16, data block 3 (B3) and data block 8 (B8) correspond to a region having little interference from the main service data. Herein, a long known data sequence is inserted in only one side of each data block B3 and B8. More specifically, due to the interference from the main service data, a long known data sequence is inserted at the end of data block 3 (B3), and another long known data sequence is inserted at the beginning of data block 8 (B8). In the present invention, the region including data block 3 (B3) and data block 8 (B8) will be referred to as "region B(=B3+B8)". As described above, when the data group includes region B having a long known data sequence inserted at only one side (beginning or end) of each data block, the receiving system is capable of performing equalization by using the channel information that can be obtained from the known data. Therefore, a stronger equalizing performance as compared to region C/D may be yielded (or obtained).

Referring to FIG. 16, data block 2 (B2) and data block 9 (B9) correspond to a region having more interference from the main service data as compared to region B. A long known data sequence cannot be inserted in any side of data block 2 (B2) and data block 9 (B9). Herein, the region including data block 2 (B2) and data block 9 (B9) will be referred to as "region C(=B2+B9)".

Finally, in the example shown in FIG. 16, data block 1 (B1) and data block 10 (B10) correspond to a region having more interference from the main service data as compared to region C. Similarly, a long known data sequence cannot be inserted in any side of data block 1 (B1) and data block 10 (B10).

Referring to FIG. 16, it can be readily recognized that the regions A and B of the data group includes signaling data used for signaling at a reception end.

Figure 17:
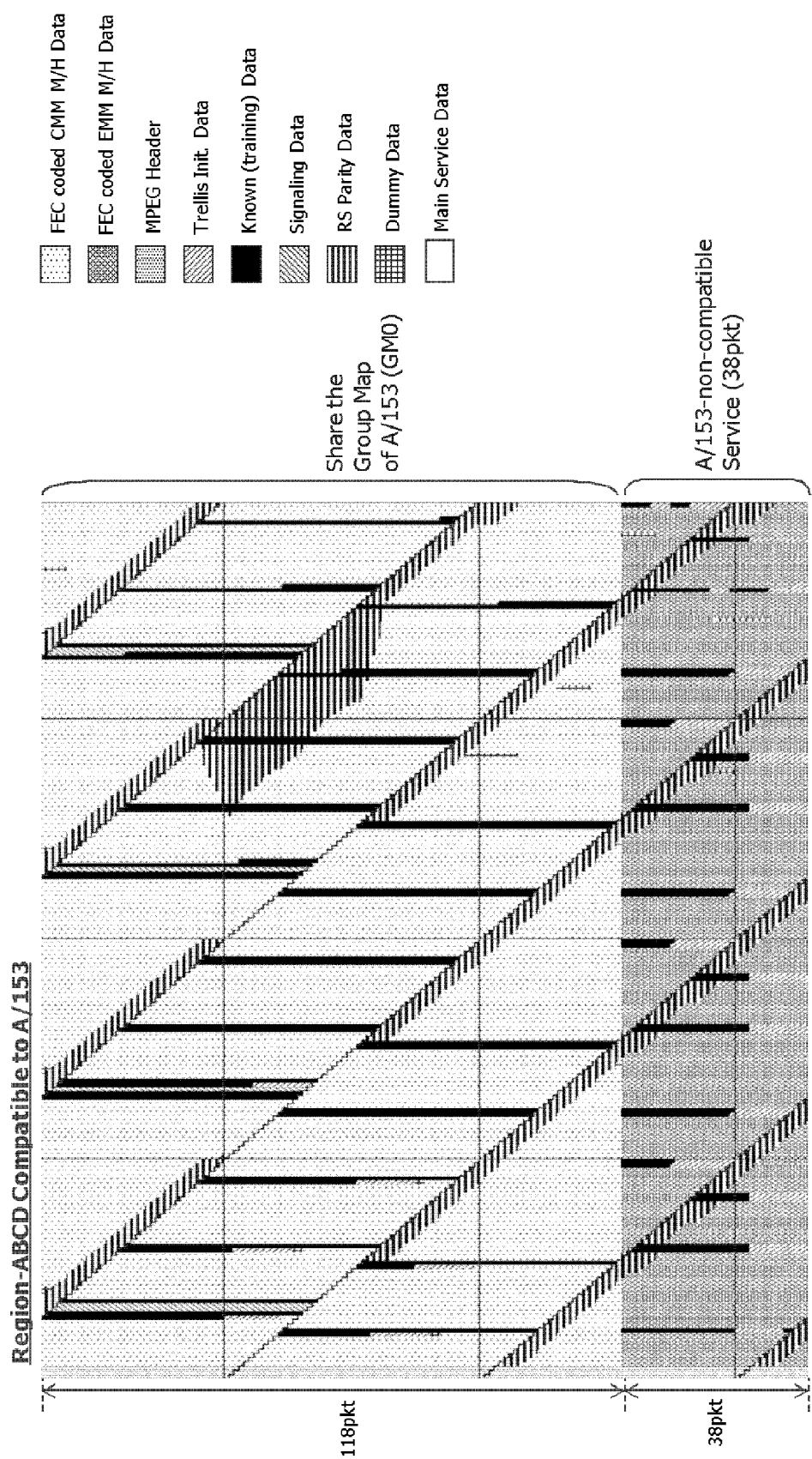
FIG. 17 illustrates group type 1-0 of data group, according to an embodiment of the present invention.

FIG. 17 illustrates group type 1-0 of data group, according to an embodiment of the present invention.

According to FIG. 17, a structure provided before a data group is interleaved, when the data group includes (118+38) mobile service data packets Referring to FIG. 17, the data group includes mobile service data of the A and B regions, mobile service data of the C and D regions, mobile service data of the E region, an MPEG header, trellis initialization data, known data, signaling data, RS parity bytes, and dummy data.

As shown in FIG. 17, the E region has no main service data packets, such that the region for the RS parity and the MPEG header is not present in the E region. Therefore, the above-mentioned regions may be adapted to transmit mobile service data, such that much more mobile service data can be transmitted.

Figure 18:
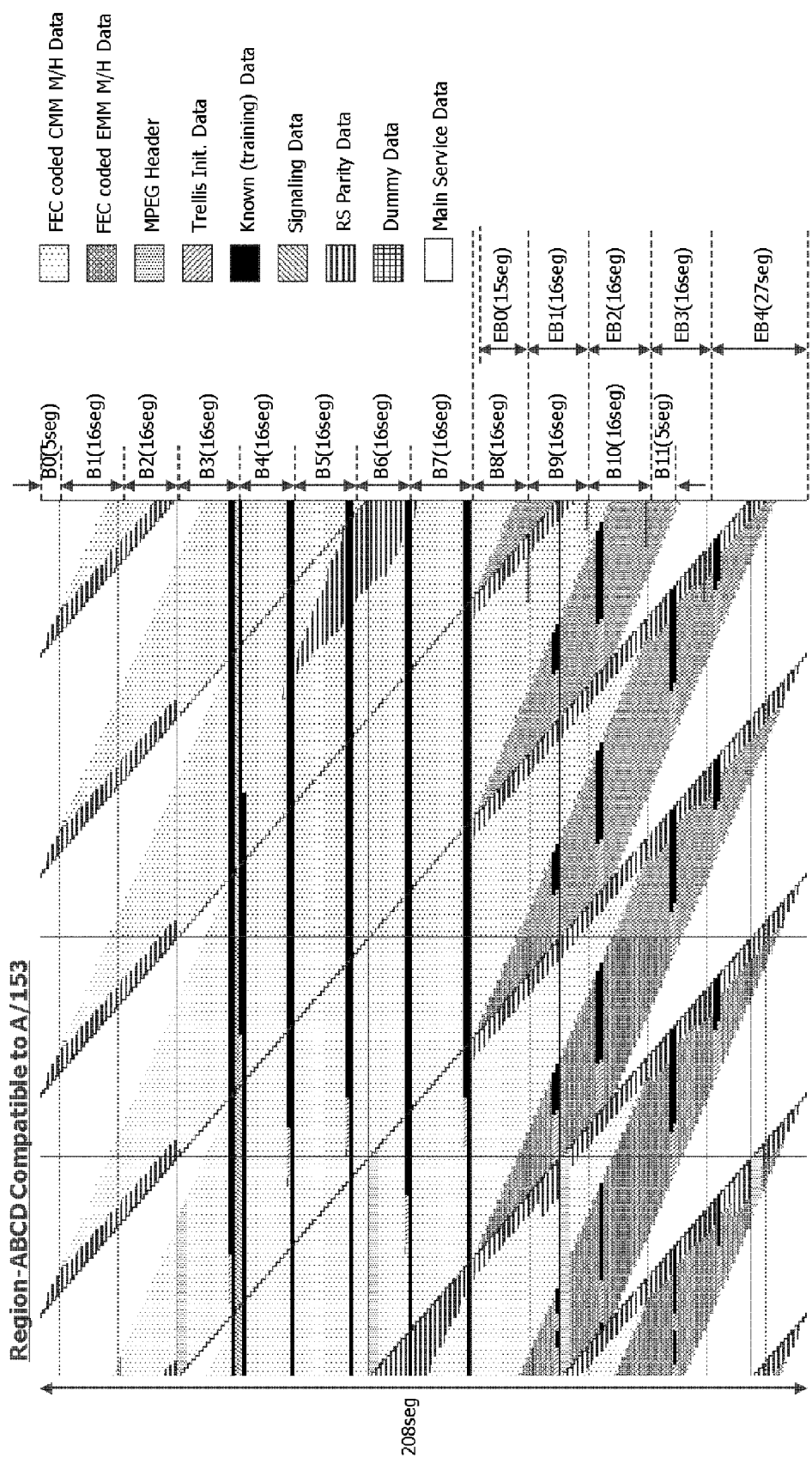
FIG. 18 illustrates a structure provided after a group type 1-0 of data group is interleaved when the data group includes (118+38) mobile service data packets according to an embodiment of the present invention.

FIG. 18 illustrates a structure provided after a group type 1-0 of data group is interleaved when the data group includes (118+38) mobile service data packets according to an embodiment of the present invention.

The structure shown in FIG. 18 is identical to a structure formed after the data group of FIG. 17 is interleaved.

As can be seen from the data group shown in FIG. 18, the primary ensemble is transmitted through the A, B, C and D regions of the data group, and the secondary ensemble is transmitted through the E region of the data group. Since the A, B, C and D regions are identical to those of a conventional data group, they can maintain the compatibility with a conventional digital mobile broadcast system. In addition, additional mobile service data can be transmitted through the E region.

Although the data group of FIG. 18 is divided into 10 blocks belonging to the A, B, C and D regions and five additional blocks belonging to the E region, the number of blocks belonging to the E block is not limited only to '5' and may be changed to another number not '5' according to the intention of a designer.

Referring to FIG. 18, known data is inserted into the E region. Therefore, the reception performance of the reception end is increased in the E region. As described above, mobile service data is inserted into the reserved area for both the RS parity and the MPEG header present in the E region, such that much more mobile service data can be transmitted.

Figure 19:
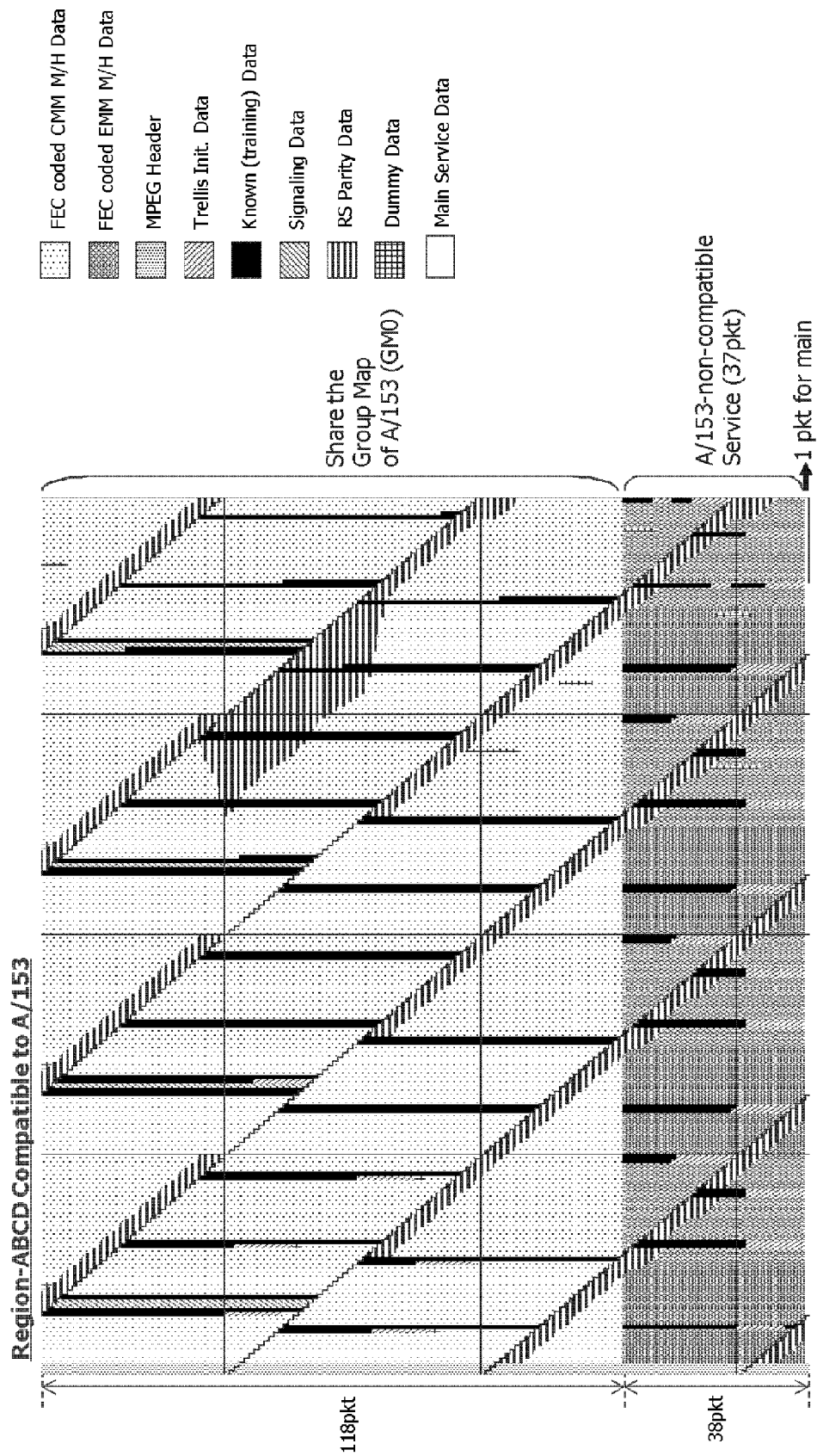
FIG. 19 illustrates group type 1-1 of data group, according to an embodiment of the present invention.

FIG. 19 illustrates group type 1-1 of data group, according to an embodiment of the present invention.

According to FIG. 19, a structure provided before a data group is interleaved, when the data group includes (118+37) mobile service data packets Referring to FIG. 19, the data group includes mobile service data of the A and B regions, mobile service data of the C and D regions, mobile service data of the E region, an MPEG header, trellis initialization data, known data, signaling data, RS parity bytes, and dummy data.

As shown in FIG. 19, one main service data packet may be inserted in region E. In the conventional broadcasting system, an error may occur when main data are not received for a long period of time. However, by inserting the main service data packet, as described above, such error may be prevented.

Figure 20:
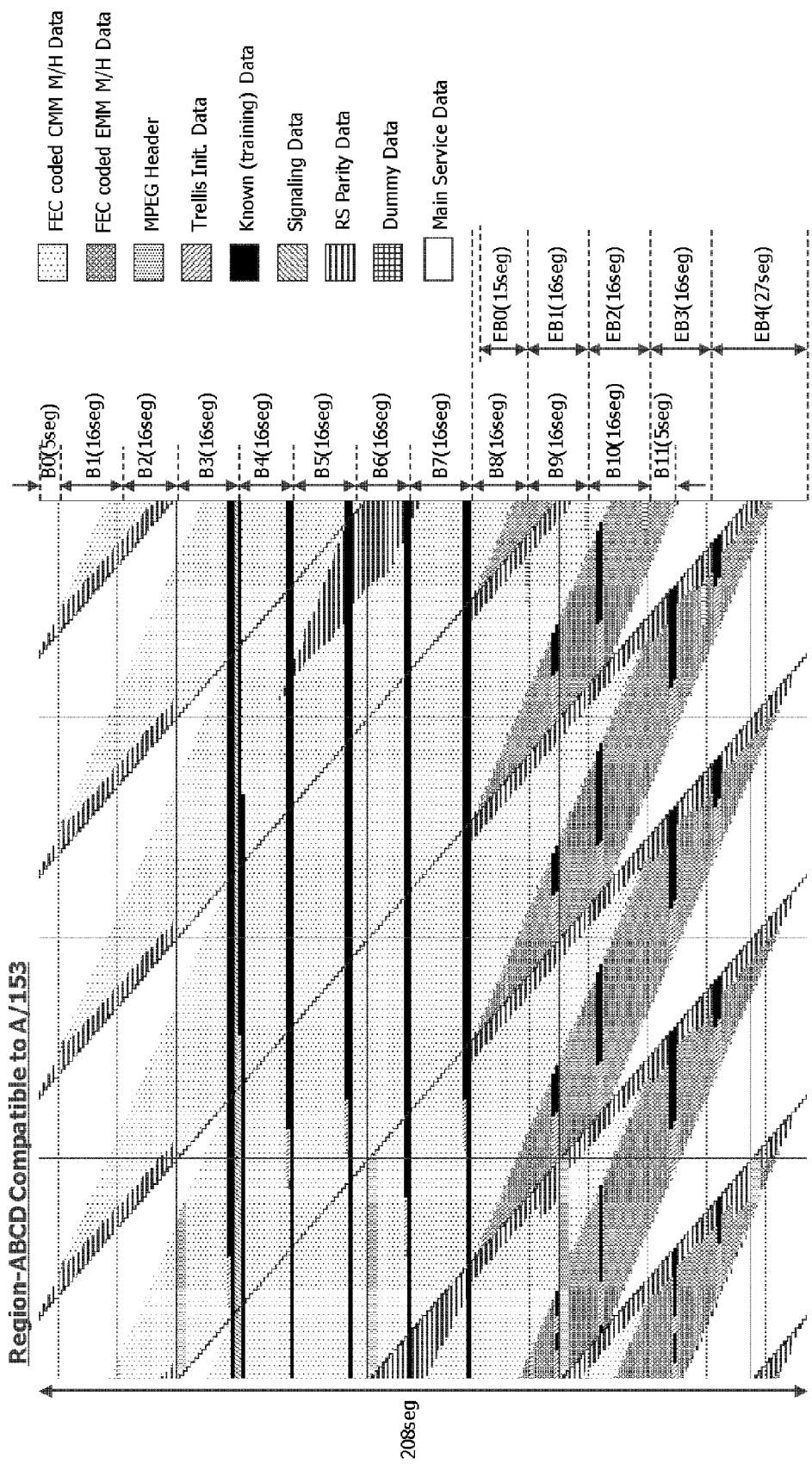
FIG. 20 illustrates a structure provided after a group type 1-1 of data group is interleaved when the data group includes (118+37) mobile service data packets according to an embodiment of the present invention.

FIG. 20 illustrates a structure provided after a group type 1-1 of data group is interleaved when the data group includes (118+37) mobile service data packets according to an embodiment of the present invention.

The structure shown in FIG. 20 is identical to a structure formed after the data group of FIG. 19 is interleaved.

As can be seen from the data group shown in FIG. 20, the primary ensemble is transmitted through the A, B, C and D regions of the data group, and the secondary ensemble is transmitted through the E region of the data group. Since the A, B, C and D regions are identical to those of a conventional data group, they can maintain the compatibility with a conventional digital mobile broadcast system. In addition, additional mobile service data can be transmitted through the E region.

Furthermore, the data that are transmitted through regions A, B, C, and D may be validly decoded by the conventional mobile broadcasting system. However, although the data that are transmitted through region E can be received by the conventional mobile broadcasting system, the corresponding data cannot be processed as valid information.

Although the data group of FIG. 20 is divided into 10 blocks belonging to the A, B, C and D regions and five additional blocks belonging to the E region, the number of blocks belonging to the E block is not limited only to '5' and may be changed to another number not '5' according to the intention of a designer.

Referring to FIG. 20, known data is inserted into the E region. Therefore, the reception performance of the reception end is increased in the E region. As described above, mobile service data is inserted into the reserved area for both the RS parity and the MPEG header present in the E region, such that much more mobile service data can be transmitted.

Figure 21:
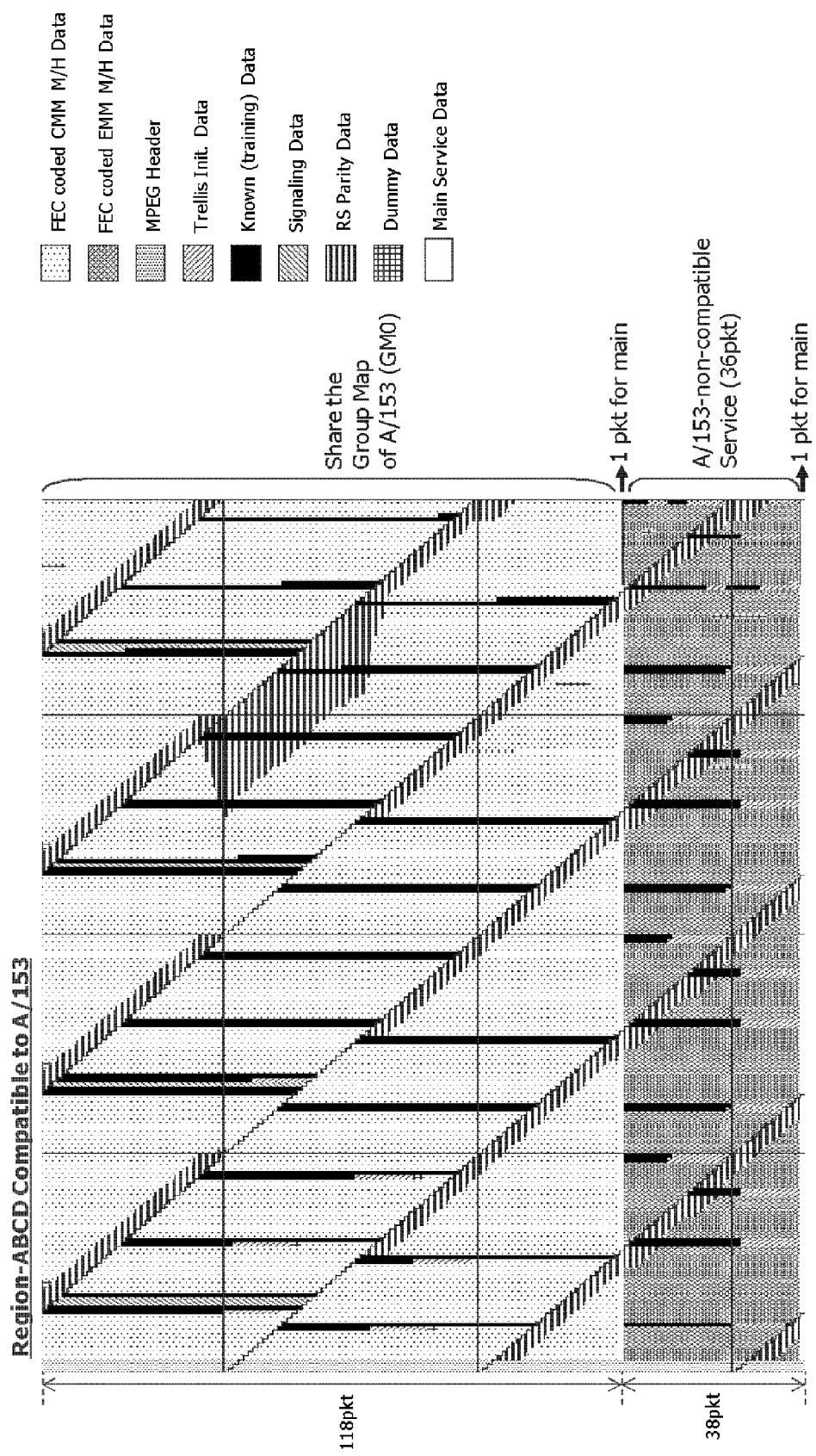
FIG. 21 illustrates group type 1-2 of data group, according to an embodiment of the present invention.

FIG. 21 illustrates group type 1-2 of data group, according to an embodiment of the present invention.

According to FIG. 21, a structure provided before a data group is interleaved, when the data group includes (118+36) mobile service data packets.

Figure 22:
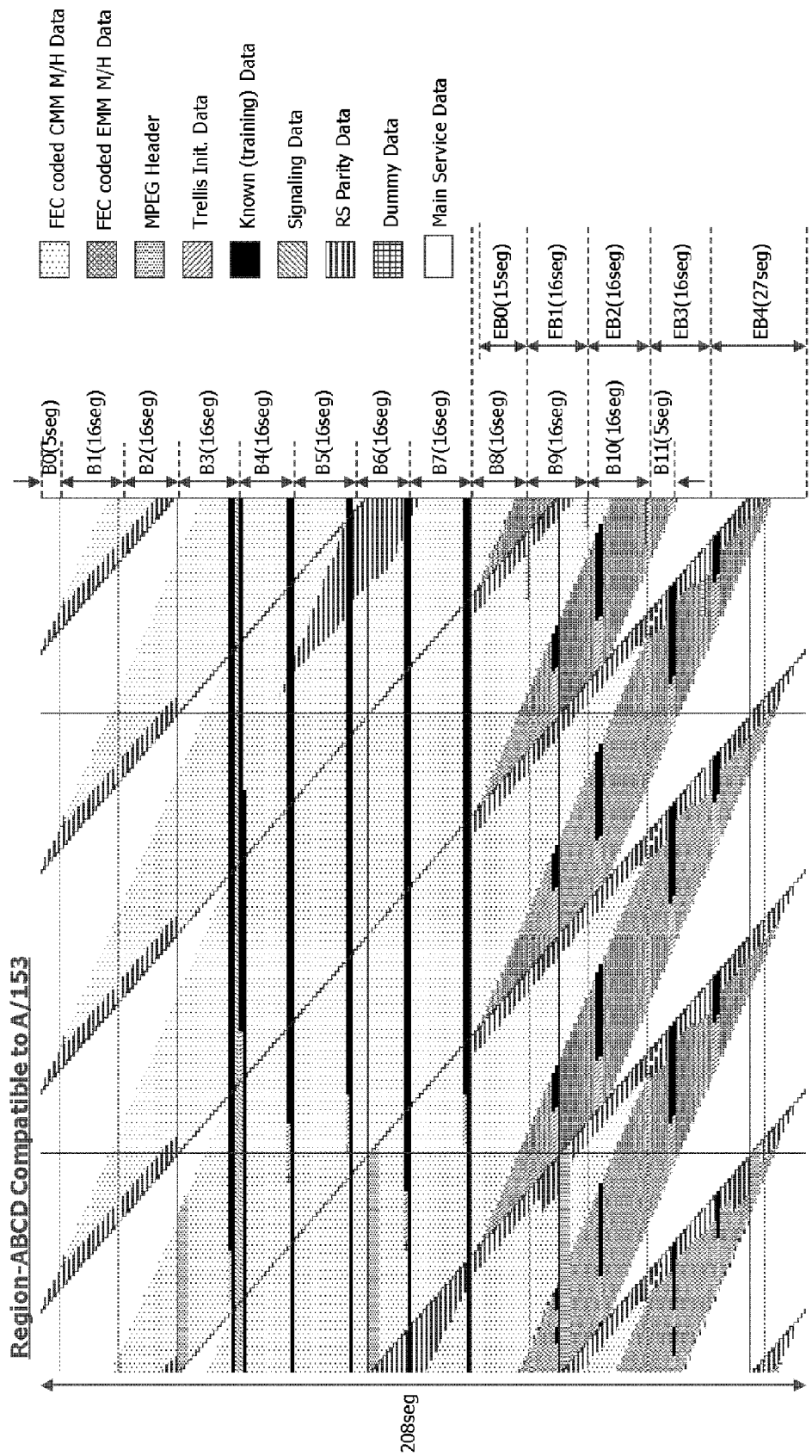
FIG. 22 illustrates a structure provided after a group type 1-2 of data group is interleaved when the data group includes (118+36) mobile service data packets according to an embodiment of the present invention.

FIG. 22 illustrates a structure provided after a group type 1-2 of data group is interleaved when the data group includes (118+36) mobile service data packets according to an embodiment of the present invention.

The structure shown in FIG. 22 is identical to a structure formed after the data group of FIG. 21 is interleaved.

Figure 23:
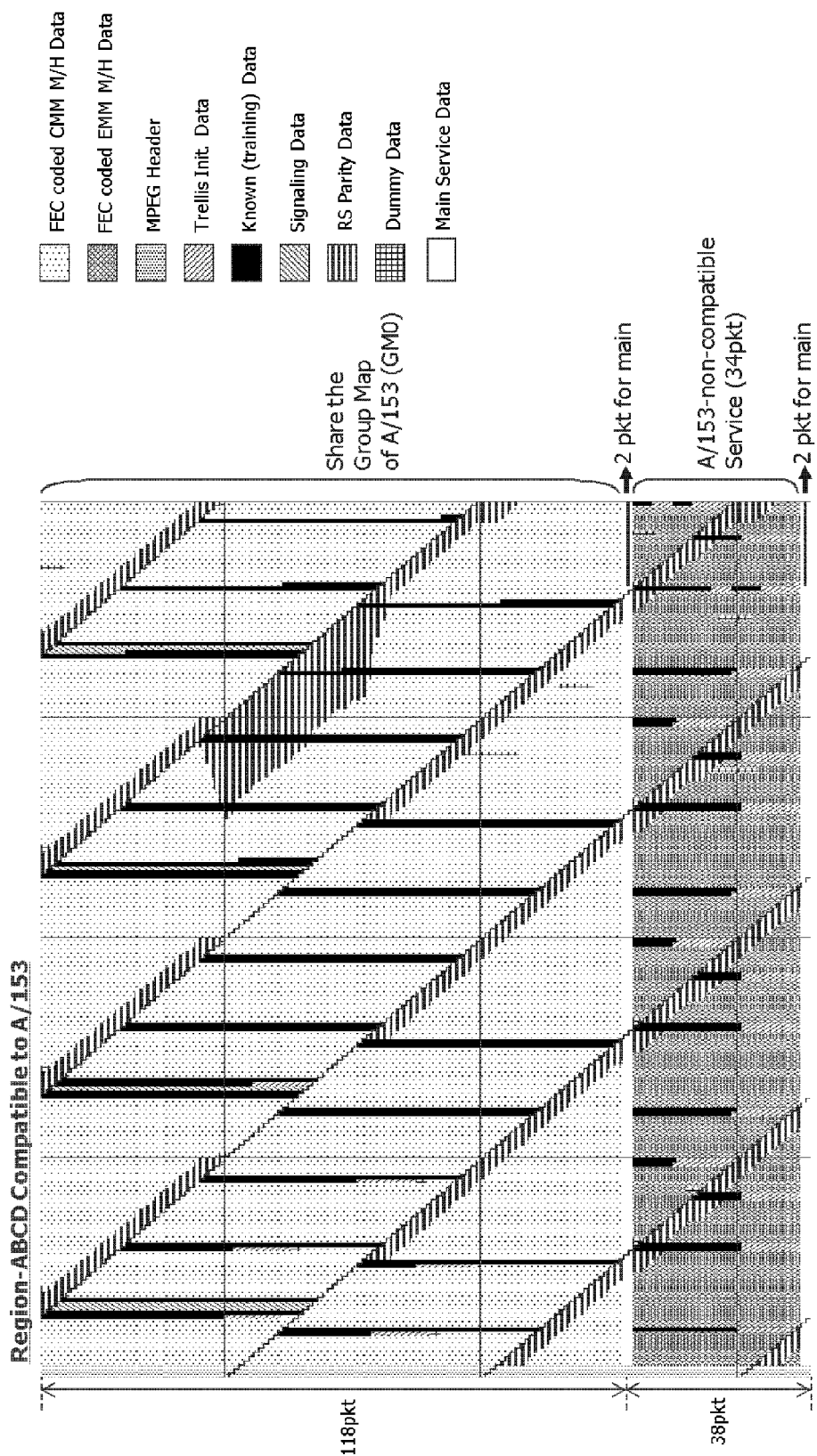
FIG. 23 illustrates group type 1-4 of data group, according to an embodiment of the present invention.

FIG. 23 illustrates group type 1-4 of data group, according to an embodiment of the present invention.

According to FIG. 23, a structure provided before a data group is interleaved, when the data group includes (118+34) mobile service data packets.

Figure 24:
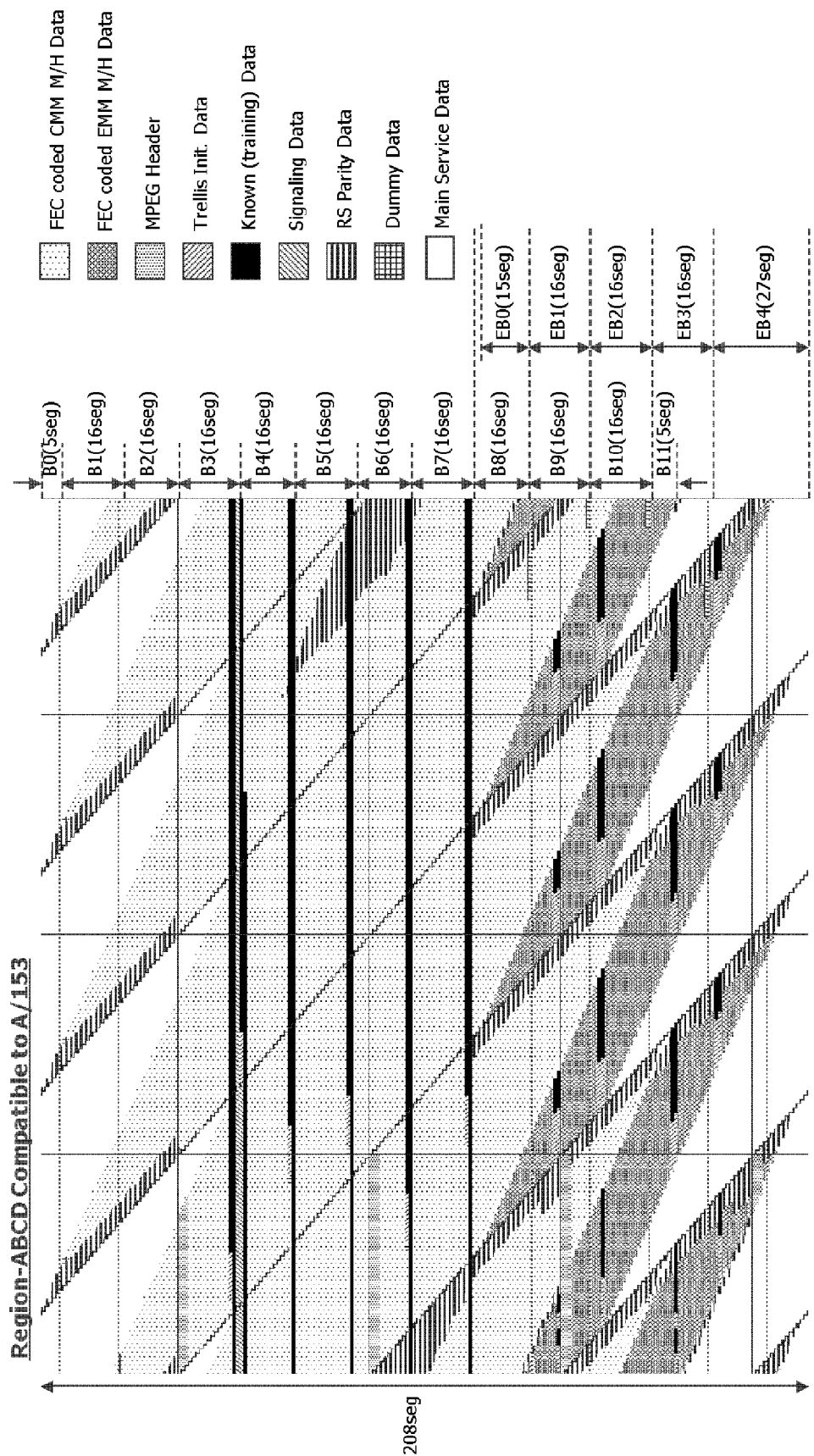
FIG. 24 illustrates a structure provided after a group type 1-4 of data group is interleaved when the data group includes (118+34) mobile service data packets according to an embodiment of the present invention.

FIG. 24 illustrates a structure provided after a group type 1-4 of data group is interleaved when the data group includes (118+34) mobile service data packets according to an embodiment of the present invention.

The structure shown in FIG. 24 is identical to a structure formed after the data group of FIG. 23 is interleaved.

Figure 25:
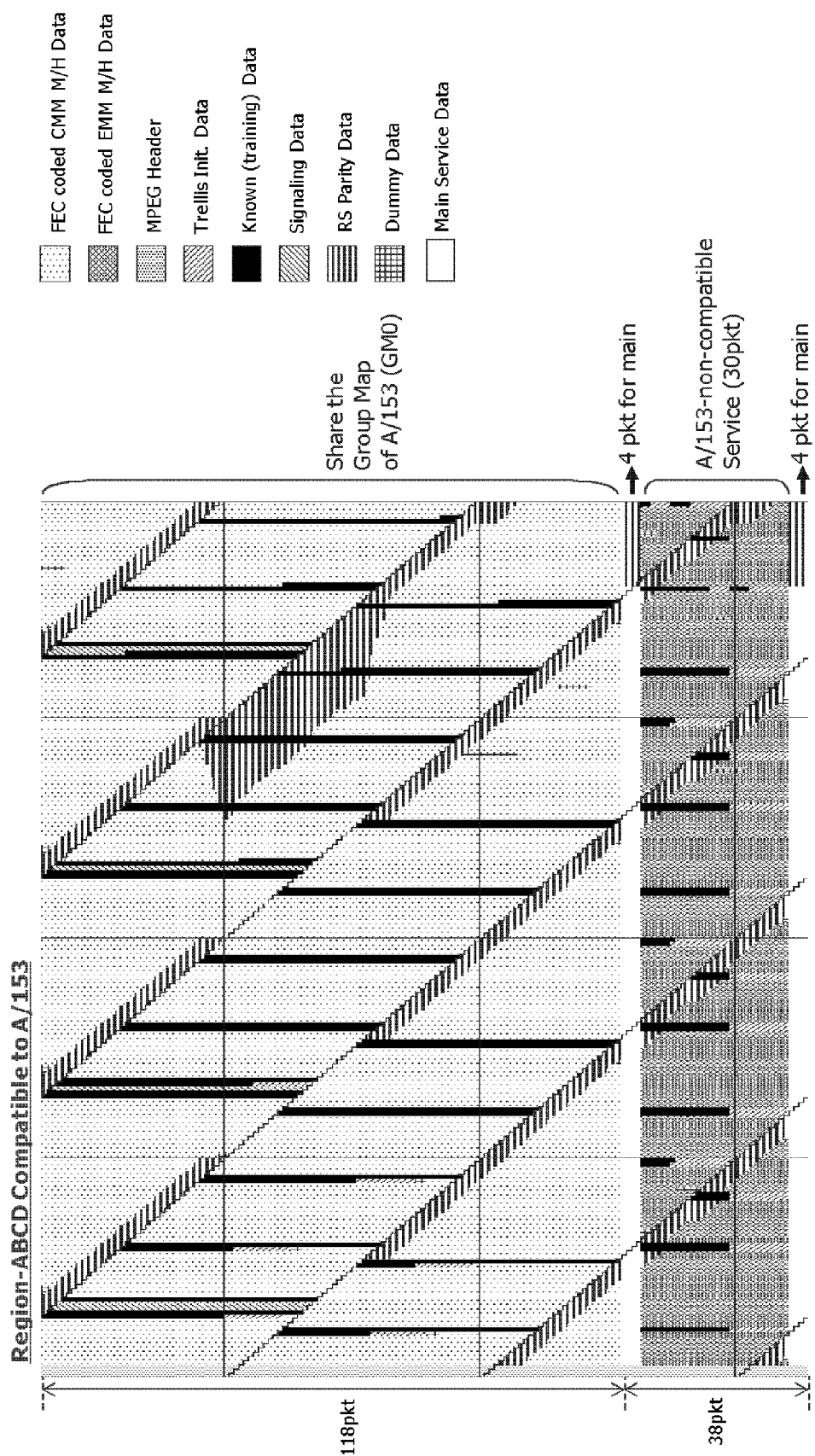
FIG. 25 illustrates group type 1-8 of data group, according to an embodiment of the present invention.

FIG. 25 illustrates group type 1-8 of data group, according to an embodiment of the present invention.

According to FIG. 25, a structure provided before a data group is interleaved, when the data group includes (118+30) mobile service data packets.

Figure 26:
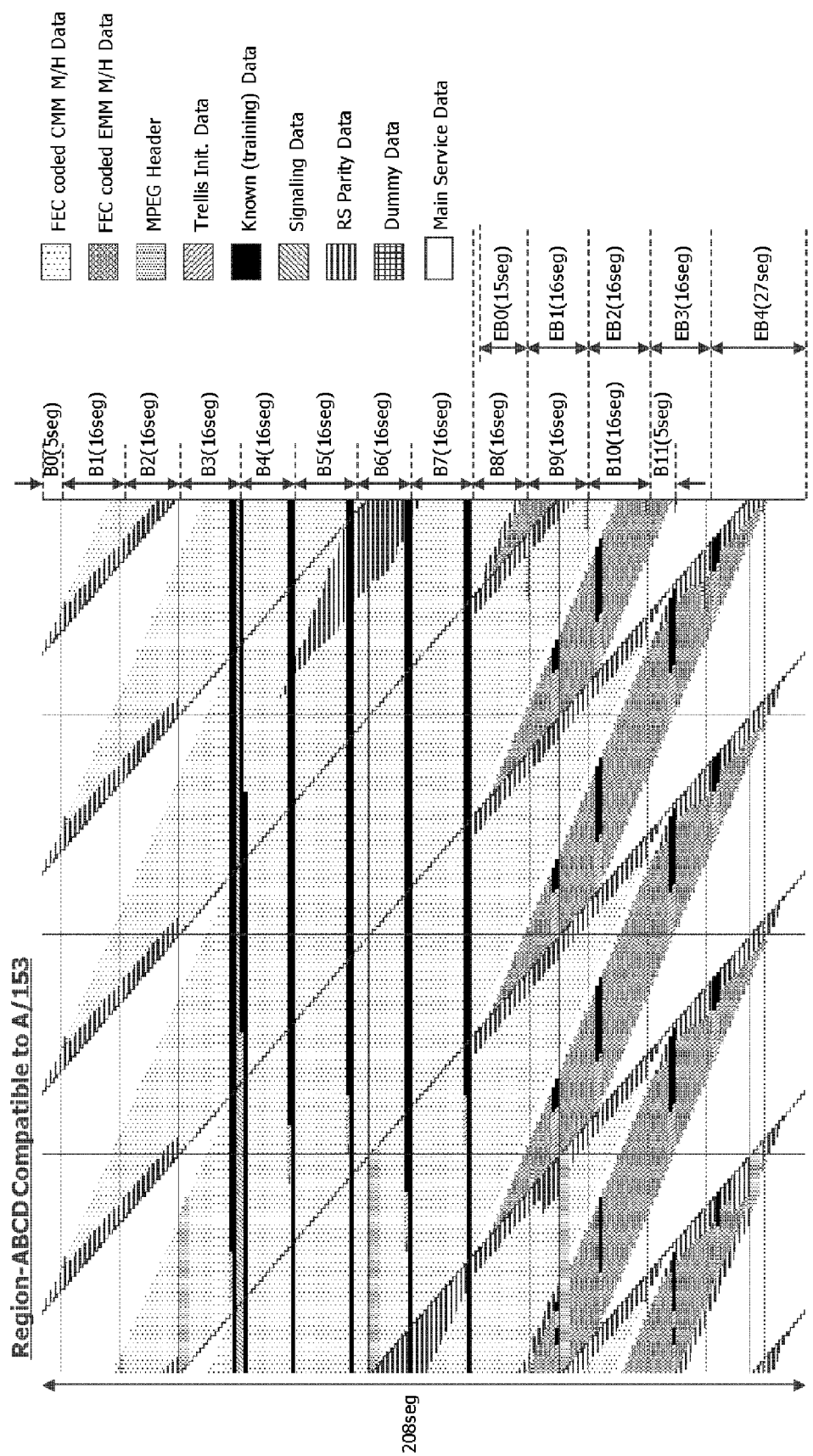
FIG. 26 illustrates a structure provided after a group type 1-8 of data group is interleaved when the data group includes (118+30) mobile service data packets according to an embodiment of the present invention.

FIG. 26 illustrates a structure provided after a group type 1-8 of data group is interleaved when the data group includes (118+30) mobile service data packets according to an embodiment of the present invention.

The structure shown in FIG. 26 is identical to a structure formed after the data group of FIG. 25 is interleaved.

The descriptions of FIG. 18 and FIG. 19 may be similarly applied to the data groups shown in FIG. 20 to FIG. 26.

In the description of FIG. 17 to FIG. 26, although number of main service data packets included in a data group is limited to a specific number, the number is merely exemplary. Therefore, the present invention will not be limited only to the limited number of data packets proposed in the description of the present invention.

Figure 27:
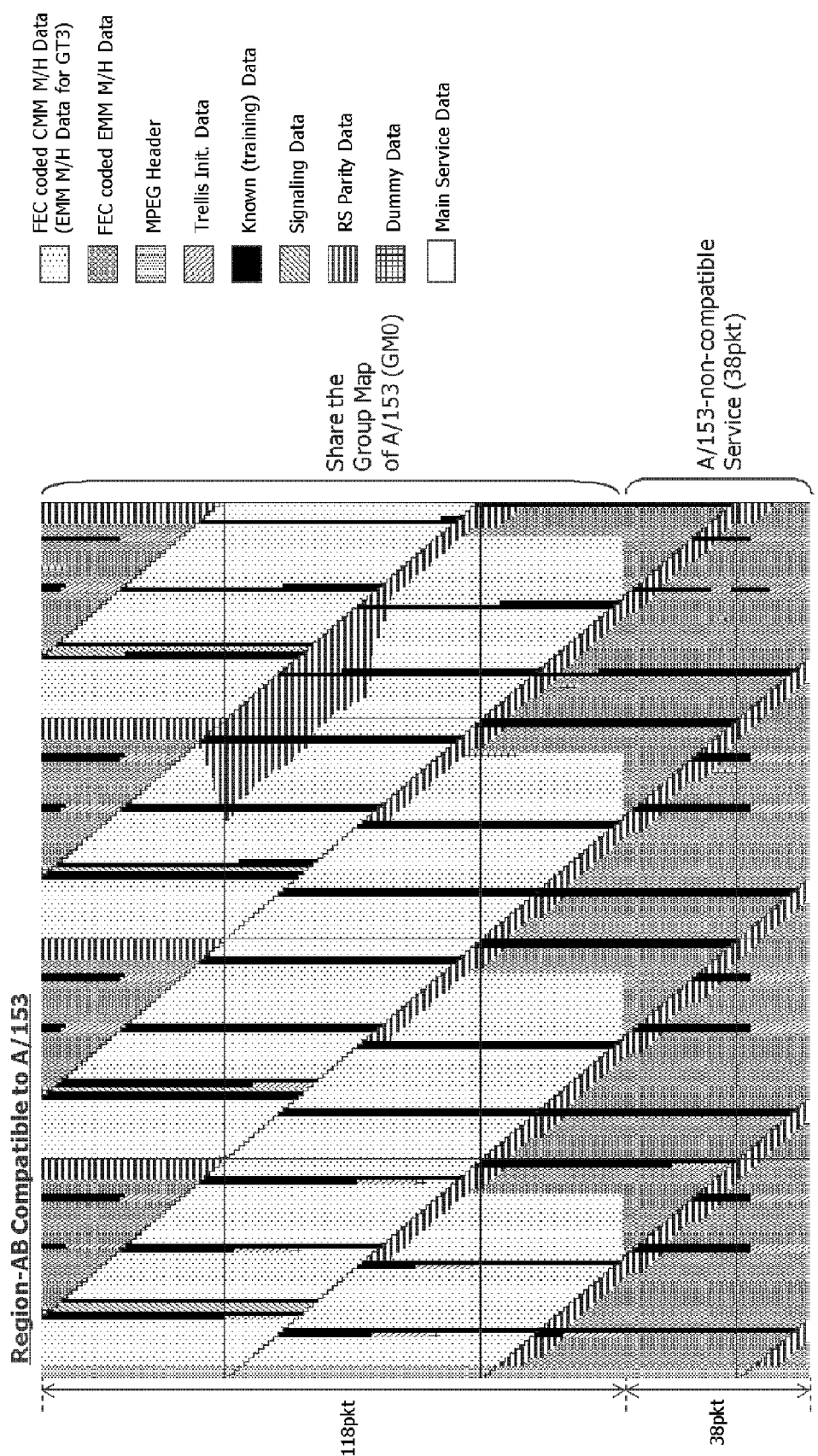
FIG. 27 illustrates group type 2-0 of data group, according to an embodiment of the present invention.

FIG. 27 illustrates group type 2-0 of data group, according to an embodiment of the present invention.

According to FIG. 27, a structure provided before a data group is interleaved, when the data group includes (118+38) mobile service data packets.

Referring to FIG. 27, the data group includes mobile service data of the A and B regions, mobile service data of the C and D regions, mobile service data of the E region, an MPEG header, trellis initialization data, known data, signaling data, RS parity bytes, and dummy data.

As shown in FIG. 27, in the upper portion of the data group, known data may be inserted in the lower end of the trellis initialization data, and RS parity bytes may be inserted on the right side of the trellis initialization data.

Figure 28:
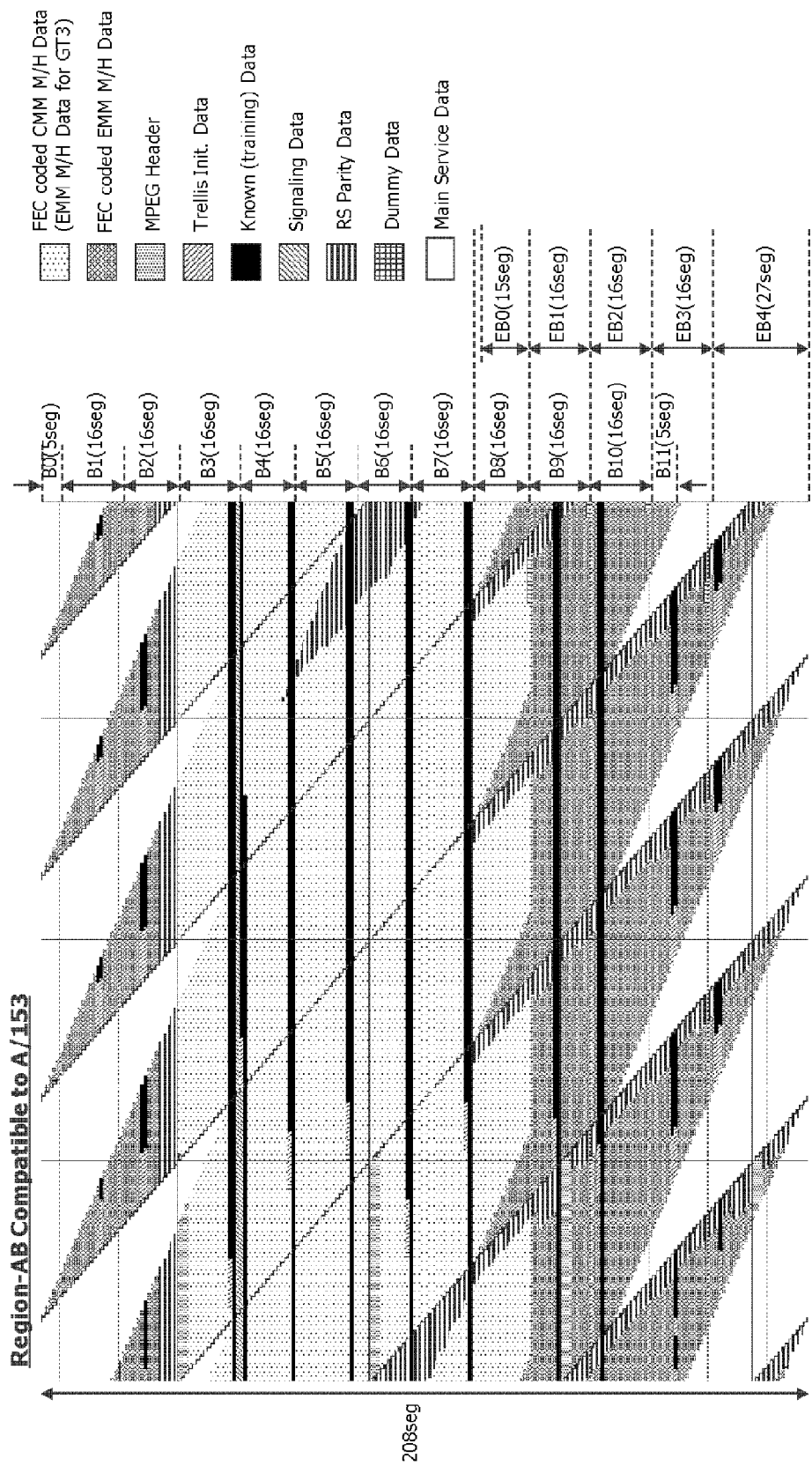
FIG. 28 illustrates a structure provided after a group type 2-0 of data group is interleaved, when the data group includes (118+38) mobile service data packets, according to an embodiment of the present invention.

FIG. 28 illustrates a structure provided after a group type 2-0 of data group is interleaved, when the data group includes (118+38) mobile service data packets, according to an embodiment of the present invention.

The structure shown in FIG. 28 is identical to a structure formed after the data group of FIG. 27 is interleaved.

As can be seen from the data group shown in FIG. 28, the primary ensemble is transmitted through the A and B regions of the data group, and the secondary ensemble is transmitted through the C, D and E region of the data group. Since the A and B regions include the RS parity and the MPEG header, they can maintain the compatibility with a conventional digital mobile broadcast system.

Furthermore, the data that are transmitted through regions A and B may be validly decoded by the conventional mobile broadcasting system. However, although the data that are transmitted through regions C, D, and E can be received by the conventional mobile broadcasting system, the corresponding data cannot be processed as valid information.

Although the data group of FIG. 28 is divided into 10 blocks belonging to the A, B, C and D regions and five additional blocks belonging to the E region, the number of blocks belonging to the E block is not limited only to '5' and may be changed to another number not '5' according to the intention of a designer.

Referring to FIG. 28, additional known data is inserted into the C and D regions in addition to the A and B regions. The data group shown in FIG. 28 is not affected by main service data, such that successive known data sequences can be contained in the C and D regions differently from the data group shown in FIG. 18. Therefore, the reception performance of mobile service data transmitted through the C and D regions at the reception end can be greatly increased.

In accordance with the present invention, the number of known data sequences inserted into the C and D regions is not limited only to a specific number. Therefore, according to the intention of a designer, a proper number of known data sequences required for enhancing the reception performance of the reception end can be inserted. In accordance with one embodiment of the present invention, 3 known data sequences are inserted into the C region, and 2 known data sequences are inserted into the D region.

As shown in FIG. 28, RS parity bytes may be inserted in the 5 segments positioned at the lower end of block B2, which is included in the upper portion of the data group. This is because the possibility of the occurrence of mutual interference may be lowered as the insertion position of the RS parity bytes is spaced further apart from the trellis initialization data. However, the insertion position of the RS parity bytes may be varied depending upon the intentions and design of the system designer.

Figure 29:
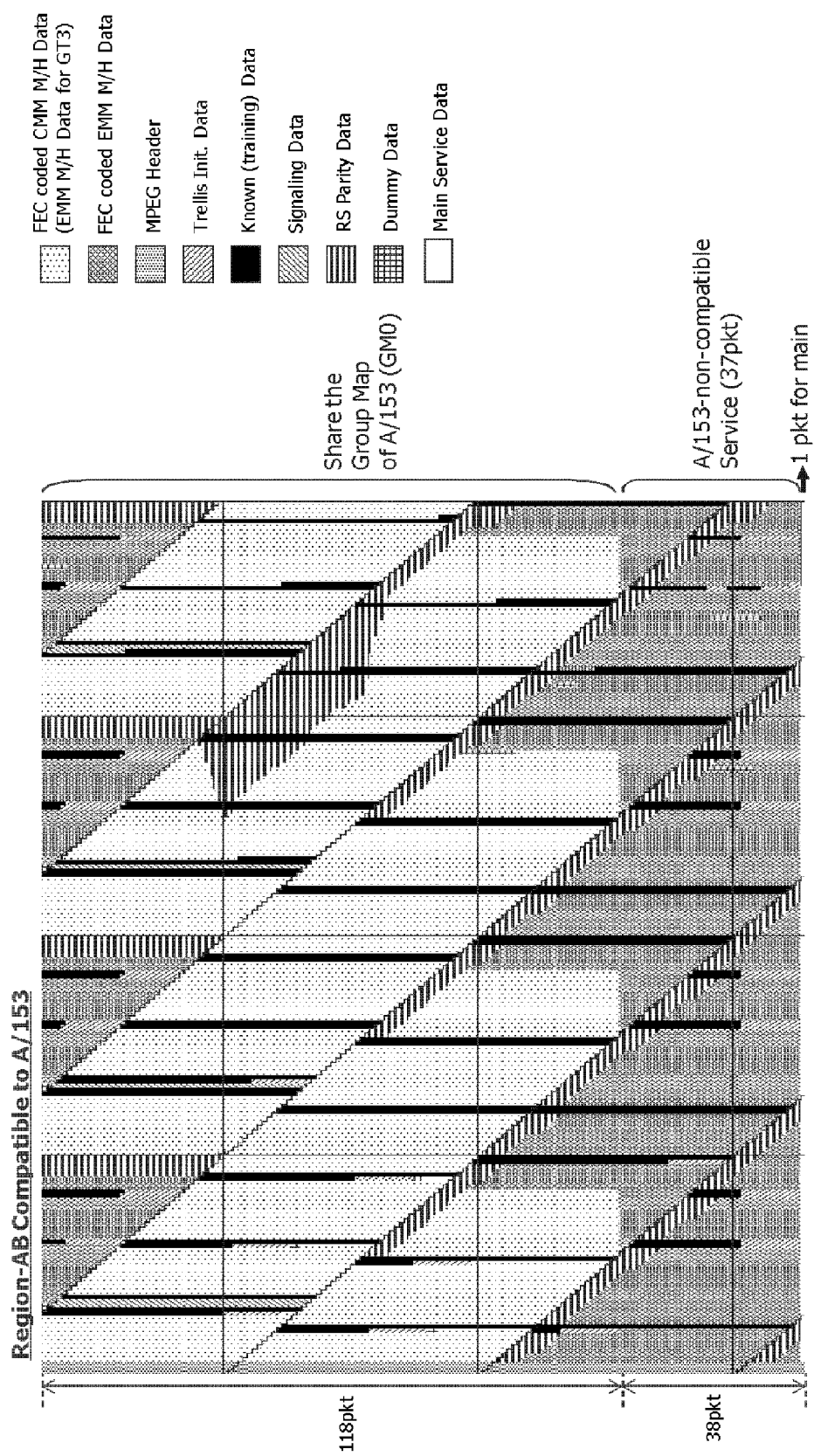
FIG. 29 illustrates group type 2-1 of data group, according to an embodiment of the present invention.

FIG. 29 illustrates group type 2-1 of data group, according to an embodiment of the present invention.

According to FIG. 29, a structure provided before a data group is interleaved, when the data group includes (118+37) mobile service data packets.

Referring to FIG. 29, the data group includes mobile service data of the A and B regions, mobile service data of the C and D regions, mobile service data of the E region, an MPEG header, trellis initialization data, known data, signaling data, RS parity bytes, and dummy data.

As shown in FIG. 29, one main service data packet may be inserted in region E. In the conventional broadcasting system, an error may occur when main data are not received for a long period of time. However, by inserting the main service data packet, as described above, such error may be prevented.

Figure 30:
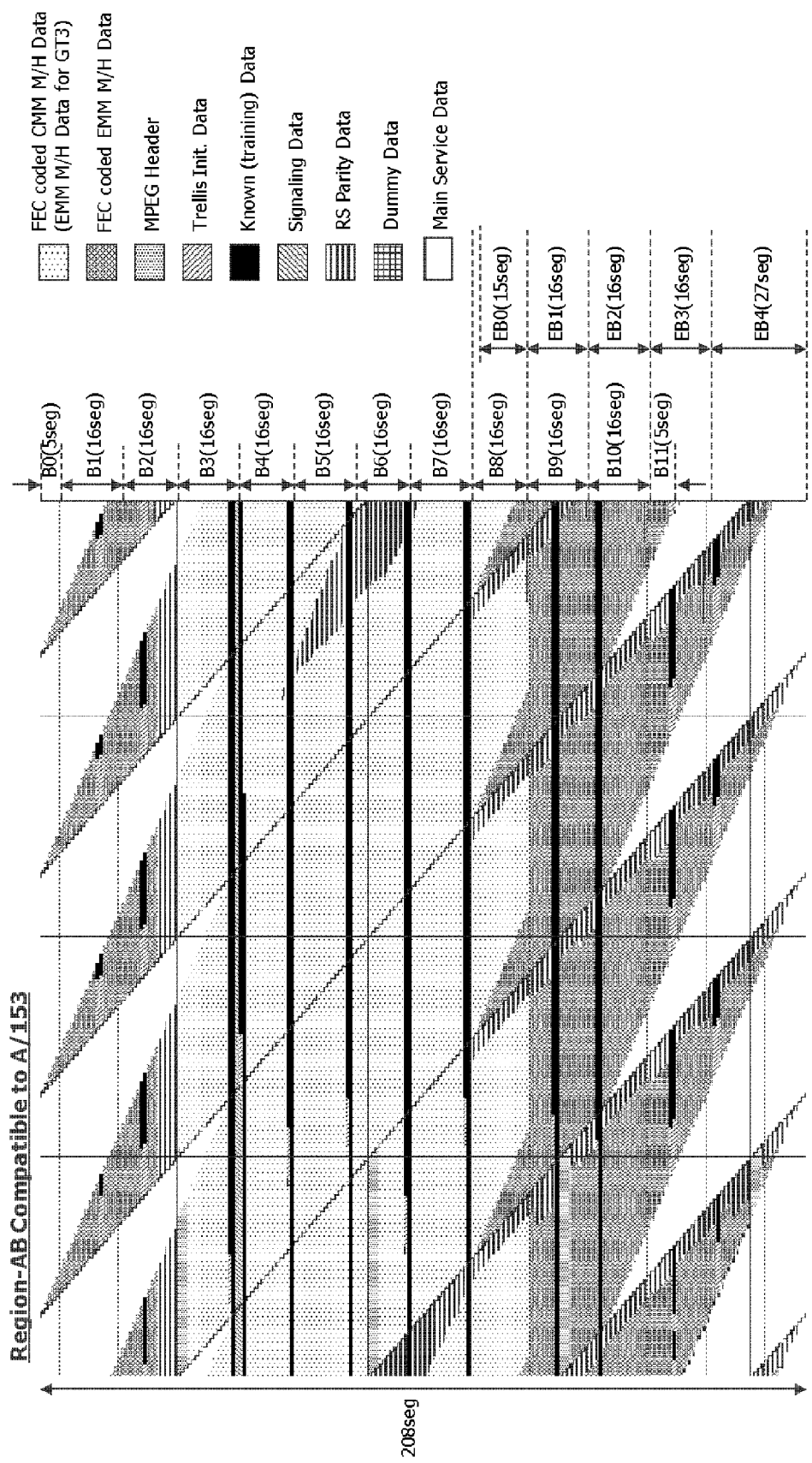
FIG. 30 illustrates a structure provided after a group type 2-1 of data group is interleaved when the data group includes (118+37) mobile service data packets according to an embodiment of the present invention.

FIG. 30 illustrates a structure provided after a group type 2-1 of data group is interleaved when the data group includes (118+37) mobile service data packets according to an embodiment of the present invention.

The structure shown in FIG. 30 is identical to a structure formed after the data group of FIG. 29 is interleaved.

As shown in FIG. 30, RS parity bytes may be inserted in the 5 segments positioned at the lower end of block B2, which is included in the upper portion of the data group. This is because the possibility of the occurrence of mutual interference may be lowered as the insertion position of the RS parity bytes is spaced further apart from the trellis initialization data. However, the insertion position of the RS parity bytes may be varied depending upon the intentions and design of the system designer.

Figure 31:
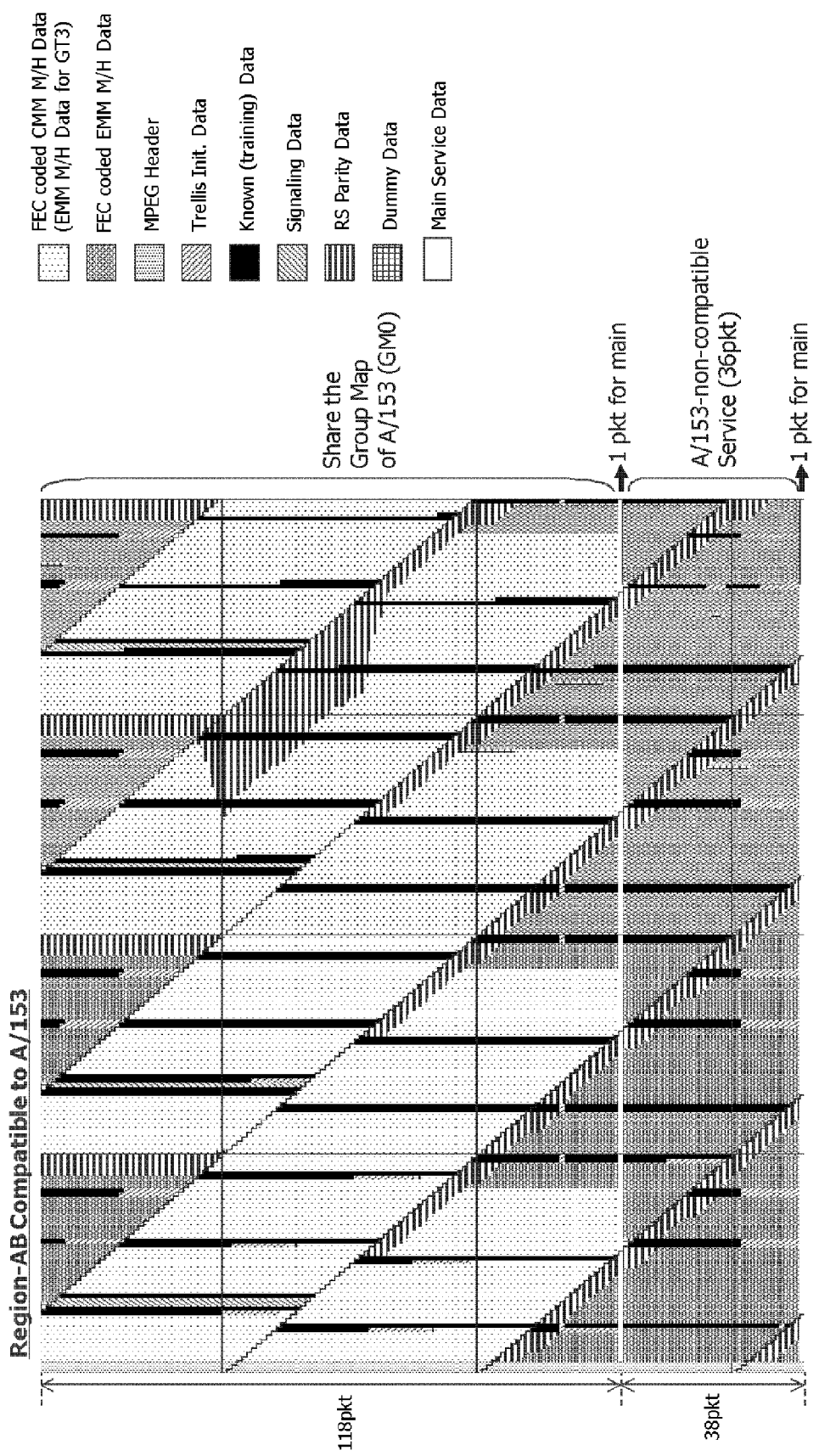
FIG. 31 illustrates group type 2-2 of data group, according to an embodiment of the present invention.

FIG. 31 illustrates group type 2-2 of data group, according to an embodiment of the present invention.

According to FIG. 31, a structure provided before a data group is interleaved, when the data group includes (118+36) mobile service data packets.

Figure 32:
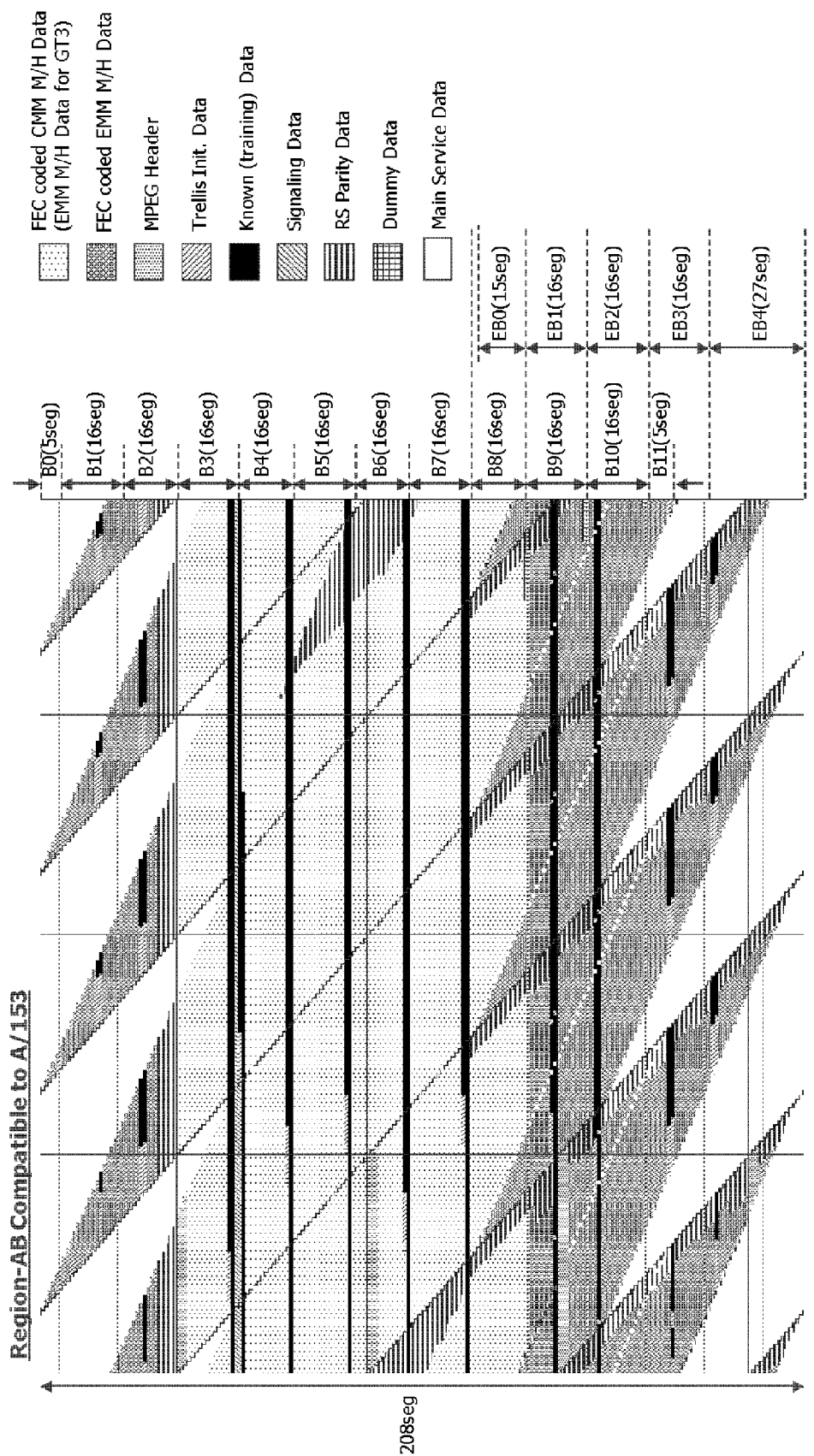
FIG. 32 illustrates a structure provided after a group type 2-2 of data group is interleaved when the data group includes (118+36) mobile service data packets according to an embodiment of the present invention.

FIG. 32 illustrates a structure provided after a group type 2-2 of data group is interleaved when the data group includes (118+36) mobile service data packets according to an embodiment of the present invention.

The structure shown in FIG. 32 is identical to a structure formed after the data group of FIG. 31 is interleaved.

As shown in FIG. 32, RS parity bytes may be inserted in the 5 segments positioned at the lower end of block B2, which is included in the upper portion of the data group. This is because the possibility of the occurrence of mutual interference may be lowered as the insertion position of the RS parity bytes is spaced further apart from the trellis initialization data. However, the insertion position of the RS parity bytes may be varied depending upon the intentions and design of the system designer.

Figure 33:
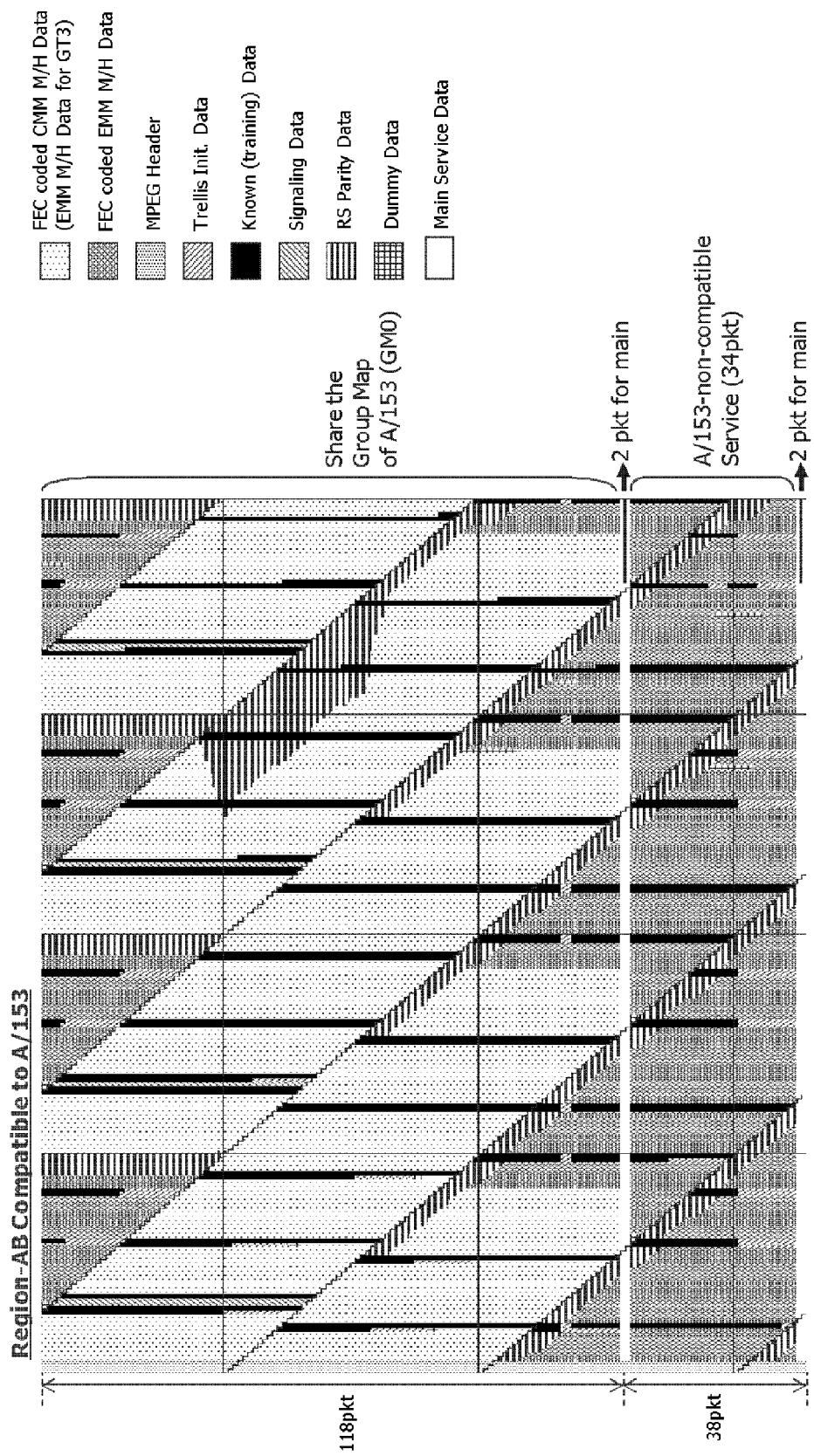
FIG. 33 illustrates group type 2-4 of data group, according to an embodiment of the present invention.

FIG. 33 illustrates group type 2-4 of data group, according to an embodiment of the present invention.

According to FIG. 33, a structure provided before a data group is interleaved, when the data group includes (118+34) mobile service data packets.

Figure 34:
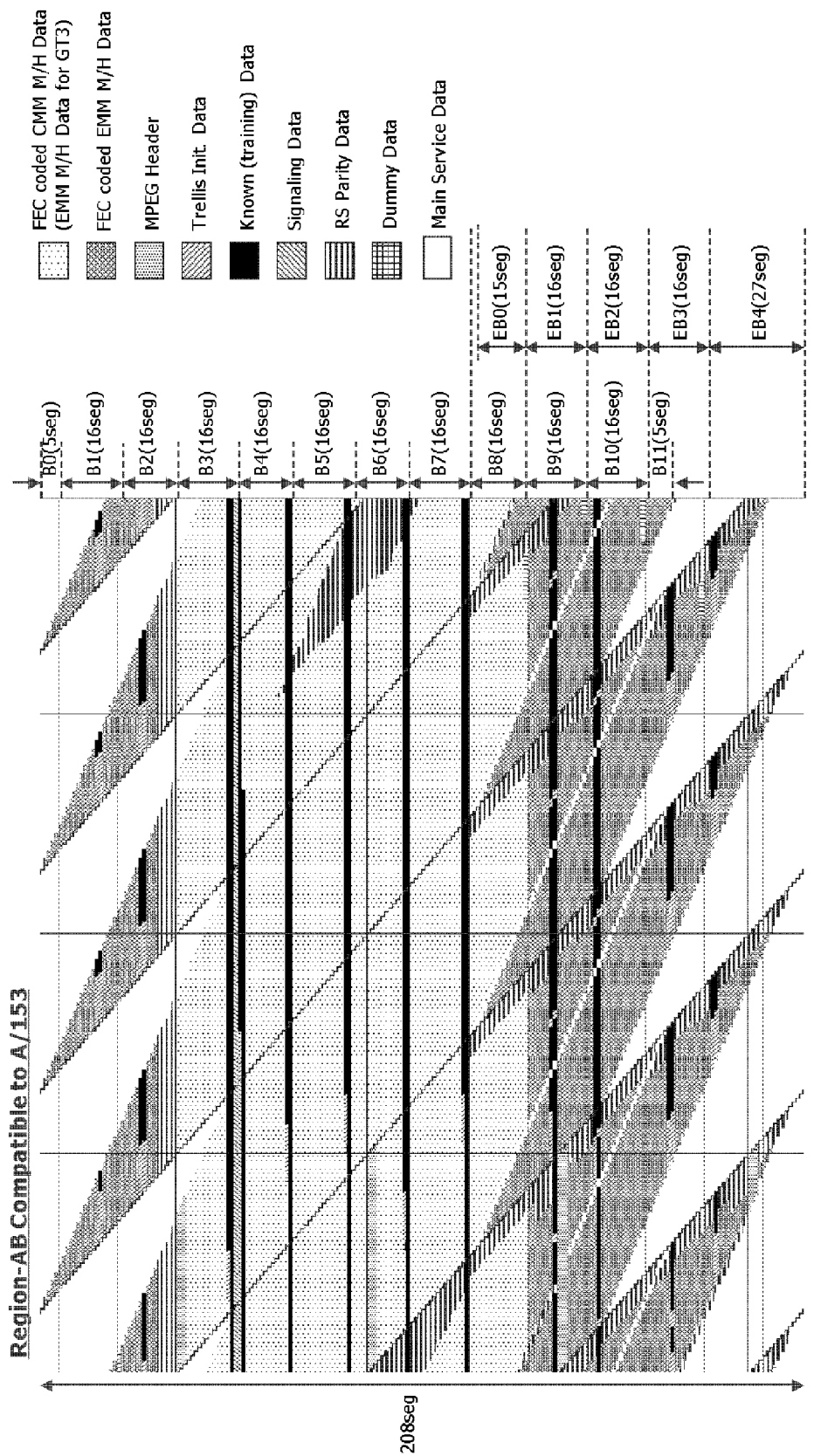
FIG. 34 illustrates a structure provided after a group type 2-4 of data group is interleaved when the data group includes (118+34) mobile service data packets according to an embodiment of the present invention.

FIG. 34 illustrates a structure provided after a group type 2-4 of data group is interleaved when the data group includes (118+34) mobile service data packets according to an embodiment of the present invention.

The structure shown in FIG. 34 is identical to a structure formed after the data group of FIG. 33 is interleaved.

As shown in FIG. 34, RS parity bytes may be inserted in the 5 segments positioned at the lower end of block B2, which is included in the upper portion of the data group. This is because the possibility of the occurrence of mutual interference may be lowered as the insertion position of the RS parity bytes is spaced further apart from the trellis initialization data. However, the insertion position of the RS parity bytes may be varied depending upon the intentions and design of the system designer.

Figure 35:
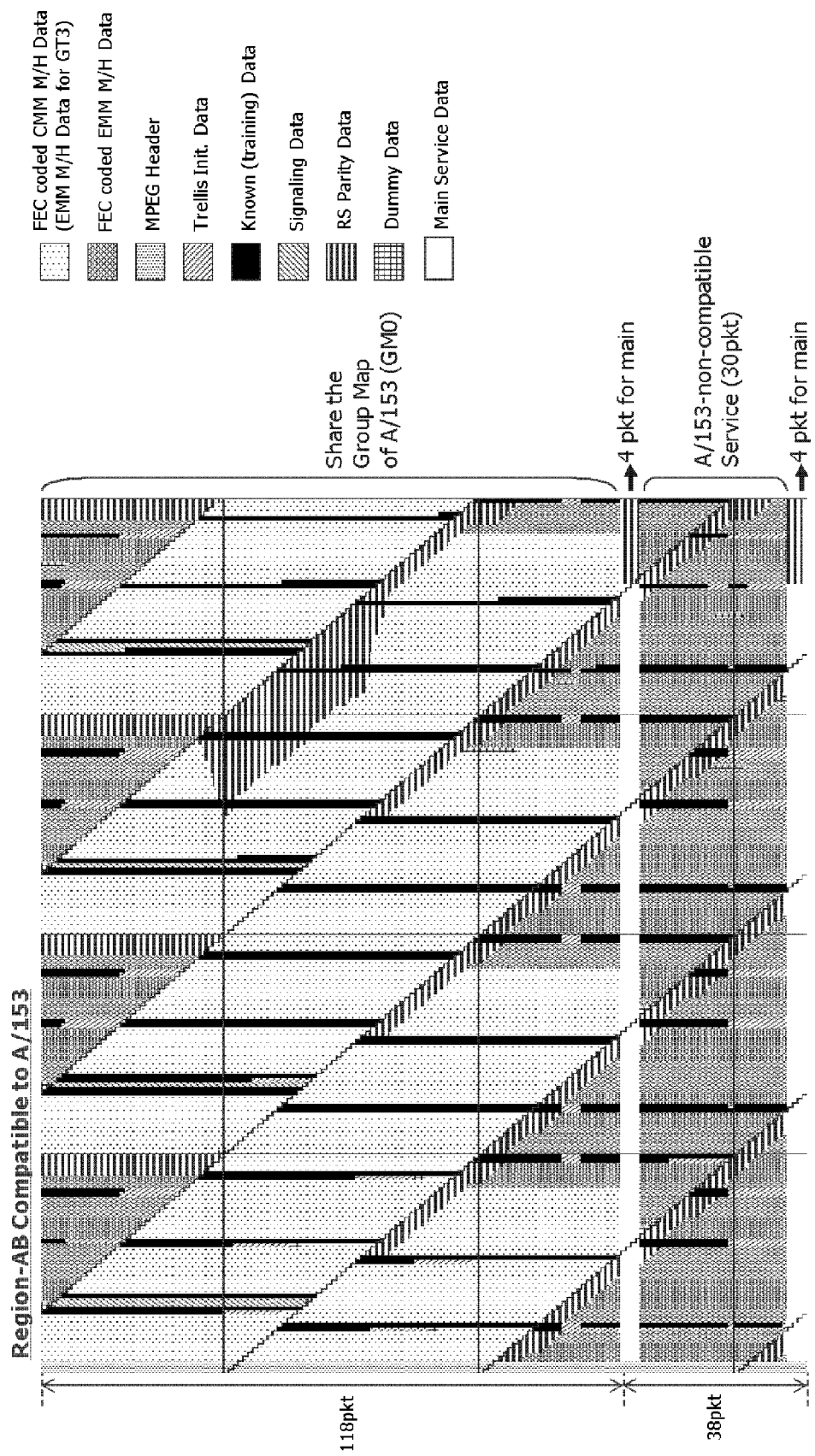
FIG. 35 illustrates group type 2-8 of data group, according to an embodiment of the present invention.

FIG. 35 illustrates group type 2-8 of data group, according to an embodiment of the present invention.

According to FIG. 35, a structure provided before a data group is interleaved, when the data group includes (118+30) mobile service data packets.

Figure 36:
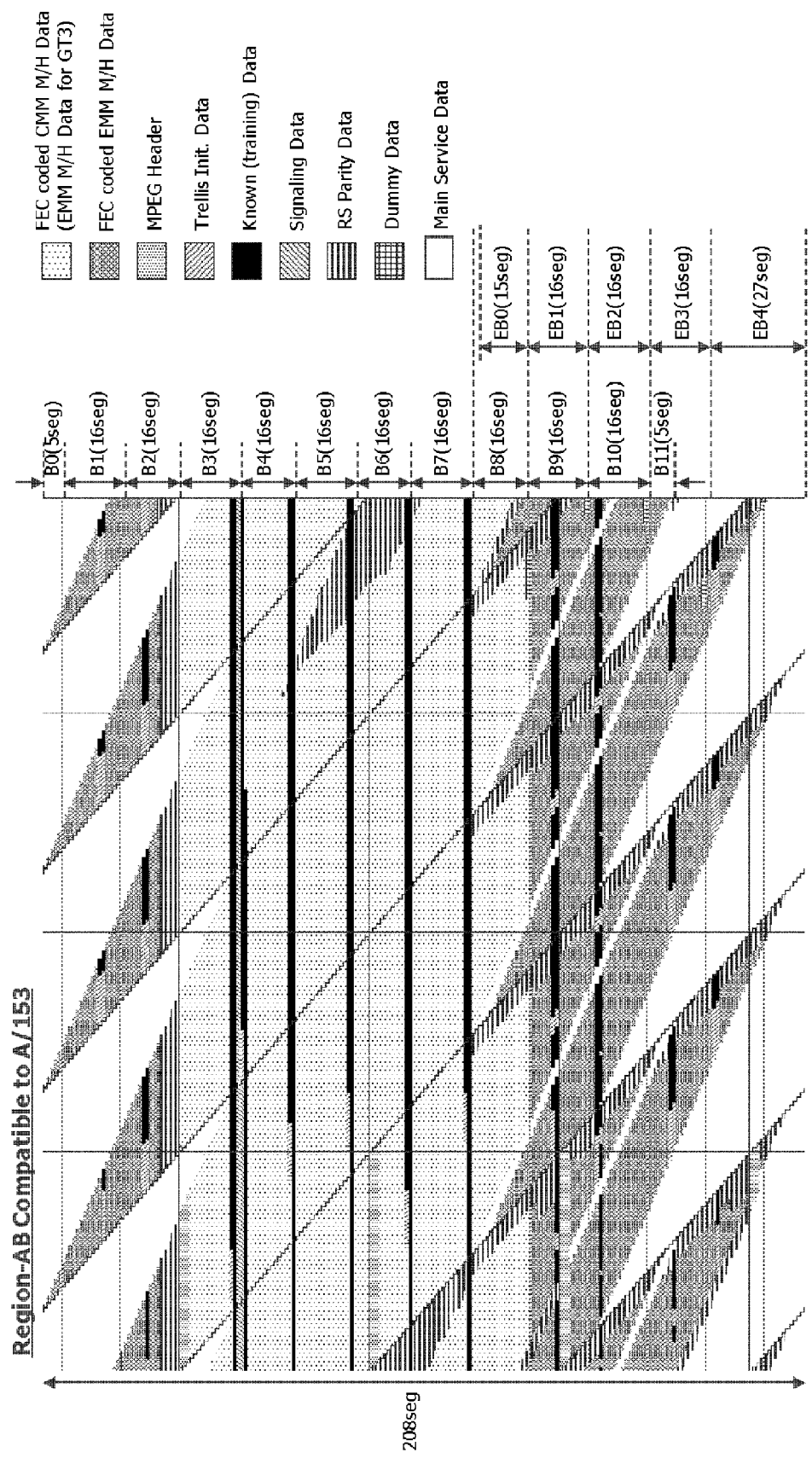
FIG. 36 illustrates a structure provided after a group type 2-9 of data group is interleaved when the data group includes (118+30) mobile service data packets according to an embodiment of the present invention.

FIG. 36 illustrates a structure provided after a group type 2-9 of data group is interleaved when the data group includes (118+30) mobile service data packets according to an embodiment of the present invention.

The structure shown in FIG. 36 is identical to a structure formed after the data group of FIG. 35 is interleaved.

As shown in FIG. 36, RS parity bytes may be inserted in the 5 segments positioned at the lower end of block B2, which is included in the upper portion of the data group. This is because the possibility of the occurrence of mutual interference may be lowered as the insertion position of the RS parity bytes is spaced further apart from the trellis initialization data. However, the insertion position of the RS parity bytes may be varied depending upon the intentions and design of the system designer.

Referring to the data group structure of FIG. 27 to FIG. 36, a group is divided into 12 DATA blocks (MH blocks B0 to B11) for the first mobile mode. Additionally, the group is also divided into 5 extended DATA blocks (MH blocks EB0 to EB4) for the second mobile mode.

At this point, the receiving system for the first mobile mode may receive and process only the data of 6 DATA blocks (MH blocks B3 to B8). And, the receiving system for the second mobile mode may receive all data of the 12 DATA blocks (MH blocks B0 to B11) and all data of the 5 extended DATA blocks (MH blocks EB0 to EB4), so as to process both the mobile data of the first mobile mode and the mobile data of the second mobile mode.

Meanwhile, group type 3 is segmented to 5 group types (group type 3-0, 3-1, 3-2, 3-4, and 3-8), depending upon the number of mobile service data packets of the region E. In the group of group type 3, the primary group division includes regions A, B, C, D, and E, and the secondary group division does not exist. More specifically, according to the embodiment of the present invention, in the primary group division, mobile service data for the second mobile mode are assigned to regions A, B, C, D, and E, and mobile service data of the first mobile mode are not assigned to the primary group division. At this point, the group format of group type 3 is identical to the group format of group type 2. Therefore, reference may be made to the descriptions of FIG. 27 to FIG. 36 for the description of the data groups of each sub group type 3-0, 3-1, 3-2, 3-4, and 3-8 of group type 3. However, the receiving system for the first mobile mode does not process group type 3. And, the receiving system for the second mobile mode may receive and process all data of the 12 DATA blocks (MH blocks B0 to B11) and the 5 extended DATA blocks (MH blocks EB0 to EB4).

Figure 37:
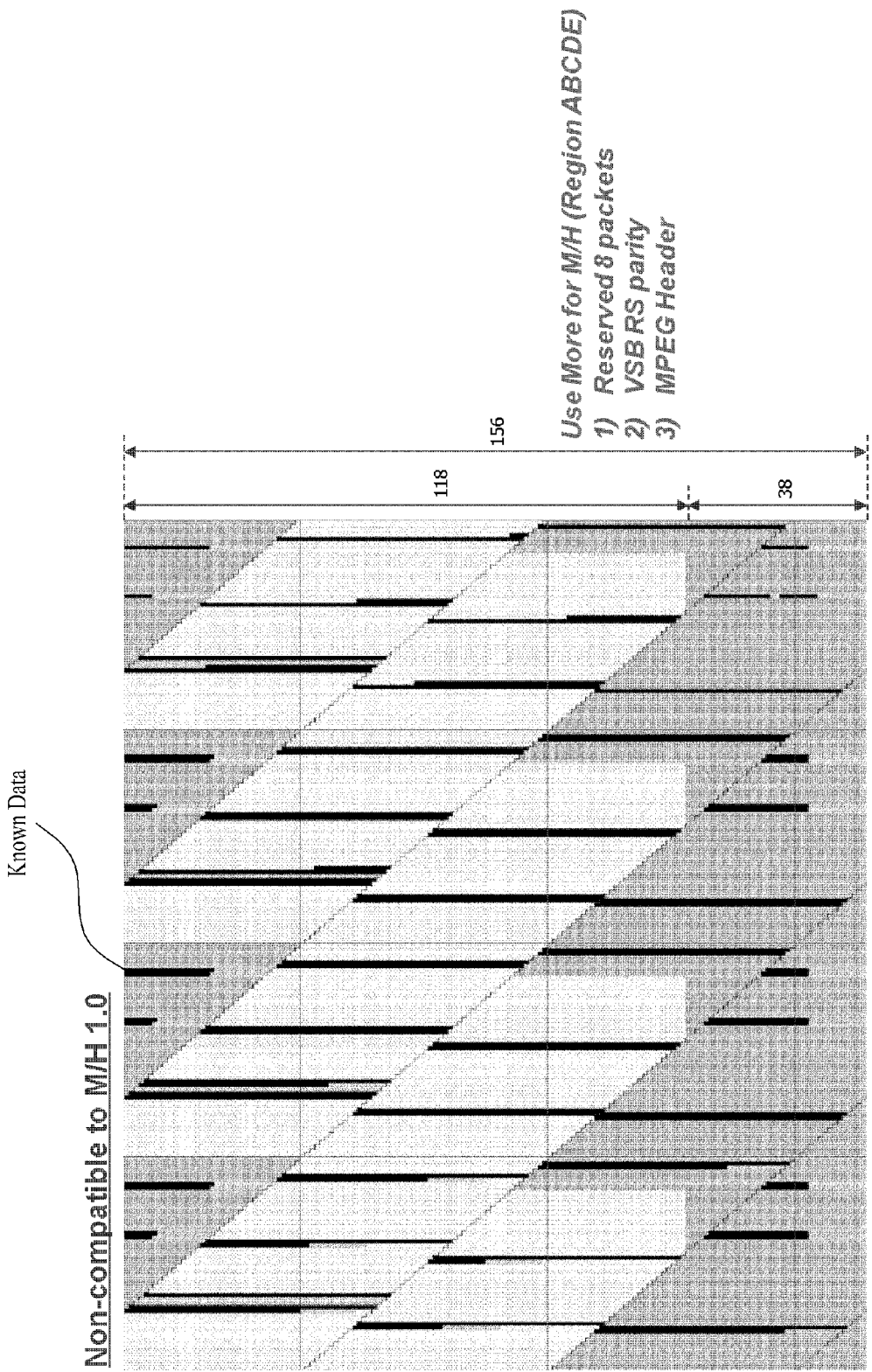
FIG. 37 illustrates group type 4 of data group, according to an embodiment of the present invention.

FIG. 37 illustrates group type 4 of data group, according to an embodiment of the present invention.

According to FIG. 37, a structure provided before a data group is interleaved, when the data group includes (118+38) mobile service data packets.

As for the data group shown in FIG. 37, on the condition that 16 slots contained in one sub-frame transmit a data group including 156 mobile service data packets, the data group of FIG. 37 may represent any one of data group types.

The data group shown in FIG. 37 includes mobile service data of the A and B regions, mobile service data of the C and D regions, mobile service data of the E region, trellis initialization data, known data, signaling data, and dummy data. That is, the data group of FIG. 37 does not include the RS parity and the MPEG header for backward compatibility.

As shown in FIG. 37, the A, B, C, D and E regions do not include the region for the RS parity and the MPEG header. Therefore, the above-mentioned regions can be used to transmit mobile service data, such that much more mobile service data can be transmitted.

Figure 38:
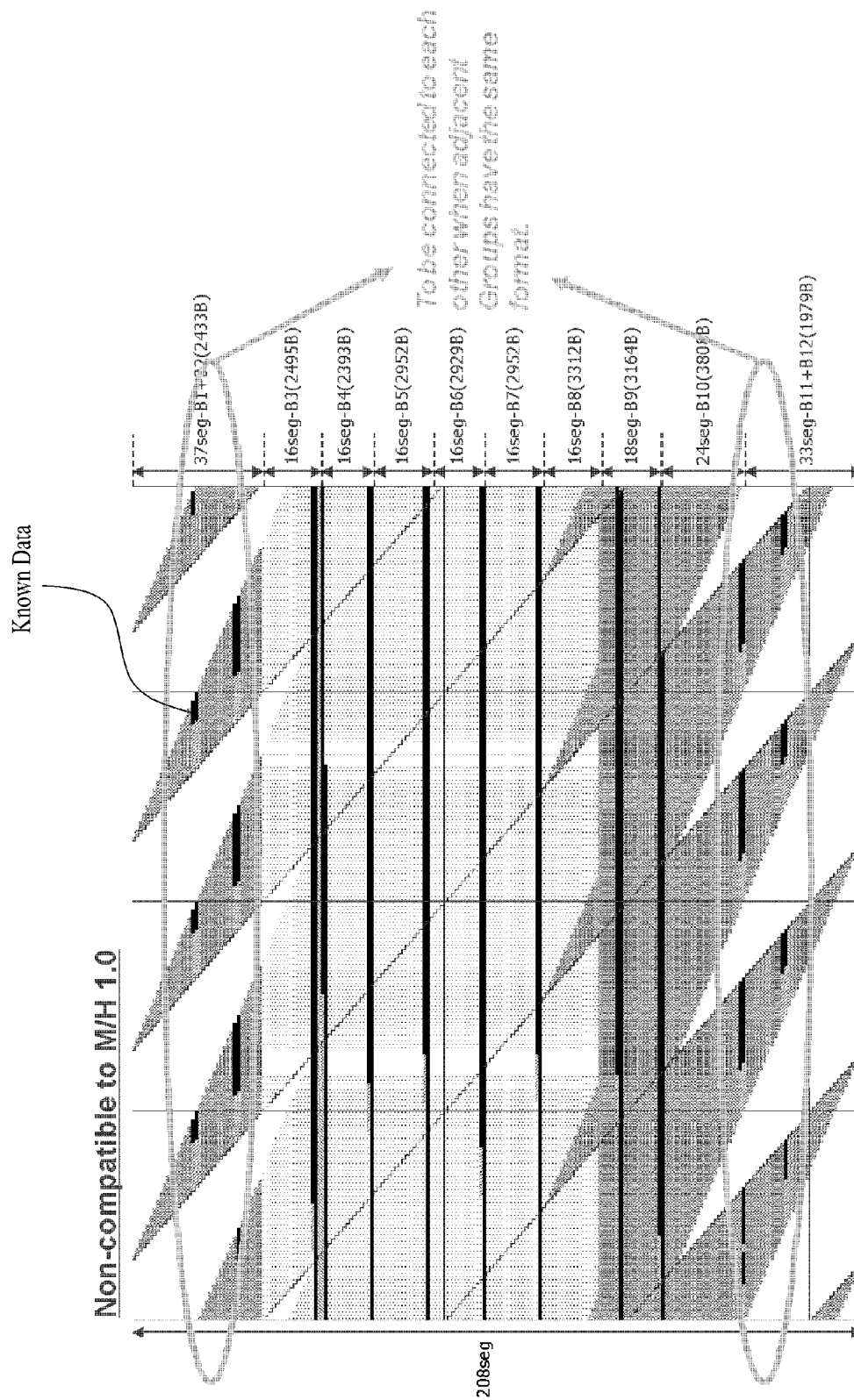
FIG. 38 illustrates a structure provided after a group type 4 of data group is interleaved, when the data group includes (118+38) mobile service data packets, according to an embodiment of the present invention.

FIG. 38 illustrates a structure provided after a group type 4 of data group is interleaved, when the data group includes (118+38) mobile service data packets, according to an embodiment of the present invention.

The structure shown in FIG. 38 is identical to a structure formed after the data group of FIG. 37 is interleaved.

Referring to FIG. 38, additional known data is inserted into the C and D regions in addition to the A and B regions. The data group shown in FIG. 38 is not affected by main service data, such that successive known data sequences can be contained in the C and D regions. Therefore, the reception performance of mobile service data transmitted through the C and D regions at the reception end can be greatly increased.

In addition, first known data present in the E region of the first data group may be connected to second known data present in the upper C and D regions of the second data group that is adjacent to the first data group. In this case, a known data sequence may be assigned to an overall area of the data group. As a result, the reception performance of mobile service data in the case of using the overall area of the group is higher than the reception performance of mobile service data in another case of using a conventional data group.

In accordance with another embodiment of the present invention, when known data of the first data group is connected to known data of the second group that is adjacent to the first data group, known data instead of trellis initialization data inserted in the front end of each known data may be additionally inserted. In this case, the trellis initialization data to be located at the front end of the connected known data sequence should be contained in the data group.

In addition, as shown in FIG. 38, in the A, B, C, D and E regions, mobile service data is inserted into the reserved area for the RS parity and the MPEG header, such that much more mobile service data can be transmitted within one data group.

Figure 39:
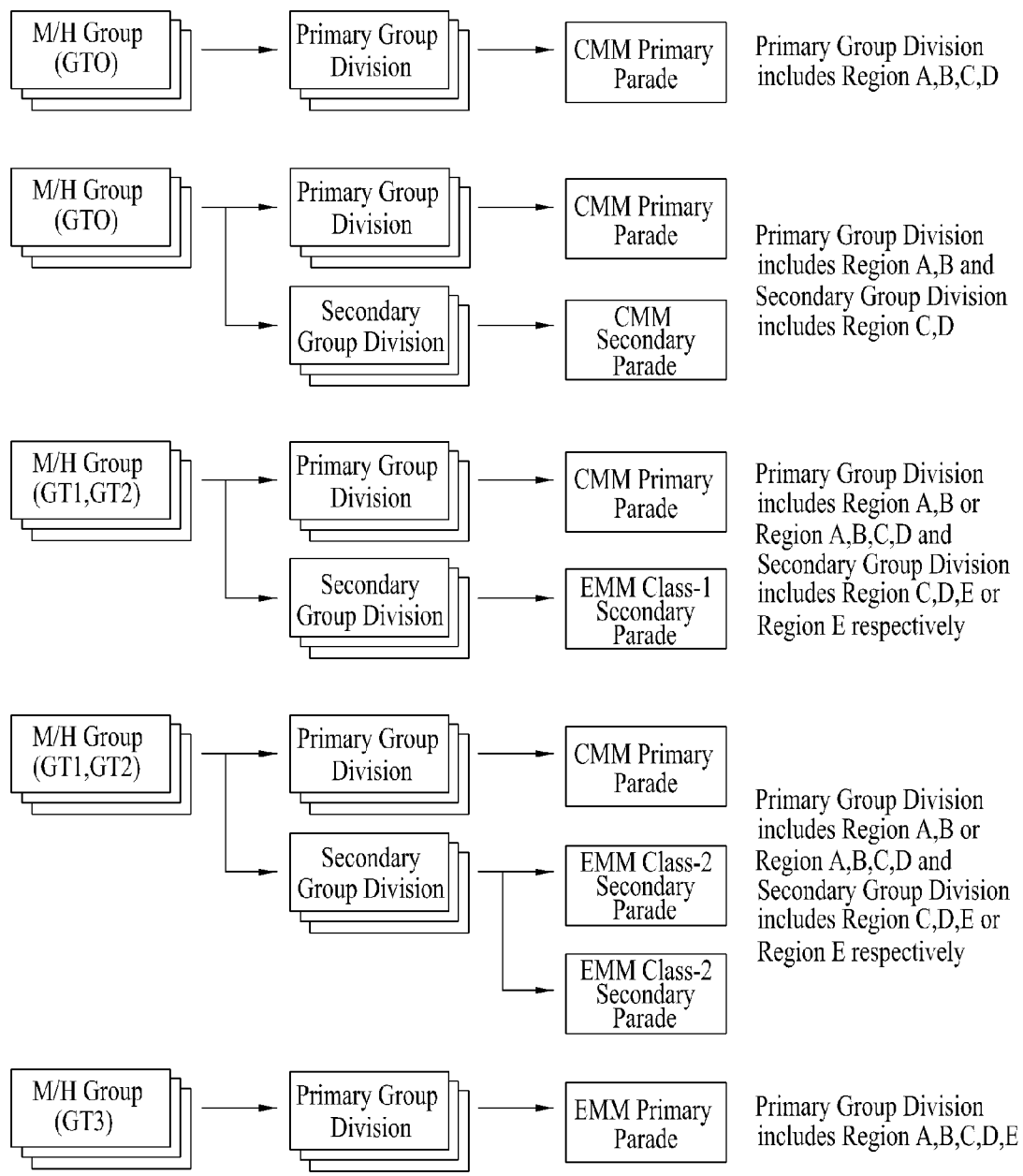
FIG. 39 illustrates a relation between a parade type and a group type according to an embodiment of the present invention.

FIG. 39 illustrates a relation between a parade type and a group type according to an embodiment of the present invention.

An M/H Parade is defined to be a collection of Group Divisions, transmitted through a single M/H Frame. The portion of an M/H Parade within an M/H Subframe shall consist of a collection of Group Divisions, where these Group Divisions belong to consecutively numbered DATA Groups. A Parade consists of Group Divisions from Groups having an identical Group Type.

A random primary parade includes primary group divisions of groups corresponding to group type 1-1. In other words, the data of one parade are assigned and transmitted to group divisions of groups having the same group type. For example, data of a random primary parade are assigned and transmitted to a primary group division of groups having the same group type.

The type of a parade is determined by a group type of a group to which the group division, which is included in the corresponding parade, belongs.

A CMM parade corresponds to a parade that is backward compatible with mobile service data of the first mobile mode or mobile service data of CMM.

A CMM primary parade corresponds to a collection of primary group divisions. And, at this point, each primary group division includes mobile service data backward compatible with the first mobile mode. A CMM secondary parade corresponds to a collection of secondary group divisions. And, at this point, each secondary group division includes mobile service data backward compatible with the first mobile mode.

A primary group division included in the CMM primary parade corresponds to a collection of group regions. And, the structure of the primary group division may vary depending upon the group type. Herein, the primary group division included in the CMM primary parade may include regions A, B, C, and D, or the primary group division included in the CMM primary parade may only include regions A and B.

A secondary group division included in the CMM secondary parade corresponds to a collection of group regions. And, the structure of the secondary group division may vary depending upon the group type. Herein, the secondary group division included in the CMM secondary parade may include regions C, and D.

An EMM parade corresponds to a parade that is backward compatible with mobile service data of the second mobile mode or mobile service data of EMM.

An EMM primary parade corresponds to a collection of primary group divisions. And, at this point, each primary group division includes mobile service data backward compatible with the second mobile mode. An EMM secondary parade corresponds to a collection of secondary group divisions. And, at this point, each secondary group division includes mobile service data backward compatible with the second mobile mode.

A primary group division included in the EMM primary parade corresponds to a collection of group regions. And, the structure of the primary group division may vary depending upon the group type. Herein, the primary group division included in the EMM primary parade may include regions A, B, C, D, and E.

A secondary group division included in the EMM secondary parade corresponds to a collection of group regions. And, the structure of the secondary group division may vary depending upon the group type. Herein, the secondary group division included in the EMM secondary parade may only include region E.

In case a secondary group division does not exist in the group, the CMM secondary parade or the EMM secondary parade does not exist in the corresponding group.

Also, when the EMM secondary parade exists in a group, the primary parade being paired with the EMM secondary parade corresponds to the CMM primary parade. For example, if the EMM secondary parade corresponds to a collection of secondary group divisions including regions C, D, and E, the primary parade being paired with the EMM secondary parade corresponds to a collection of primary group divisions including regions A and B. At this point, the primary parade corresponds to the CMM primary parade.

Also, depending upon its characteristics, the EMM secondary parade may be classified as an EMM Class 1 secondary parade and an EMM Class 2 secondary parade.

The secondary parade according to the embodiment of the present invention is always paired with a primary parade.

And, the secondary group divisions respectively being paired with the primary group divisions are transmitted through the same slots as those of the primary group divisions. Furthermore, the pair of primary parade and secondary parade shares the same parade identifier (parade ID) and the same Number Of Group Division (NOGD). Herein, the NOGD corresponds to the number of group divisions included in one parade within a subframe. Also, the NOGD has the same value as the Number of Group (NOG). Herein, the NOG corresponds to a number of groups being assigned with parades having the same parade ID within a subframe. For example, when the NOGD of a primary parade is equal to 4, the NOGD of the secondary parade should also be equal to 4.

Conversely, the EMM secondary parade may have a different NOGD value from that of its paired CMM primary parade. When the EMM secondary parade has the same NOGD value as its paired CMM parade, the corresponding EMM secondary parade is classified as an EMM Class 1 secondary parade. And, when the EMM secondary parade has a different NOGD value from that of its paired CMM parade, the corresponding EMM secondary parade is classified as an EMM Class 2 secondary parade.

Meanwhile, the NOGD values of the CMM primary parade, the CMM secondary parade, and the EMM primary parade each has the same value as the respective NOG values.

A group of group type 0 may only have a primary group division. And, in this case, the primary group division includes regions A, B, C, and D. Group type 0 may transmit only mobile services of the first mobile mode. Therefore, a CMM primary parade is assigned and transmitted to group type 0 having only the primary group division.

Moreover, a group of group type 0 may also have both a primary group division and a secondary group division. In this case, the primary group division includes regions A and B, and the secondary group division includes regions C and D. Herein, the group of group type 0 may transmit only the mobile services of the first mobile mode. Therefore, a CMM primary parade is assigned and transmitted to the primary group division of the group belonging to group type 0, and a CMM secondary parade is assigned and transmitted to the secondary group division.

A group of group type 1 has both the primary group division and the secondary group division. At this point, the primary group division includes regions A, B, C, and D, and the second group division includes region E. The group of group type 1 transmits mobile services of the first mobile mode to the primary group division and transmits mobile services of the second mobile mode to the secondary group division. Accordingly, a CMM primary parade is assigned and transmitted to the primary group division of the group of group type 1, and an EMM secondary parade is assigned and transmitted to the secondary group division.

A group of group type 2 has both the primary group division and the secondary group division. At this point, the primary group division includes regions A and B, and the second group division includes regions C, D, and E. The group of group type 2 transmits mobile services of the first mobile mode to the primary group division and transmits mobile services of the second mobile mode to the secondary group division. Accordingly, a CMM primary parade is assigned and transmitted to the primary group division of the group of group type 2, and an EMM secondary parade is assigned and transmitted to the secondary group division.

In the group of group type 1 or group type 1, the EMM secondary parade may correspond to the EMM Class 1 secondary parade, or the EMM secondary parade may correspond to the EMM Class 2 secondary parade.

A group of group type 3 only has a primary group division. And, in this case, the primary group division includes regions A, B, C, D, and E. The group of group type 3 may transmit only mobile services of the second mobile mode. Therefore, the EMM primary parade is assigned and transmitted to the group of group type 3, which only has the primary group division.

The EMM secondary parade may have an NOGD value different from that of its paired CMM primary parade. And, in this case, the EMM secondary parade is referred to as the EMM Class 2 secondary parade. When a plurality of primary group divisions is collected (or gathered) and included in a CMM primary parade, secondary group divisions of the same group may be collected (or gathered) and included in one EMM Class 1 secondary parade and may also be included in a plurality of EMM Class 2 secondary parades. Herein, in the example given according to the embodiment of the present invention, the number of EMM Class 2 secondary parades being paired with one CMM primary parade is limited to two EMM Class 2 secondary parades.

At this point, the sum of the NOGD values of two EMM Class 2 secondary parades is equal to the NOGD value of the paired CMM primary parade and also equal to the NOG value of the parades having the same parade identifier (parade ID).

Figure 40:
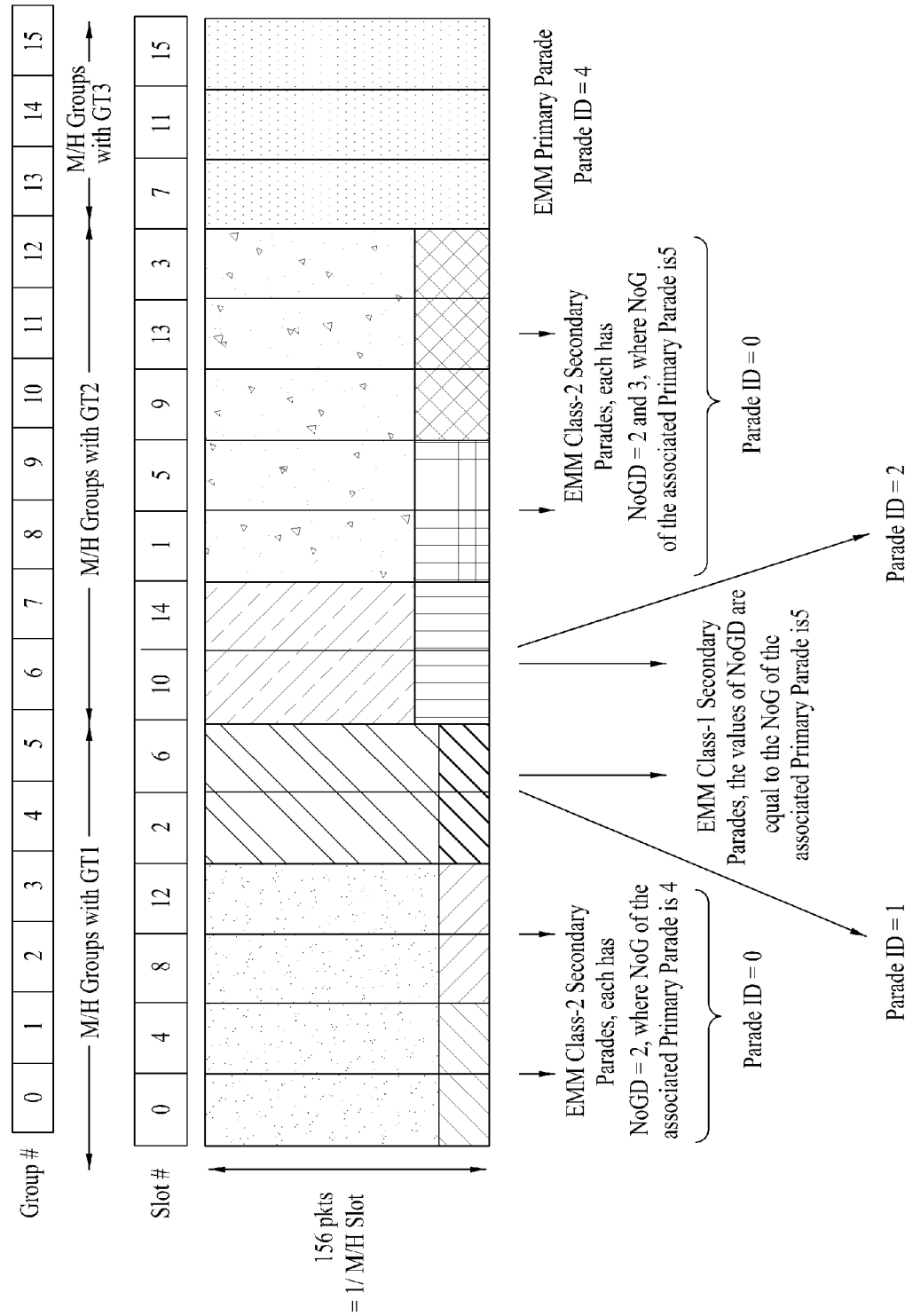
FIG. 40 illustrates an EMM Class 1 secondary parade and an EMM Class 2 secondary parade according to an embodiment of the present invention.

FIG. 40 illustrates an EMM Class 1 secondary parade and an EMM Class 2 secondary parade according to an embodiment of the present invention.

Referring to FIG. 40, each group and each parade are illustrates in accordance with the order of assigned to the respective slot.

As shown in FIG. 40, one primary parade may have one EMM secondary parade, two EMM secondary parades, or no EMM secondary parade depending upon the structure of the corresponding parade or the group type of the corresponding group.

The EMM secondary parade exists only in a group belonging to group type 1 or group type 2. The group of group type 0 includes only the CMM parade, and the group of group type 3 includes only the EMM primary parade.

When the EMM secondary parade has the same NOGD value as that of its paired CMM primary parade, the EMM secondary parade corresponds to an EMM Class 1 secondary parade. Referring to FIG. 40, since the EMM secondary parade of Slot #2 and Slot #6 has the same NOGD value of 2 as that of its paired CMM primary parade, the corresponding EMM secondary parade is referred to as the EMM Class 1 secondary parade. At this point, since the group type is group type 1, the EMM Class 1 secondary parade includes region E. Furthermore, since the EMM secondary parade of Slot #10 and Slot #14 also has the same NOGD value of 2 as that of its paired CMM primary parade, the corresponding EMM secondary parade is also referred to as the EMM Class 1 secondary parade. At this point, since the group type is group type 2, the EMM Class 1 secondary parade includes regions C, D, and E.

When the EMM secondary parade has a different NOGD value from that of its paired CMM primary parade, the corresponding EMM secondary parade is referred to as an EMM Class 2 secondary parade. Referring to FIG. 40, unlike the paired CMM primary parade, the EMM secondary parades of Slot #0, Slot #4, Slot #8, and Slot #12 are divided into two EMM secondary parades each having the NOGD value of 2. And, each of the corresponding EMM secondary parades is referred to as an EMM Class 2 secondary parade. The sum of the NOGD values of the EMM secondary parades is equal to 4, and this value is identical to the NOGD value of the CMM primary parade. At this point, since the group type is group type 1, the EMM Class 2 secondary parade includes region E. Furthermore, unlike the paired CMM primary parade, the EMM secondary parades of Slot #1, Slot #5, Slot #9, Slot #13, and Slot #3 are divided into two EMM secondary parades respectively having the NOGD value of 2 and the NOGD value of 3. And, each of the corresponding EMM secondary parades is referred to as an EMM Class 2 secondary parade. The sum of the NOGD values of the EMM secondary parades is equal to 5, and this value is identical to the NOGD value of the CMM primary parade. At this point, since the group type is group type 2, the EMM Class 2 secondary parade includes region C, D, and E.

As shown in FIG. 40, the data groups may be assigned to each slot in accordance with the above-described Equation 1. At this point, groups respective to parades having one parade identifier may be assigned to one subframe, or groups respective to parades having a plurality of parade identifiers may be assigned to one subframe.

A CMM primary parade having Parade ID #0 and two EMM Class 2 secondary parades respectively have group numbers 0 to 3 (i.e., group #0 to group #3) and are assigned to Slot #0, Slot #4, Slot #8, and Slot #12 in accordance with Equation 1.

A CMM primary parade having Parade ID #1 and an EMM Class 1 secondary parade respectively have group numbers 4 and 5 (i.e., group #4 and group #5) and are assigned to Slot #2 and Slot #6 in accordance with Equation 1.

A CMM primary parade having Parade ID #2 and an EMM Class 1 secondary parade respectively have group numbers 6 and 7 (i.e., group #6 and group #7) and are assigned to Slot #10 and Slot #14 in accordance with Equation 1.

A CMM primary parade having Parade ID #3 and two EMM Class 2 secondary parades respectively have group numbers 8 to 12 (i.e., group #8 to group #12) and are assigned to Slot #1, Slot #5, Slot #9, Slot #13, and Slot #3 in accordance with Equation 1.

An EMM primary parade having Parade ID #4 has group numbers 13 to 15 (i.e., group #13 to group #15) and is assigned to Slot #7, Slot #11, and Slot #15 in accordance with Equation 1.

Although group numbers are given in accordance with the order of the parade identifiers and in accordance with the order of the group types, and although the slots are assigned in accordance with such given group numbers, this is merely exemplary, and, therefore, the group numbers may also be separately assigned without referring to the order of the parade identifiers or the group type of the groups. Nevertheless, parades having the same parade identifier should be assigned with consecutive group numbers, and each of the EMM Class 2 secondary parades should be assigned with consecutive group numbers. For example, in case of the parade having the parade identifier Parade ID #3, as shown in FIG. 32-1, should be assigned with consecutive group numbers from #8 to #12. And, each of the EMM Class 2 secondary parades should be respectively assigned with consecutive group numbers #8 and #9 and consecutive group number #10 to #12.

When parades having the same parade identifiers include the EMM Class 2 secondary parades, the EMM Class 2 secondary parade having the smaller group number is referred to as the first ($1^{st}$) EMM Class 2 secondary parade, and the EMM Class 2 secondary parade having the greater group number is referred to as the second ($2^{nd}$) EMM Class 2 secondary parade.

One RS frame payload is RS-CRC encoded so as to become an RS frame. Also, one RS frame is transmitted through one parade or two parades within a single M/H frame.

The CMM primary RS frame payload (ensemble) is RS-CRC encoded to a CMM primary RS frame, thereby being transmitted through a CMM primary parade. Similarly, the CMM secondary RS frame payload (ensemble) is RS-CRC encoded to a CMM secondary RS frame, thereby being transmitted through a CMM secondary parade.

The EMM primary RS frame payload (ensemble) is RS-CRC encoded to an EMM primary RS frame, thereby being transmitted through an EMM primary parade. Similarly, the EMM Class 1 secondary RS frame payload (ensemble) is RS-CRC encoded to an EMM Class 1 secondary RS frame, thereby being transmitted through an EMM Class 1 secondary parade. And, the EMM Class 2 secondary RS frame payload (ensemble) is RS-CRC encoded to an EMM Class 2 secondary RS frame, thereby being transmitted through an EMM Class 2 secondary parade.

The super RS frame payload (ensemble) is RS-CRC encoded to a super RS frame, thereby being transmitted through two random parades. At this point, since the super RS frame payload (ensemble) cannot be received by a receiver of the first mobile mode, the super RS frame payload (ensemble) is transmitted through two EMM parades.

The super RS frame payload (ensemble) may be transmitted through an EMM primary parade and another EMM primary parade. Also, super RS frame payload (ensemble) may be transmitted through an EMM primary parade and an EMM Class 1 secondary parade or an EMM Class 2 secondary parade. Alternatively, the super RS frame payload (ensemble) may be transmitted through an EMM Class 1 secondary parade and another EMM Class 1 secondary parade, and the super RS frame payload (ensemble) may also be transmitted through an EMM Class 1 secondary parade and an EMM Class 2 secondary parade. Furthermore, the super RS frame payload (ensemble) may be transmitted through an EMM Class 2 secondary parade and another EMM Class 2 secondary parade.

At this point, the two parades through which the super ensemble is transmitted, each has a different parade identifier.

Figure 41:
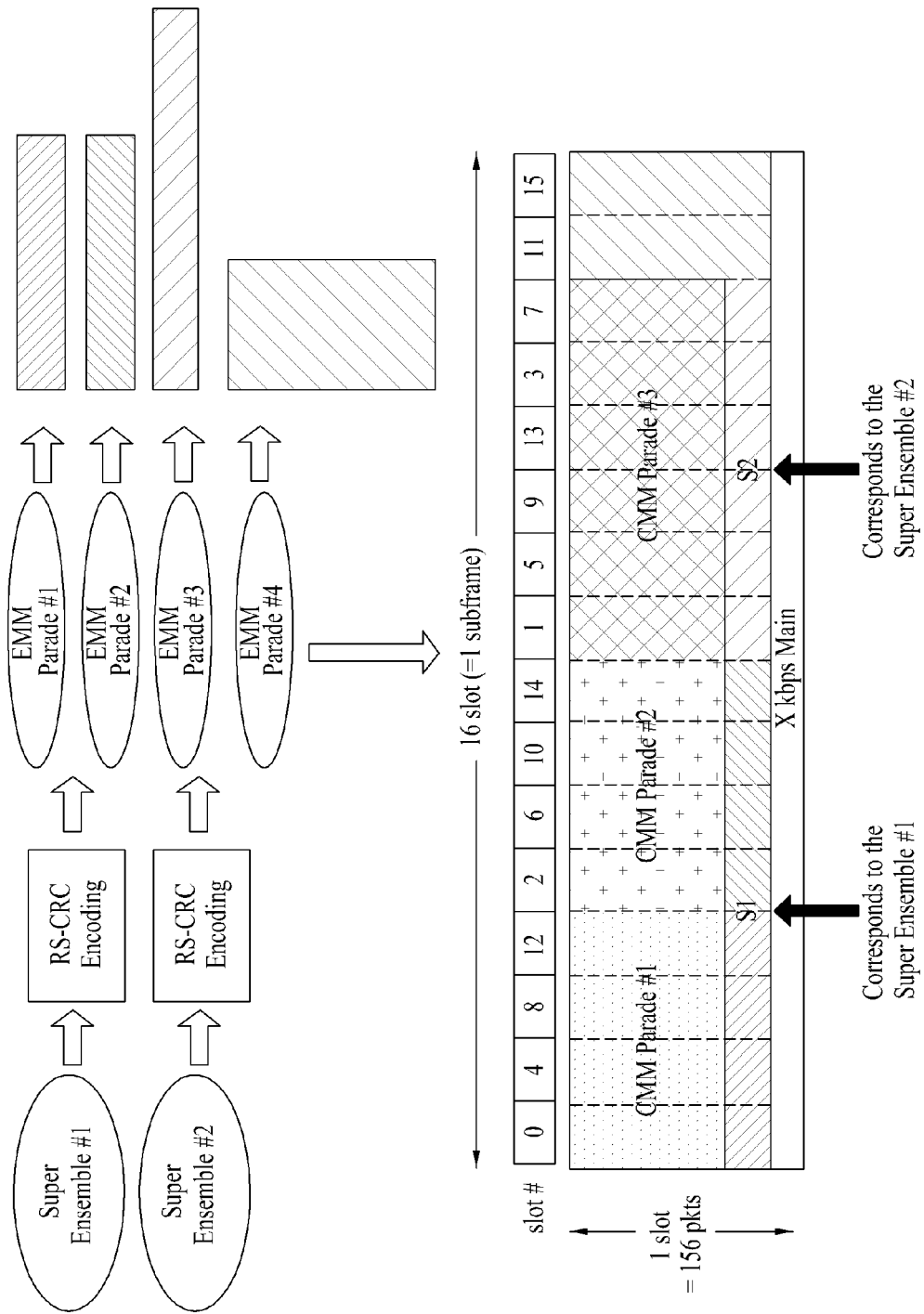
FIG. 41 illustrates the relation between a super ensemble, a super RS frame, and a parade according to an embodiment of the present invention.

FIG. 41 illustrates the relation between a super ensemble, a super RS frame, and a parade according to an embodiment of the present invention.

Super ensemble #1 is RS-CRC encoded so as to form Super RS frame #1. Herein, super RS frame #1 is transmitted through Parade #1 and Parade #2. Also, Super ensemble #2 is RS-CRC encoded so as to form Super RS frame #2. Herein, super RS frame #2 is transmitted through Parade #3 and Parade #4. One super ensemble and super RS frame may be transmitted to parades of the same type, such as Parade #1 and Parade #2. Also, the super ensemble and super RS frame may be transmitted to parades belonging to different parade types, such as Parade #3 and Parade #4.

Figure 42:
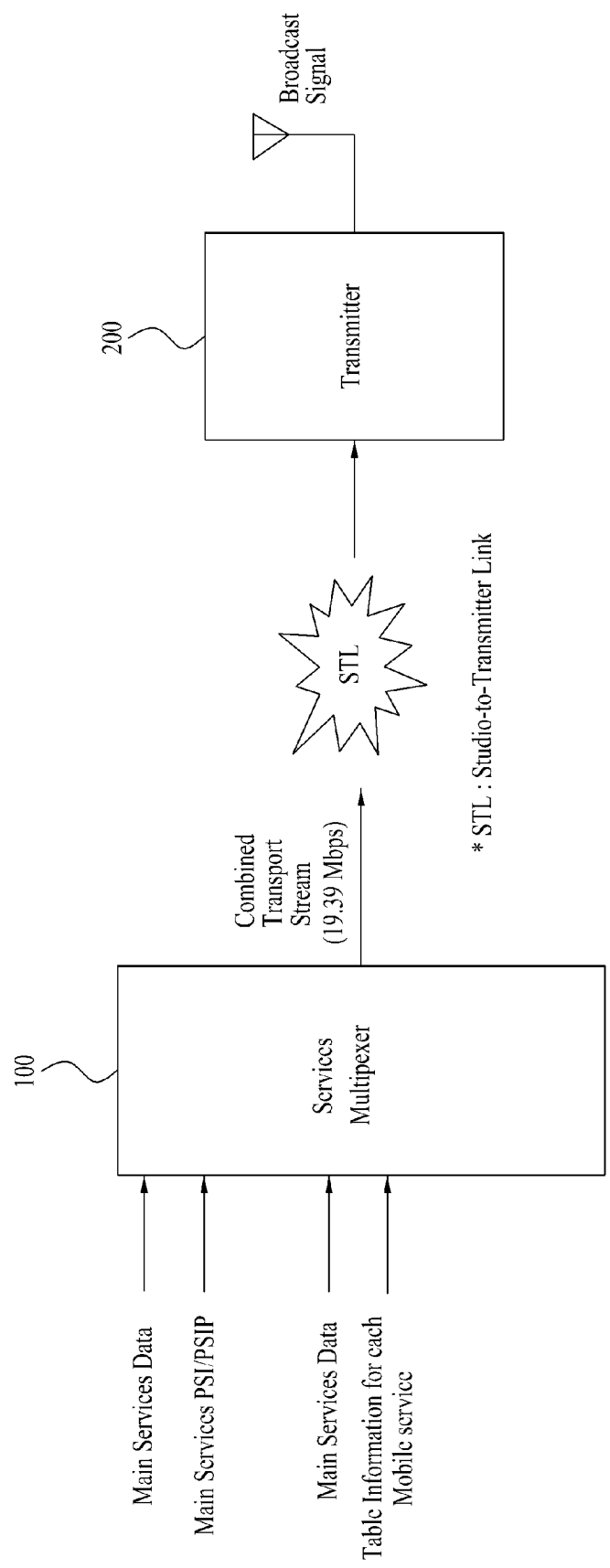
FIG. 42 illustrates a block diagram showing a general structure of a digital broadcast transmitting system according to an embodiment of the present invention.

FIG. 42 illustrates a block diagram showing a general structure of a digital broadcast transmitting system according to an embodiment of the present invention.

Herein, the digital broadcast transmitting includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. This corresponds to data transmission using Single Frequency Network (SFN). Accordingly, in the receiving system, a channel equalizer may compensate signal distortion, which is caused by a reflected wave, so as to recover the original signal. In another example, the plurality of transmitters may have different frequencies with respect to the same channel. This corresponds to data transmission using Multi Frequency Network (MFN).

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8VSB mode, the output data rate is 19.39 Mbps, and, in case of the 16VSB mode, the output data rate is 38.78 Mbps. Furthermore, in the conventional 8VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of main service data and table information (e.g., PSI/PSIP table data) for each main service and encapsulates the received data into a transport stream (TS) packet.

Also, according to an embodiment of the present invention, the service multiplexer 100 receives at least one type of mobile service data and table information (e.g., PSI/PSIP table data) for each mobile service and encapsulates the received data into a transport stream (TS) packet.

The mobile service data being inputted to the service multiplexer 100 may correspond to mobile service data of the first mobile mode or may correspond to mobile service data of the second mobile mode. Also, the TS packet of the mobile service data of the first mobile mode will be referred to as a mobile service data packet of the first mobile mode, and the TS packet of the mobile service data of the second mobile mode will be referred to as a mobile service data packet of the second mobile mode.

The service multiplexer 100 multiplexes the encapsulated TS packets in accordance with a predetermined multiplexing rule, thereby outputting the multiplexed TS packets to the transmitter 200.

Figure 43:
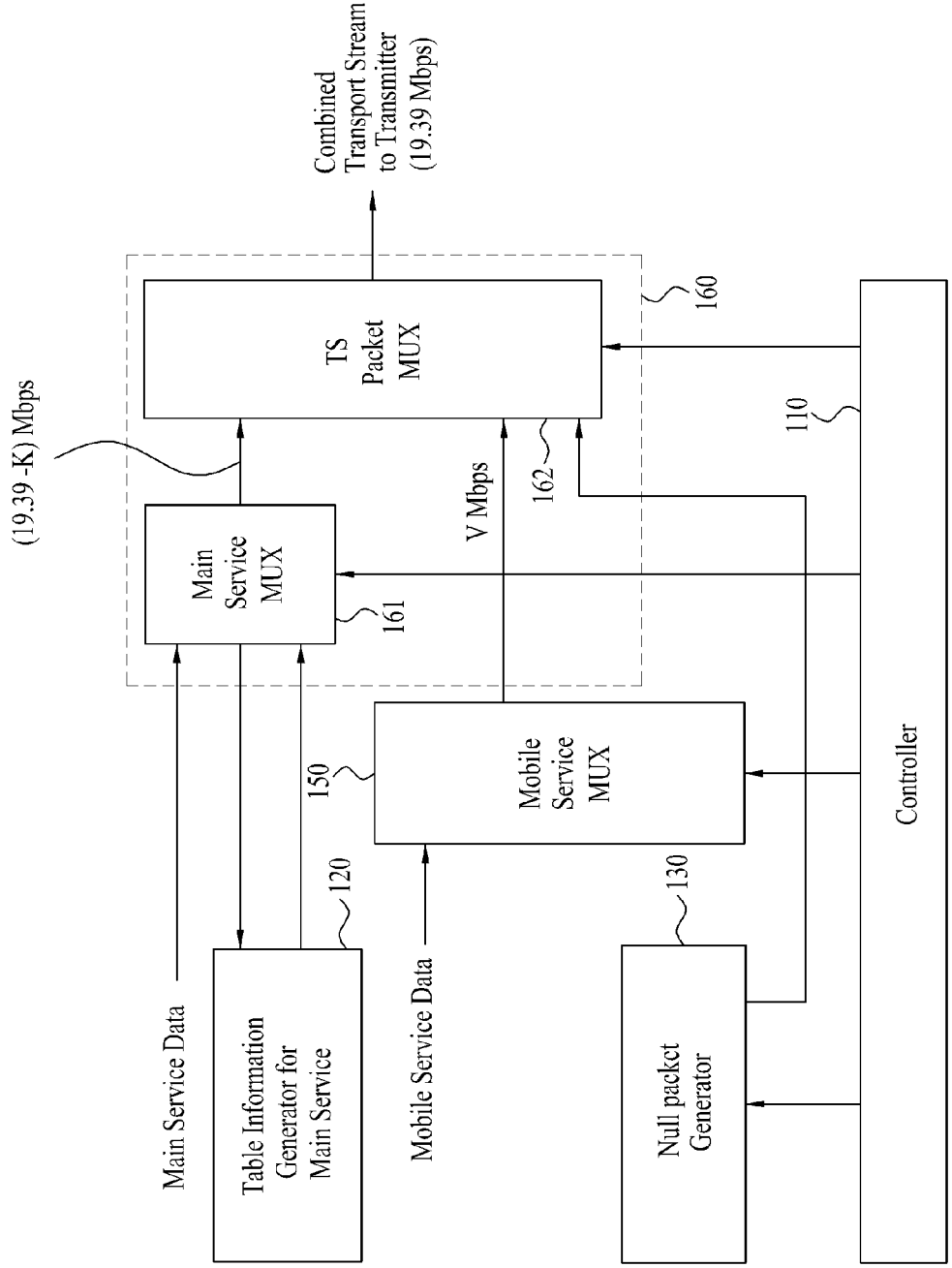
FIG. 43 illustrates a block diagram showing an example of the service multiplexer.

FIG. 43 illustrates a block diagram showing an example of the service multiplexer.

The service multiplexer includes a controller 110 for controlling the overall operations of the service multiplexer, a table information generator 120 for the main service, a null packet generator 130, an OM packet encapsulator 140, a mobile service multiplexer 150, and a transport multiplexer 160.

The transport multiplexer 160 may include a main service multiplexer 161 and a transport stream (TS) packet multiplexer 162.

Referring to FIG. 43, at least one type of compression-encoded main service data and table data generated from the table information generator 120 for the main services are inputted to the main service multiplexer 161 of the transport multiplexer 160. According to the embodiment of the present invention, the table information generator 120 generates PSI/PSIP table data, which is configured in the form of an MPEG-2 private section.

The main service multiplexer 161 respectively encapsulates each of the main service data and the PSI/PSIP table data, which are being inputted, to MPEG-2 TS packet formats, thereby multiplexing the encapsulated TS packets and outputting the multiplexed packets to the TS packet multiplexer 162. Herein, the data packet being outputted from the main service multiplexer 161 will hereinafter be referred to as a main service data packet for simplicity.

The mobile service multiplexer 150 receives and respectively encapsulates at least one type of compression-encoded mobile service data and the table information (e.g., PSI/PSIP table data) for mobile services to MPEG-2 TS packet formats. Then, the mobile service multiplexer 150 multiplexes the encapsulated TS packets, thereby outputting the multiplexed packets to the TS packet multiplexer 162. Hereinafter, the data packet being outputted from the mobile service multiplexer 150 will be referred to as a mobile service data packet for simplicity.

At this point, the mobile service data being inputted to the mobile service multiplexer 150 may correspond to mobile service data of the first mobile mode or may correspond to mobile service data of the second mobile mode. Also, the mobile service data of the first mobile mode and the mobile service data of the second mobile mode may both be simultaneously inputted to the mobile service multiplexer 150. Also, a TS packet of mobile service data of the first mobile mode is referred to as a mobile service data packet of the first mobile mode, and a TS packet of mobile service data of the second mobile mode is referred to as a mobile service data packet of the first mobile mode, for simplicity.

At this point, in order to have the transmitter 200 identify and process the main service data packet, the mobile service data of the first mobile mode, and the mobile service data packet of the second mobile mode, identification information is required. A value pre-decided based upon an agreement between the transmitting system and the receiving system may be used as the identification information, or the identification information may include separate data, or a value of a predetermined position within the corresponding data packet may be modified and used as the identification information.

According to an embodiment of the present invention, different packet identifiers (PIDs) may be assigned to each of the main service data packet, the mobile service data packet of the first mobile mode, and the mobile service data packet of the second mobile mode, so as to identify the main service data packet, the mobile service data packet of the first mobile mode, and the mobile service data packet of the second mobile mode. More specifically, by assigning a PID that is not used for a main service (or a null PID) to a mobile service, the transmitter 200 may refer to the PID of the data packet that is being inputted, thereby being capable of identifying the main service data packet, the mobile service data packet of the first mobile mode, and the mobile service data packet of the second mobile mode.

The TS packet multiplexer 162 of the transport multiplexer 160 multiplexes the main service data packet being outputted from the main service multiplexer 161 with the mobile service data packet of the first mobile mode and/or the second mobile mode being outputted from the mobile service multiplexer 150. Then, the TS packet multiplexer 162 transmits the multiplexed data packets to the transmitter 200. If there are no main service data being outputted from the main service multiplexer 161, only the mobile service data packets being outputted from the mobile service multiplexer 150 are transmitted to the transmitter 200.

At this point, the output data rate of the TS packet multiplexer 162 included in the transport multiplexer 160 does not reach 19.39 Mbps. This is because, in case of the mobile service data, additional encoding is performed on the mobile service data by a pre-processor of the transmitter 200, thereby increasing the data size.

For example, since the pre-processor of the transmitter performs an encoding process on the mobile service data at a coding rate of ½ or lower, the amount (or size) of the data being outputted from the pre-processor becomes two times larger than the inputted data or more. Therefore, the sum of the data rate of the main service data being multiplexed by the service multiplexer 100 and the data rate of the mobile service data is always equal to or less than 19.39 Mbps.

The service multiplexer 100 according to the embodiment of the present invention may perform diverse exemplary embodiments in order to match the final output data rate of the TS Packet multiplexer 162 to 19.39 Mbps.

For example, a null packet generator 130 generates a null data packet and outputs the generated null data packet to the TS packet multiplexer 162. And, the TS Packet multiplexer 162 multiplexes the null data packet, the mobile service data packet, and the main service data packet, so as to match the output data rate to 19.39 Mbps. If there is no main service data packet being outputted from the main service multiplexer 161, the TS Packet multiplexer 162 multiplexes the null data packet with the mobile service data packet, so as to match the output data rate to 19.39 Mbps.

At this point, the null data packet is transmitted to the transmitter 200, thereby being discarded. More specifically, the null data packet is not transmitted to the receiving system. In order to do so, identification information for identifying the null data is also required. Herein, the identification information for identifying the null data may also use a value pre-decided based upon an agreement between the transmitting system and the receiving system and may also be configured of a separate set of data. And, the identification information for identifying the null data may also change a predetermined position value within the null data packet and use the changed value. For example, the null packet generator 130 may modify (or change) a synchronization byte value within the header of the null data packet, thereby using the changed value as the identification information. Alternatively, the transport_error_indicator flag may be set to '1', thereby being used as the identification information. According to the embodiment of the present invention, the transport_error_indicator flag within the header of the null data packet is used as the identification information for identifying the null data packet. In this case, the transport_error_indicator flag of the null data packet is set to '1', and the transport_error_indicator flag for each of the other remaining data packets is reset to '0', so that the null data packet can be identified (or distinguished).

More specifically, when the null packet generator 130 generated a null data packet, and if, among the fields included in the header of the null data packet, the transport_error_indicator flag is set to '1' and then transmitted, the transmitter 200 may identify and discard the null data packet corresponding to the transport_error_indicator flag.

Herein, any value that can identify the null data packet may be used as the identification information for identifying the null data packet. Therefore, the present invention will not be limited only to the example proposed in the description of the present invention.

Meanwhile, signaling data, such as transmission parameters, are required for enabling the transmitter 200 to process the mobile service data.

According to an embodiment of the present invention, the transmission parameter is inserted in the payload region of the OM packet, thereby being transmitted to the transmitter.

At this point, in order to enable the transmitter 200 to identify the insertion of the transmission parameter in the OM packet, identification information that can identify the insertion of the transmission parameter in the type field of the corresponding OM packet (i.e., OM_type field).

More specifically, an operations and maintenance packet (OMP) is defined for the purpose of operating and managing the transmitting system. For example, the OMP is configured in an MPEG-2 TS packet format, and the value of its respective PID is equal to '0x1FFA'. The OMP consists of a 4-byte header and a 184-byte payload. Among the 184 bytes, the first byte corresponds to the OM_type field indicating the type of the corresponding OM packet (OMP). And, the remaining 183 bytes correspond to an OM_payload field, wherein actual data are inserted.

According to the present invention, among the reserved field values of the OM_type field, a pre-arranged value is used, thereby being capable of indicating that a transmission parameter has been inserted in the corresponding OM packet. Thereafter, the transmitter 200 may locate (or identify) the corresponding OMP by referring to the respective PID. Subsequently, by parsing the OM_type field within the OMP, the transmitter 200 may be able to know (or recognize) whether or not a transmission parameter has been inserted in the corresponding OM packet.

The transmission parameters that can be transmitted to the OM packet include M/H frame information (e.g., M/H frame_index), FIC information (e.g., next_FIC_version_number), parade information (e.g., number_of_parades, parade_id, parade_repetition_cycle, and ensemble_id), group information (e.g., number_of group and start_group_number), SCCC information (e.g., SCCC_block_mode and SCCC_outer_code_mode), RS frame information (e.g., RS_Frame_mode and RS_frame_continuity_counter), RS encoding information (e.g., RS_code_mode), and so on.

At this point, the OM packet in which the transmission parameter is inserted may be periodically generated by a constant cycle, so as to be multiplexed with the mobile service data packet.

The multiplexing rules and the generation of null data packets of the mobile service multiplexer 150, the main service multiplexer 161, and the TS packet multiplexer 160 are controlled by the controller 110.

Figure 44:
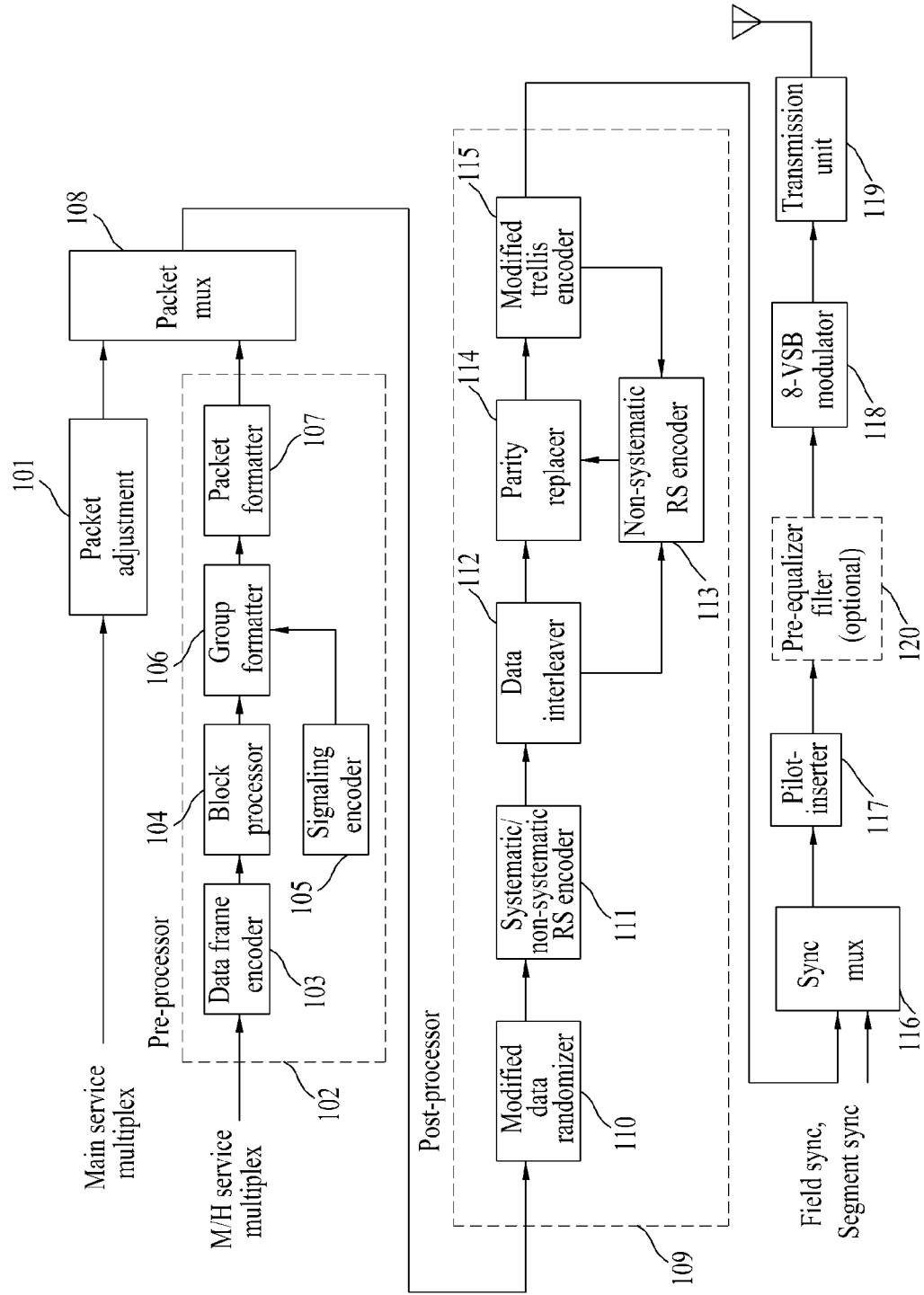
FIG. 44 is a block diagram illustrating a transmission system according to an embodiment of the present invention.

FIG. 44 is a block diagram illustrating a transmission system according to an embodiment of the present invention.

Referring to FIG. 44, the transmission system includes a packet adjustment unit 101, a pre-processor 102, a data frame encoder 103, a block processor 104, a signaling encoder 105, a group formatter 106, a packet formatter 107, a Packet multiplexer (Packet MUX) 108, a post-processor 109, a modified data randomizer 110, a systematic/non-systematic RS encoder 111, a data interleaver 112, a non-systematic RS encoder 113, a parity replacer 114, a modified trellis encoder 115, a synchronization multiplexer (Sync MUX) 116, a pilot inserter 117, a VSB modulator 118, and a Radio Frequency (RF) up-converter 119. In addition, the transmission system of FIG. 1 may further include a pre-equalizer filter 120.

When a mobile service data packet and a main service data packet are multiplexed, there may occur a displacement between a service stream packet including a mobile service stream and another service stream packet including no mobile service stream. In order to compensate for the displacement, the packet adjustment unit 101 may be used.

The pre-processor 102 configures mobile service data in a form of a mobile service structure for transmitting the mobile service data. In addition, the pre-processor 102 performs additional FEC coding of mobile service data. Also, the pre-processor 102 inserts known data. That is, the pre-processor 102 increases the stability of transmission and reception of mobile service data under a mobile environment.

Also, the pre-processor 102 performs an additional encoding process on the mobile service data of the first mobile mode extracted from the mobile service data packet of the first mobile mode and/or on the mobile service data of the second mobile mode extracted from the mobile service data packet of the second mobile mode, and the pre-processor 102 also performs a group forming process enabling data to be positioned in a specific position depending upon the purpose of the data that are to be transmitted to the transmission frame. Such processes are performed to enable the mobile service data to respond more swiftly and with robustness against noise and change in channels.

The pre-processor 102 may include a data frame encoder 103, a block processor 103, a block processor 104, a signaling encoder 105, a group formatter 106, a packet formatter 107, and a packet multiplexer (packet MUX) 108. In other words, the above-mentioned constituent components may be contained in the pre-processor 102, and may be configured separately from the pre-processor 102.

The data frame encoder 103 randomizes mobile service data of the first mobile mode or second mobile mode, and performs RS encoding and CRC encoding of the mobile service data to build RS frame.

The mobile service data included in the RS frame may correspond to mobile service data of the first mobile mode, or may correspond to mobile service data of the second mobile mode. Furthermore, the RS frame may include both the mobile service data of the first mobile mode and the mobile service data of the second mobile mode.

Although the data of the RS frame being outputted include raw (i.e., non-processed) mobile service data, CRC data, stuffing data, and so on, in a broader definition, such data all correspond to data for mobile services. Therefore, the data of each frame will hereinafter be described under the assumption that the data all correspond to mobile service data.

The block processor 104 converts an RS frame portion into an SCCC block. The block processor 104 converts a mobile service data byte contained in the SCCC block into bit-based mobile service data. The block processor 104 performs convolution encoding of ½, ⅓, or ¼ rate on the bit-based mobile service data. In this case, the ½ rate means an encoding process in which two bits are output in response to an input of one bit, the ⅓ rate means an encoding process in which three bits are output in response to an input of two bits, and the ¼ rate means an encoding process in which four bits are output in response to an input of four bits. Output bits are contained in a symbol. The block processor 104 performs interleaving of the convolution-encoded output symbol. The block processor 104 converts an interleaved symbol into byte-based data, and converts an SCCC block into a data block. A detailed description of the data block will hereinafter be described in detail.

The signaling encoder 105 generates signaling information for signaling at a reception end, performs FEC encoding and PCCC encoding of the generated signaling information, and inserts the signaling information into some regions of the data group. For example, examples of the signaling information may be a transmission parameter channel (TPC) data, fast information channel (FIC) data, and the like.

The group formatter 106 forms a data group using the output data of the block processor 104. The group formatter 106 maps FEC-encoded mobile service data to an interleaved form of a data group format. At this time, the above-mentioned mapping is characterized in that FEC-encoded mobile service data is inserted into either a data block of a corresponding group or a group region according to a coding rate of each FEC-encoded mobile service data received from the block processor 104. In addition, the group formatter 106 inserts signaling data, a data byte used for initializing the trellis encoder, and a known data sequence. Further, the group formatter 106 inserts main service data, and a place-holder for an MPEG-2 header and a non-systematic RS parity. The group formatter 106 may insert dummy data to generate a data group of a desired format. After inserting various data, the group formatter 106 performs deinterleaving of data of the interleaved data group. After performing the deinterleaving operation, the data group returns to an original group formed before the interleaving operation.

The packet formatter 107 converts output data of the group formatter 106 into a Transport Stream (TS) packet. In this case, the TS packet is a mobile service data packet. In addition, the output of the packet formatter 107 according to an embodiment of the present invention is characterized in that it includes (118+M) mobile service data packets in a single data group. In this case, M is 38 or less.

The packet multiplexer (Packet MUX) 108 multiplexes a packet including mobile service data processed by the pre-processor 102 and a packet including main service data output from the packet adjustment unit 101. In this case, the multiplexed packet may include (118+M) mobile service data packets and L main service data packets. For example, according to an embodiment of the present invention, M is any one of integers from 0 to 38, and the sum of M and L is set to 38. In other words, although the packet multiplexer (packet MUX) 108 may multiplex the mobile service data packet and the main service data packet, in the case where the number of input main service data packets is set to '0' (i.e., L=0), only the mobile service data packet is processed by the packet multiplexer (packet MUX) 108, such that the packet multiplexer (packet MUX) 108 outputs the processed mobile service data packet only.

The post-processor 109 processes mobile service data in such a manner that the mobile service data generated by the present invention can be backward compatible with a conventional broadcast system. In accordance with one embodiment of the present invention, the post-processor 109 may include a modified data randomizer 110, a systematic/non-systematic RS encoder 111, a data interleaver 112, a non-systematic RS encoder 113, a parity replacer 114 and a modified trellis encoder 115. In other words, each of the above-mentioned constituent components may be located outside of the post-processor 109 according to the intention of a designer as necessary.

The modified data randomizer 110 does not perform randomizing of a mobile service TS packet, and bypasses a mobile service TS packet. The modified data randomizer 110 performs randomizing of the main service data TS packet. Therefore, according to one embodiment of the present invention, the randomizing operation is not performed when a data group generated by the pre-processor 102 has no main service data.

In the case where input data is a main service data packet, the systematic/non-systematic RS encoder 111 performs systematic RS encoding of the main service data packet acting as the input data, such that it generates RS FEC data. In the case where input data is a mobile service data packet, the systematic/non-systematic RS encoder 111 performs non-systematic RS encoding, such that it generates RS FEC data. In accordance with one embodiment of the present invention, the systematic/non-systematic RS encoder 111 generates RS FEC data having the size of 20 bytes during the systematic/non-systematic RS encoding process. The RS FEC data generated in the systematic RS encoding process is added to the end of a packet having the size of 187 bytes. RS FEC data generated in the non-systematic RS encoding process is inserted into the position of an RS parity byte predetermined in each mobile service data packet. Therefore, according to one embodiment of the present invention, in the case where the data group generated by the pre-processor has no main service data, the systematic RS encoder 111 for main service data performs no RS encoding. In this case, the non-systematic RS encoder 111 does not generate a non-systematic RS parity for backward compatibility.

The data interleaver 112 performs byte-based interleaving of data that includes main service data and mobile service data.

In the case where it is necessary to initialize the modified trellis encoder 115, the non-systematic RS encoder 113 receives an internal memory value of the modified trellis encoder 115 as an input, and receives mobile service data from the data interleaver 112 as an input, such that it changes initialization data of mobile service data to a memory value. The non-systematic RS encoder 113 performs non-systematic RS encoding of the changed mobile service data, and outputs the generated RS parity to the parity replacer 114.

In the case where it is necessary to initialize the modified trellis encoder 115, the parity replacer 114 receives mobile service data output from the data interlever 112, and replaces an RS parity of the mobile service data with an RS parity generated from the non-systematic RS encoder 113.

In the case where the data group generated in the pre-processor does not include main service data at all, the data group need not have an RS parity for backward compatibility. Accordingly, in accordance with one embodiment of the present invention, the non-systematic RS encoder 113 and the parity replacer 114 do not perform each of the above-mentioned operations, and bypass corresponding data.

The modified trellis encoder 115 performs trellis encoding of output data of the data interleaver 112. In this case, in order to allow data formed after the trellis encoding to have known data pre-engaged between a transmission end and a reception end, a memory contained in the modified trellis encoder 115 should be initialized before the beginning of the trellis encoding. The above-mentioned initialization operation begins by trellis initialization data belonging to a data group.

The synchronization multiplexer (Sync MUX) 116 inserts a field synchronization signal and a segment synchronization signal into output data of the modified trellis encoder 115, and multiplexes the resultant data.

The pilot inserter 117 receives the multiplexed data from the synchronization multiplexer (Sync MUX) 116, and inserts a pilot signal, that is used as a carrier phase synchronization signal for demodulating a channel signal at a reception end, into the multiplexed data.

The VSB modulator 118 performs VSB modulation so as to transmit data.

The transmission unit 119 performs frequency up-conversion of the modulated signal, and transmits the resultant signal.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

Figure 45:
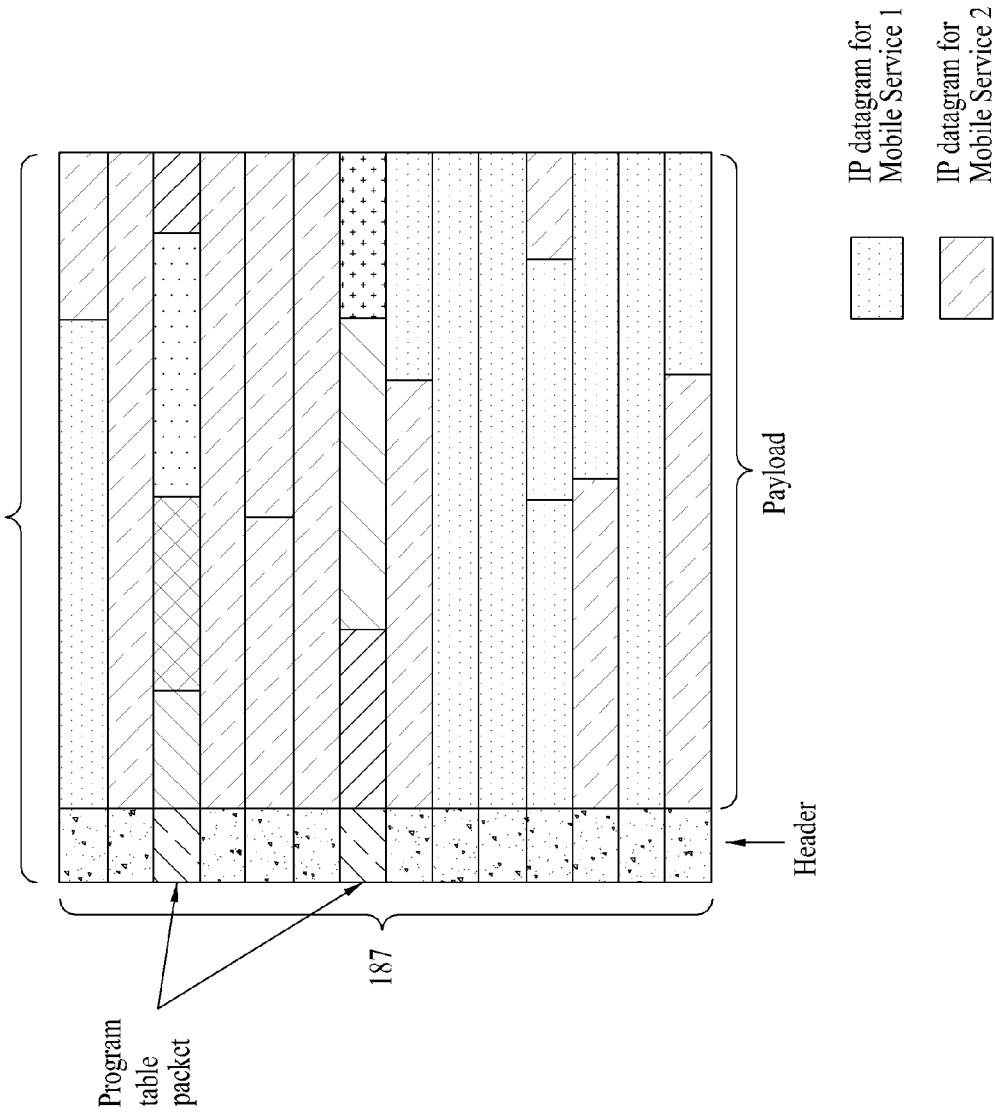
FIG. 45 illustrates a payload of an RS frame being outputted from a data frame encoder according to an embodiment of the present invention.

FIG. 45 illustrates a payload of an RS frame being outputted from a data frame encoder according to an embodiment of the present invention.

Payloads of the RS frame are gathered (or collected) to form an ensemble. Herein, an ensemble corresponds to a collection of services having the same quality of service (QoS).

A data frame encoder 103 includes at least one or more RS frame encoders. Herein, one RS frame encoder receives one RS frame payload and encodes the received RS frame payload, thereby outputting the encoded RS frame payload.

According to the embodiment of the present invention, the RS frame payload has the size of (N×187) bytes, as shown in FIG. 45. Herein, N represents the length of a row (i.e., the number of columns), and 187 indicates the length of a column (i.e., the number of rows).

According to the embodiment of the present invention, each row configured of N bytes will be referred to as a mobile service data packet for simplicity. The mobile service data packet may include a 2-byte header and an (N−2)-byte mobile service payload. Herein, the assignment of 2 bytes to the header region is merely exemplary. Accordingly, the assignment of the data bytes may be varied and modified by the system designer. Therefore, the present invention will not be limited only to the examples given in the description of the present invention.

One RS frame payload is created by gathering (or collecting) table information and/or IP datagrams having the size of (N−2)×187 bytes from one ensemble. Also, one RS frame payload may include table information and IP datagrams corresponding to at least one or more mobile services. For example, IP datagrams and table information for two different types of mobile services, such as news (e.g., IP datagram for mobile service 1) and stock information (e.g., IP datagram for mobile service 2), may be included in one RS frame payload.

More specifically, table information of a section structure or IP datagrams of mobile service data may be assigned to a mobile payload within a mobile service data packet included in the RS frame payload. Alternatively, IP datagrams of table information or IP datagrams of mobile service data may be assigned to a mobile payload within a mobile service data packet included in the RS frame payload.

In case the size of a mobile service data packet does not reach the size of N bytes, even when including a mobile header, stuffing data bytes may be assigned to the remaining payload portion of the corresponding mobile service data packet. For example, after assigning program table information to a mobile service data packet, if the length of the mobile service data packet including the header is (N−20) bytes, stuffing data bytes may be assigned to the remaining 20-byte portion of the corresponding mobile service data packet.

FIG. 46 is a diagram illustrating examples of fields allocated to the header region within the mobile service data packet according to the present invention. Examples of the fields include type_indicator field, error_indicator field, stuff_indicator field, and pointer field.

The type_indicator field can allocate 3 bits, for example, and represents a type of data allocated to payload within the corresponding mobile service data packet. In other words, the type_indicator field indicates whether data of the payload is IP datagram or program table information. At this time, each data type constitutes one logical channel. In the logical channel which transmits the IP datagram, several mobile services are multiplexed and then transmitted. Each mobile service undergoes demultiplexing in the IP layer.

The error_indicator field can allocate 1 bit, for example, and represents whether the corresponding mobile service data packet has an error. For example, if the error_indicator field has a value of 0, it means that there is no error in the corresponding mobile service data packet. If the error_indicator field has a value of 1, it means that there may be an error in the corresponding mobile service data packet.

The stuff_indicator field can allocate 1 bit, for example, and represents whether stuffing byte exists in payload of the corresponding mobile service data packet. For example, if the stuff_indicator field has a value of 0, it means that there is no stuffing byte in the corresponding mobile service data packet. If the stuff_indicator field has a value of 1, it means that stuffing byte exists in the corresponding mobile service data packet.

The pointer field can allocate 11 bits, for example, and represents position information where new data (i.e., new signaling information or new IP datagram) starts in the corresponding mobile service data packet.

For example, if IP datagram for mobile service 1 and IP datagram for mobile service 2 are allocated to the first mobile service data packet within the RS frame payload as illustrated in FIG. 45, the pointer field value represents the start position of the IP datagram for mobile service 2 within the mobile service data packet.

Also, if there is no new data in the corresponding mobile service data packet, the corresponding field value is expressed as a maximum value exemplarily. According to the embodiment of the present invention, since 11 bits are allocated to the pointer field, if 2047 is expressed as the pointer field value, it means that there is no new data in the packet. The point where the pointer field value is 0 can be varied depending on the type_indicator field value and the stuff_indicator field value.

It is to be understood that the order, the position, and the meaning of the fields allocated to the header within the mobile service data packet illustrated in FIG. 46 are exemplarily illustrated for understanding of the present invention. Since the order, the position and the meaning of the fields allocated to the header within the mobile service data packet and the number of additionally allocated fields can easily be modified by those skilled in the art, the present invention will not be limited to the above example.

FIG. 47 illustrates a data frame encoder according to an embodiment of the present invention.

(a) of FIG. 47 corresponds to an example of a data frame encoder. The data frame encoder receives a plurality of ensembles, and an input demultiplexer outputs the received ensembles by distributing the received ensembles to each RS frame encoder. The output of each RS frame encoder passes through an output multiplexer, so as to become the output of the data frame encoder. According to the embodiment of the present invention, one data frame encoder includes a number of RS frame encoders corresponding to the number of the received ensembles.

(b) of FIG. 47 corresponds to an example of an RS frame encoder. The RS frame encoder may include a data randomizer, an RS-CRC encoder, and an RS Frame divider.

The data randomizer randomizes data, and the RS-CRC encoder performs forward error correction (FEC) encoding on the mobile service data, thereby building (or creating) an RS frame. At this point, the built (or created) RS frame may correspond to a primary RS frame or a combination of a primary RS frame and a secondary RS frame. The RS frame divider divides the RS frame into a plurality of data portions. Herein, according to the embodiment of the present invention, one data portion forms one data group.

A CMM primary ensemble, a CMM secondary ensemble, an EMM primary ensemble, an EMM secondary ensemble, and a super ensemble may be inputted as the input of the RS frame encoder. When a primary ensemble is inputted, primary RS frame portions are outputted from the RS frame divider. And, when a secondary ensemble is inputted, secondary RS frame portions are outputted from the RS frame divider.

The randomizer within the RS frame encoder randomizes an (N×187)-byte RS frame payload included in the received ensemble. Thereafter, the randomized result is outputted to the RS-CRC encoder.

Figure 48:
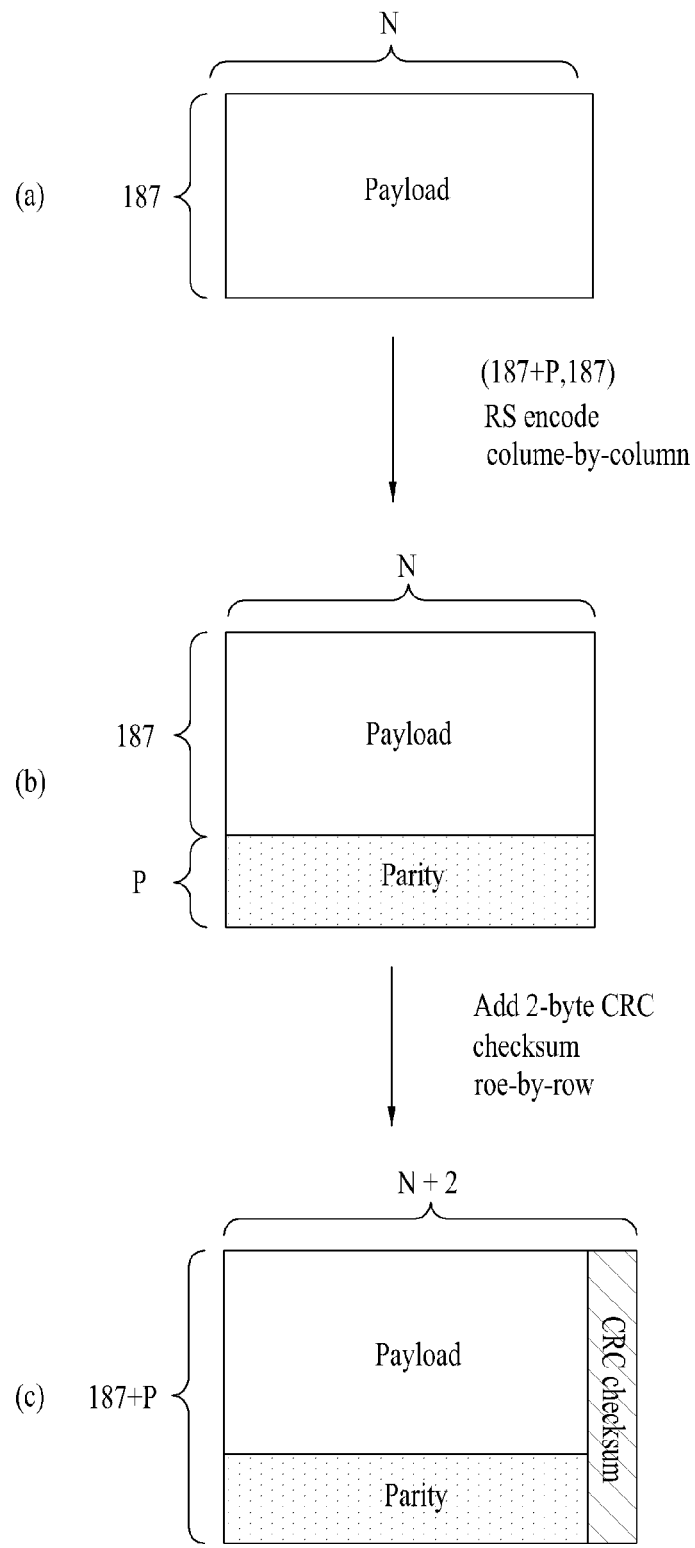
FIGS. 48(a)-48(c) illustrate the operations of an RS-CRC encoder according to an embodiment of the present invention.

FIG. 48 illustrates the operations of an RS-CRC encoder according to an embodiment of the present invention.

FIG. 48(a) illustrates an example of an RS frame being generated from the RS-CRC encoder according to the present invention.

When the RS frame payload is formed, as shown in FIG. 48(a), the RS-CRC encoder performs a (Nc,Kc)-RS encoding process on each column, so as to generate Nc−Kc(=P) number of parity bytes. Then, the RS-CRC encoder adds the newly generated P number of parity bytes after the very last byte of the corresponding column, thereby creating a column of (187+P) bytes. Herein, as shown in FIG. 48(a), Kc is equal to 187 (i.e., Kc=187), and Nc is equal to 187+P (i.e., Nc=187+P). Herein, the value of P may vary depending upon the RS code mode. Table a below shows an example of an RS code mode, as one of the RS encoding information.

TABLE 1

| RS code mode | RS code | Number of parity bytes (P) |
|---|---|---|
| 00 | (211, 187) | 24 |
| 01 | (223, 187) | 36 |
| 10 | (235, 187) | 48 |
| 11 | Reserved | Reserved |

Table 1 shows an example of 2 bits being assigned in order to indicate the RS code mode. The RS code mode represents the number of parity bytes corresponding to the RS frame payload.

For example, when the RS code mode value is equal to '10', (235,187)-RS-encoding is performed on the RS frame payload of FIG. 48(a), so as to generate 48 parity data bytes. Thereafter, the 48 parity bytes are added after the last data byte of the corresponding column, thereby creating a column of 235 data bytes.

When the RS frame mode value is equal to '00' in Table 1 (i.e., when the RS frame mode indicates a single RS frame), only the RS code mode of the corresponding RS frame is indicated. However, when the RS frame mode value is equal to '01' in Table 1 (i.e., when the RS frame mode indicates multiple RS frames), the RS code mode corresponding to a primary RS frame and a secondary RS frame. More specifically, it is preferable that the RS code mode is independently applied to the primary RS frame and the secondary RS frame.

When such RS encoding process is performed on all N number of columns, a size of N(row)×(187+P)(column) bytes may be generated, as shown in FIG. 48(b).

Each row of the RS frame payload is configured of N bytes. However, depending upon channel conditions between the transmitting system and the receiving system, error may be included in the RS frame payload. When errors occur as described above, CRC data (or CRC code or CRC checksum) may be used on each row unit in order to verify whether error exists in each row unit.

The RS-CRC encoder may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system.

FIG. 48(c) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 2 below corresponds to an exemplary equation for generating a 2-byte CRC checksum for each row being configured of N number of bytes.

$$g(x) = x^{16} + x^{12} + x^5 + 1 \qquad \text{[Equation 2]}$$

The process of adding a 2-byte checksum in each row is only exemplary. Therefore, the present invention is not limited only to the example proposed in the description set forth herein. As described above, when the process of RS encoding and CRC encoding are completed, the (N×187)-byte RS frame payload is converted into a (N+2)×(187+P)-byte RS frame.

The RS frame having the size of (N+2)×(187+P) bytes, which is created by the RS-CRC encoder, is outputted to the RS frame divider.

When an RS frame payload created from a primary ensemble is inputted to the RS frame encoder, the RS-CRC encoder generates (or creates) a primary RS frame. Thereafter, the generated primary RS frame passes through the RS frame divider, so as to be transmitted through the primary parade.

When an RS frame payload created from a secondary ensemble is inputted to the RS frame encoder, the RS-CRC encoder generates (or creates) a secondary RS frame. Thereafter, the generated secondary RS frame passes through the RS frame divider, so as to be transmitted through the secondary parade.

When an RS frame payload created from a super ensemble is inputted to the RS frame encoder, the RS-CRC encoder generates (or creates) a super RS frame. Thereafter, the generated super RS frame passes through the RS frame divider, so as to be transmitted through two different parades. At this point, each of the two different parades may respectively correspond to one of an EMM primary parade, an EMM Class 1 secondary parade, and an EMM Class 2 secondary parade.

When the output of the RS frame encoder corresponds to a primary RS frame or a secondary RS frame, the number of columns N included in the RS frame may be decided in accordance with Equation 3 shown below.

$$N = \left\lfloor \frac{5 \times NoGD \times PL}{187 + P} \right\rfloor - 2 \qquad \text{[Equation 3]}$$

In Equation 3, NOGD signifies the number of group divisions having a parade assigned to one subframe. PL represents the number of serial concatenated convolution code (SCCC) payload bytes assigned to one group division. And, P indicates the number of RS parity bytes added to each column of the RS frame. Finally, $\lfloor X \rfloor$ corresponds to the greatest integer equal to or less than X.

In Equation 3, the PL value may be differently decided based upon the group type of the group having the corresponding parade assigned thereto, the type of a group region included in the group division having the corresponding parade assigned thereto, the SCCC coding rate of each group region, and a combination method of an SCCC block and a DATA block.

When the output of the RS frame encoder corresponds to a super RS frame, the number of columns N included in the RS frame may be decided in accordance with Equation 4 shown below.

$$N = \left\lfloor \frac{(5 \times NoGD_1 \times PL_1) + (5 \times NoGD_2 \times PL_2)}{187 + P} \right\rfloor - 2 \qquad \text{[Equation 4]}$$

In Equation 4, among the two parades through which a super RS frame passing through the RS frame divider is to be transmitted, NOGD1 signifies the number of group divisions having the first parade assigned to one subframe, and PL1 represents the number of SCCC payloads of the group division assigned to the first parade. Also, among the two parades through which a super RS frame passing through the RS frame divider is to be transmitted, NOGD2 signifies the number of group divisions having the second parade assigned to one subframe, and PL2 represents the number of SCCC payloads of the group division assigned to the second parade. At this point, the order of the first parade and the second parade may be decided based upon the transmission order of the group divisions that are assigned to the parades. And, P indicates the number of RS parity bytes added to each column of the RS frame. Finally, $\lfloor X \rfloor$ corresponds to the greatest integer equal to or less than X.

In Equation 4, each of the PL1 and PL2 values may be differently decided based upon the group type of the group having the corresponding parade assigned thereto, the type of a group region included in the group division having the corresponding parade assigned thereto, the SCCC coding rate of each group region, and a combination method of an SCCC block and a DATA block.

The RS frame divider receives the RS frame having the size of (N+2)×(187+P) bytes, which is outputted from the RS-CRC encoder. Thereafter, the RS frame divider divides the received RS frame into a plurality of portions, thereby outputting the divided portions.

Figure 49:
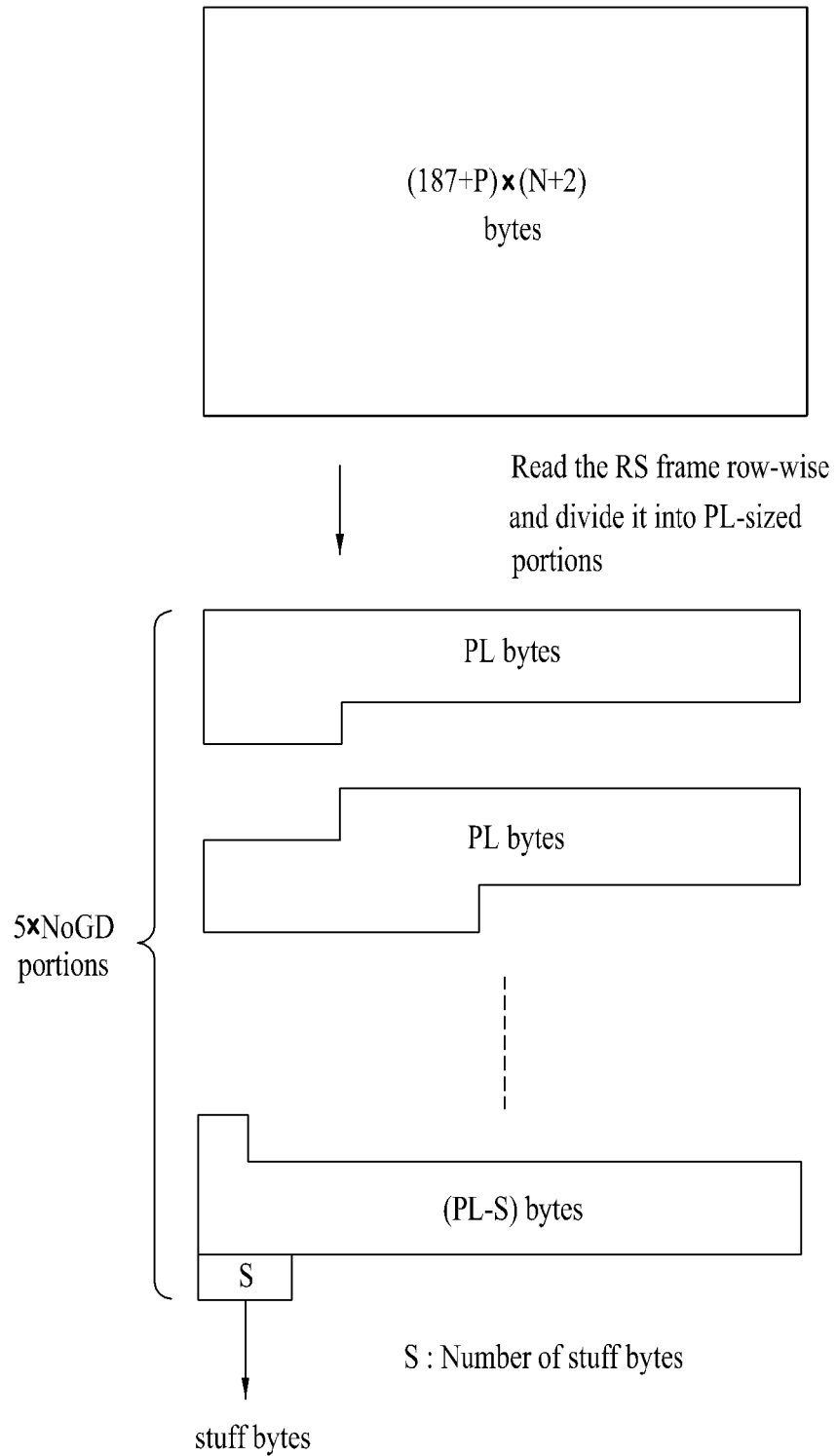
FIG. 49 illustrates the operation of the RS frame divider according to an embodiment of the present invention, when the output of the RS frame encoder corresponds to a primary RS frame or a secondary RS frame.

FIG. 49 illustrates the operation of the RS frame divider according to an embodiment of the present invention, when the output of the RS frame encoder corresponds to a primary RS frame or a secondary RS frame.

At this point, the number of portions divided and created from one RS frame is equal to 5×NOGD. Herein, 5 corresponds to the number of subframes existing in one M/H frame, and NOGD corresponds to the number of group divisions having a parade assigned to one subframe.

Herein, one portion includes data of PL bytes.

At this point, one portion is assigned to one group division, thereby being transmitted.

When dividing an RS frame having the size of (N+2)×(187+P) bytes into (5×NOGD) number of portions, wherein each portion includes PL bytes, one portion may have a byte size smaller than PL bytes. In this case, the last portion may include RS frame data having the size of (PL-S) bytes and may also include additional data byes of S bytes, wherein S has a random value. At this point, the value of S may be decided based upon Equation 5 shown below.

$$S=(5\times NoGD\times PL)-(187+P)\times(N+2) \quad \text{[Equation 5]}$$

Figure 50:
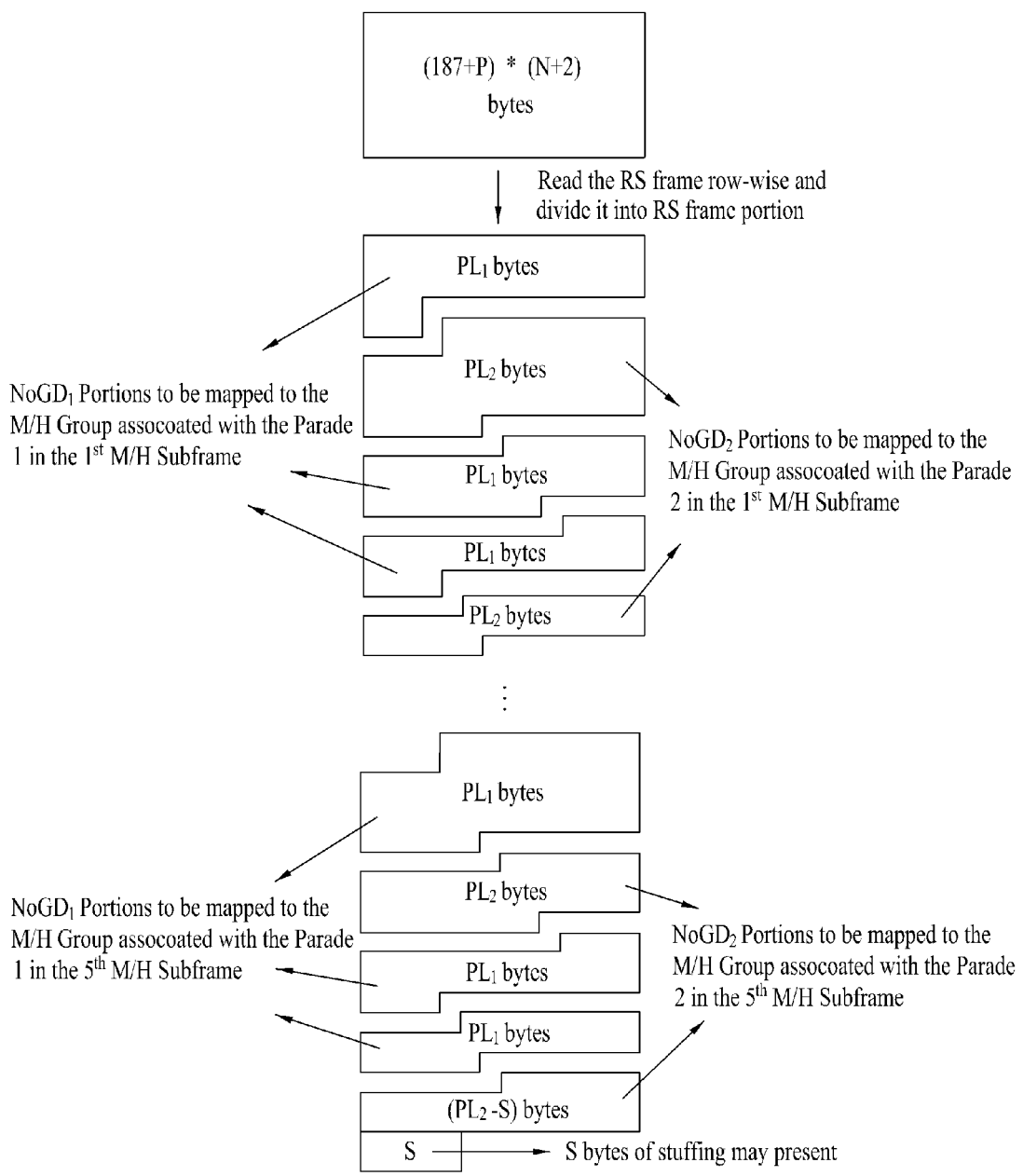
FIG. 50 illustrates the operation of the RS frame divider according to an embodiment of the present invention, when the output of the RS frame encoder corresponds to a super RS frame.

FIG. 50 illustrates the operation of the RS frame divider according to an embodiment of the present invention, when the output of the RS frame encoder corresponds to a super RS frame.

At this point, the number of portions divided and created from one RS frame is equal to 5×(NOGD1+NOGD2). Herein, 5 corresponds to the number of subframes existing in one M/H frame, and each of NOGD1 and NOGD2 corresponds to the number of group divisions having one of the first parade and the second parade, among the two parades through which a super RS frame passing through the RS frame divider is to be transmitted, assigned to one subframe. Herein, the order of the first parade and the second parade may be decided based upon the transmission order of the group divisions that are assigned to the parades.

One portion of the first parade includes data of PL1 bytes, and one portion of the second parade includes data of PL2 bytes.

At this point, one portion of PL1 bytes is assigned to a group division, through which the first parade is to be transmitted. Thereafter, the assigned portion of PL1 bytes is transmitted. Also, one portion of PL2 bytes is assigned to a group division, through which the second parade is to be transmitted. Thereafter, the assigned portion of PL2 bytes is transmitted.

When an RS frame having the size of (N+2)×(187+P) bytes is divided into (5×NOGD1+5×NOGD2) number of portions each having PL1 bytes or PL2 bytes, one portion may have a byte size smaller than PL1 bytes or PL2 bytes. In this case, when the last portion corresponds to a portion belonging to a group division assigned to the first parade, the last portion may include RS frame data having the size of (PL1-S) bytes and may also include additional data byes of S bytes, wherein S has a random value. Alternatively, when the last portion corresponds to a portion belonging to a group division assigned to the second parade, the last portion may include RS frame data having the size of (PL2-S) bytes and may also include additional data byes of S bytes, wherein S has a random value. At this point, the value of S may be decided based upon Equation 6 shown below.

$$S=(5\times NoGD_1\times PL_{1+5}\times NoGD_2\times PL_2)-\{(187+P)\times(N+2)\} \quad \text{[Equation 6]}$$

Figure 51:
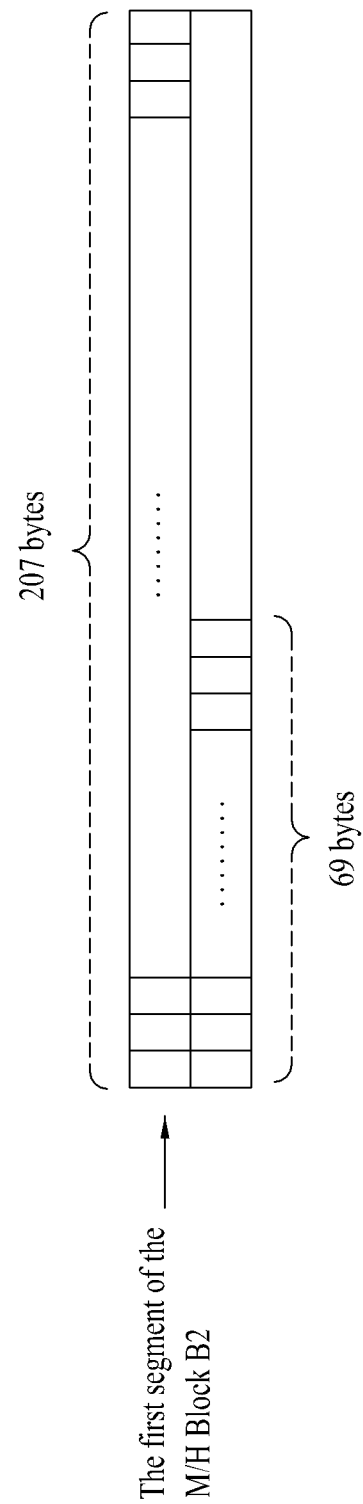
FIG. 51 illustrates an example of assigning signaling information areas for inserting signaling information starting from the 1st segment of the 4th DATA block (B4) to a portion of the 2nd segment.

FIG. 51 illustrates an example of assigning signaling information areas for inserting signaling information starting from the 1st segment of the 4th DATA block (B4) to a portion of the 2nd segment.

The present invention assigns signaling information areas for inserting signaling information to some areas within each data group. More specifically, 276(=207+69) bytes of the 4th DATA block (B4) in each data group are assigned as the signaling information area. In other words, the signaling information area consists of 207 bytes of the 1st segment and the first 69 bytes of the 2nd segment of the 4th DATA block (B4). For example, the 1st segment of the 4th DATA block (B4) corresponds to the 17th or 173rd segment of a VSB field.

The signaling information that is to be inserted in the signaling information area is FEC-encoded by the signaling encoder, thereby inputted to the group formatter. The signaling information may include a transmission parameter which is included in the payload region of an OM packet, and then received to the demultiplexer.

The group formatter inserts the signaling information, which is FEC-encoded and outputted by the signaling encoder, in the signaling information area within the data group. Herein, the signaling information may be identified by two different types of signaling channels: a transmission parameter channel (TPC) and a fast information channel (FIC).

Herein, the TPC data corresponds to signaling information including transmission parameters, such as RS frame information, RS encoding information, FIC information, data group information, SCCC information, and M/H frame information and so on. However, the TPC data presented herein is merely exemplary. And, since the adding or deleting of signaling information included in the TPC may be easily adjusted and modified by one skilled in the art, the present invention will, therefore, not be limited to the examples set forth herein.

Furthermore, the FIC data is provided to enable a fast service acquisition of data receivers, and the FIC data includes cross layer information between the physical layer and the upper layer(s).

Figure 52:
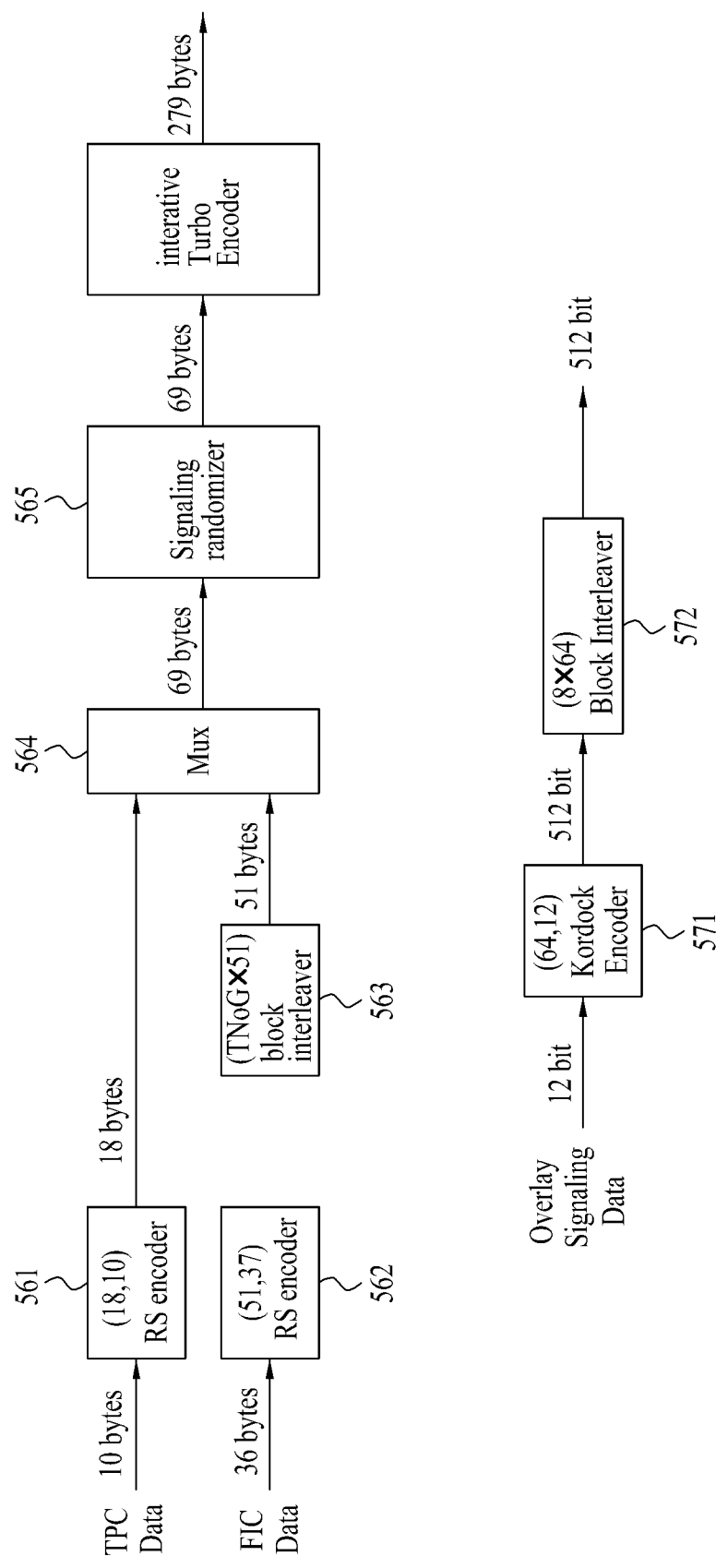
FIG. 52 illustrates a detailed block diagram of the signaling encoder according to the present invention.

FIG. 52 illustrates a detailed block diagram of the signaling encoder according to the present invention.

Referring to FIG. 52, the signaling encoder includes a TPC encoder 561, an FIC encoder 562, a block interleaver 563, a multiplexer 564, a signaling randomizer 565, and an iterative turbo encoder 566.

The TPC encoder 561 receives 10-bytes of TPC data and performs (18,10)-RS encoding on the 10-bytes of TPC data, thereby adding 8 bytes of RS parity bytes to the 10 bytes of TPC data. The 18 bytes of RS-encoded TPC data are outputted to the multiplexer 564.

The FIC encoder 562 receives 37-bytes of FIC data and performs (51,37)-RS encoding on the 37-bytes of FIC data, thereby adding 14 bytes of RS parity bytes to the 37 bytes of FIC data. Thereafter, the 51 bytes of RS-encoded FIC data are inputted to the block interleaver 563, thereby being interleaved in predetermined block units. Herein, the block interleaver 563 corresponds to a variable length block interleaver. The block interleaver 563 interleaves the FIC data within each sub-frame in TNoG(column)×51(row) block units and then outputs the interleaved data to the multiplexer

564. Herein, the TNoG corresponds to the total number of data groups being assigned to a sub-frame. The block interleaver 563 is synchronized with the first set of FIC data in each sub-frame.

The block interleaver 563 writes 51 bytes of incoming (or inputted) RS codewords in a row direction (i.e., row-by-row) and left-to-right and up-to-down directions and reads 51 bytes of RS codewords in a column direction (i.e., column-by-column) and left-to-right and up-to-down directions, thereby outputting the RS codewords.

The multiplexer 564 multiplexes the RS-encoded TPC data from the TPC encoder 561 and the block-interleaved FIC data from the block interleaver 563 along a time axis. Then, the multiplexer 564 outputs 69 bytes of the multiplexed data to the signaling randomizer 565. The signaling randomizer 565 randomizes the multiplexed data and outputs the randomized data to the iterative turbo encoder 566. The signaling randomizer 565 may use the same generator polynomial of the randomizer used for mobile service data. Also, initialization occurs in each data group.

The iterative turbo encoder 566 corresponds to an inner encoder performing iterative turbo encoding in a PCCC method on the randomized data (i.e., signaling information data).

Meanwhile, in order to allow the receiving system to receive and process overlay parades, signaling information associated with overlay parades should be transmitted to the receiving system. According to the embodiment of the present invention, a partial region of the field sync is assigned (or allocated) to a Field Sync Signaling Channel (FSSC) for the overlay parades, and signaling information of the overlay parades is inserted in the signaling channel so as to be transmitted. According to the embodiment of the present invention, among the last 104 symbols of the field sync segment, 32 symbols, i.e., 64 bits are assigned to the signaling channel for the overlay parades. At this point, the signaling information of the primary parade and the secondary parade are inserted in the TPC, thereby being transmitted.

The signaling information associated with the overlay parades are inserted in the 32-symbol (i.e., 64-bit) FSSC region assigned after the VSB mode region, thereby being transmitted.

At this point, the signaling information associated with the overlay parades are encoded to a Kerdock (64,12) code and interleaved in (8×64) block units, thereby being inserted in the FSSC region within the 8 field sync segments included in one subframe. This is because 8 field syncs can be inserted in one subframe. More specifically, when 16 groups are assigned to one subframe, among the 16 groups, 8 groups each includes a field sync.

The signaling information associated with the overlay parades includes the number of overlay parades being transmitted to one subframe, an identifier (parade_id) of each overlay parade, the NOG of each overlay parade, and so on. At this point, according to the embodiment of the present invention, the FEC information of the overlay parade is provided to the TPC.

Figure 53:
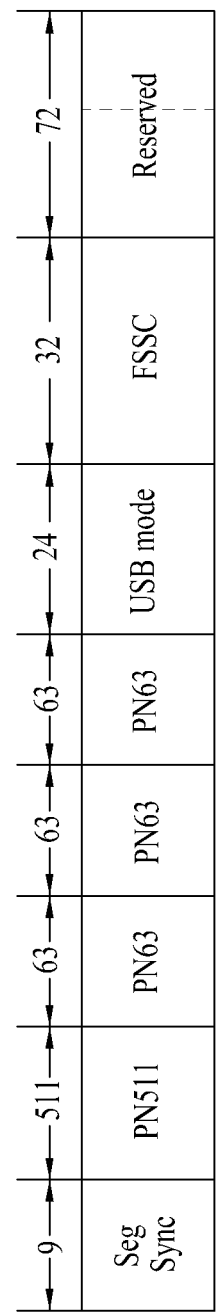
FIG. 53 illustrates a field sync segment according to an embodiment of the present invention.

FIG. 53 illustrates a field sync segment according to an embodiment of the present invention.

A segment synchronization (sync) pattern exists in the first 4 symbols, and, subsequently, Pseudo Random Sequences PN 511, PN 63, PN 63, and PN 63 exist. Thereafter, information associated to the VSB mode exists in the next 24 symbols. Herein, among the three PN 63 sections, the polarity of the second PN 63 changes each time. More specifically, '1' changes to '0', and '0' changes to '1'.

Accordingly, depending upon the polarity of the second PN 63, one frame may be divided into an even field and/or an odd field.

FIG. 54 illustrates a bit stream syntax structure of signaling overlay data sig_overlay_data( ) for signaling information associated to an overlay parade according to an embodiment of the present invention.

The signaling overlay data sig_overlay_data( ) of FIG. 54 provides signaling information of all overlay parades that are transmitted to one subframe.

In the signaling overlay data sig_overlay_data( ) a num_overlay_parade field corresponds to a 4-bit field indicating the number of overlay parades being transmitted to one sub-frame.

An overlay_parade_map field corresponds to a 16-bit field indicating the NOG of each overlay parade being transmitted to the subframe. According to the embodiment of the present invention, among the 16 bits, the bit corresponding to the NOG is marked with '1' so as to indicate the NOG of the corresponding overlay parade.

For example, it is assumed that the num_overlay_parade field value is equal to 3, i.e., it is assumed that 3 overlay parades are transmitted to the subframe. Herein, it is also assumed that the NOG of the first overlay parade is equal to 4, that the NOG of the second overlay parade is equal to 6, and that the NOG of the third overlay parade is equal to 5. In this case, among the 16 bits of the overlay_parade_map field, '1' is marked on the fourth ($4^{th}$) bit, then '1' is marked on the sixth ($6^{th}$) bit, and '1' is marked on the fifth ($5^{th}$), bit thereby being inserted in the FSSC of the corresponding field synchronization (sync) segment. More specifically, when the overlay_parade_map field value is equal to '0001000001000010', it can be known that the NOG of the first overlay parade is equal to 4, that the NOG of the second overlay parade is equal to 6, and that the NOG of the third overlay parade is equal to 5. In another example, when it is assumed that the NOG of the first overlay parade is equal to 2, that the NOG of the second overlay parade is equal to 3, and that the NOG of the third overlay parade is equal to 5, the overlay_parade_map field value becomes equal to '01001000010000'.

Also, a loop is performed as many times as the num_overlay_parade field value, thereby providing an identifier of each overlay parade being transmitted to the subframe. For example, when the num_overlay_parade field value is equal to '3', the loop is repeated 3 times, thereby providing identifiers of 3 overlay parades. For this, a 16-bit overlay_parade_id field is included in the loop.

Thereafter, an 8-bit CRC code is inserted for error correction.

At this point, when the signaling information of an overlay parade being signaled by the signaling overlay data sig_overlay_data( ) does not reach the size of 96 bits, a reserved field is used to complete the 96 bits. Also, the 96 bits are divided into 12-bit units, as shown in FIG. 52, thereby being inputted to a (64,12) Kerdock encoder 571. The (64,12) Kerdock encoder 571 encodes the inputted 12 bits by using a Kerdock coding algorithm, so as to create 64 bits. Thereafter, the (64,12) Kerdock encoder 571 outputs the 64 bits to an (8×64) block interleaver 572.

Meanwhile, according to the embodiment of the present invention, 2 bits of the TPC are used to indicate whether or not an overlay parade exists and also to indicate the version information of the overlay parade. In the description of the embodiment of the present invention, the 2 bits will be referred to as an overlay_group_status field.

More specifically, since the structure of the overlay parade may vary for each M/H frame, it is indicated whether or not an overlay parade exists in the corresponding M/H frame. Also, in case an overlay parade exists, the version information of the existing overlay parade is also indicated.

For example, when the overlay_group_status field value is equal to '00', this indicates that an overlay parade does not exist in the corresponding M/H frame. In this case, the receiving system is not required to analyze the field sync in order to acquire the overlay parade signaling information. If the value of the overlay_group_status field is equal to any one of '01', '10', and '11', this indicates that an overlay parade exists in the corresponding M/H frame. Herein, it is assumed that the value of the overlay_group_status field is equal to '01' in the current M/H frame. And, it is also assumed that the structure of overlay parade is modified in the next M/H frame. In this case, the overlay_group_status field is equal to '10' in the next M/H frame.

Furthermore, according to the embodiment of the present invention, 3 bits of the TPC are used to indicate the extended group information. In the description of the present invention, the 3 bits will be referred to as a group_extension_mode field.

More specifically, according to the embodiment of the present invention, all group types may be identified by using the RS_Frame_mode field and the group_extension_mode field of the TPC.

Figure 55:
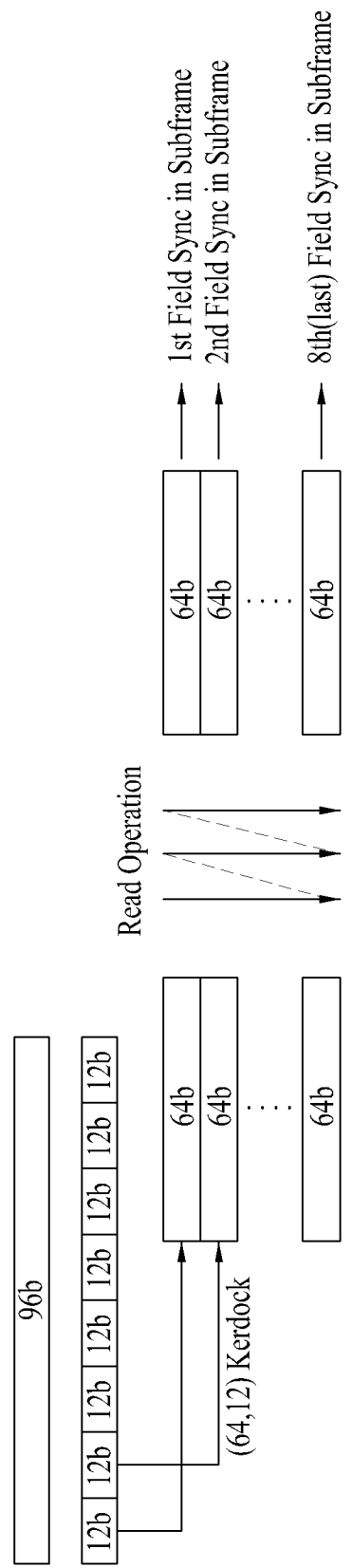
FIG. 55 illustrates an operation of interleaving overlay parade signaling data being outputted to a block interleaver according to an embodiment of the present invention.

FIG. 55 illustrates an operation of interleaving overlay parade signaling data being outputted to a block interleaver according to an embodiment of the present invention.

The block interleaver 572 corresponds to a variable length block interleaver. Herein, the block interleaver 572 interleaves, in (8×64)-block units, the overlay parade signaling data being Kerdock-encoded and inputted in 64-bit units.

The block interleaver 572 writes the 64-bit overlay parade signaling data in row units in a left-to-right direction and in a top-to-bottom direction and reads the 64-bit overlay parade signaling data in column units in a top-to-bottom direction and in a left-to-right direction, thereby outputting the processed data in 64-bit units.

More specifically, the 96-bit overlay parade signaling information being provided as shown in FIG. 54 passes through the Kerdock encoder 571 and the block interleaver 572, so as to become 512 bits. According to the embodiment of the present invention, the 512-bit overlay parade signaling information are divided into 64-bit units and, then, sequentially inserted in the FSSC of the 8 field sync segments within the corresponding subframe.

FIG. 56 illustrates an example of designating a field value by including information on an RS_Frame_mode and information on a group_extension_mode within a TPC according to an embodiment of the present invention.

According to the embodiment of the present invention, the group_extension_mode corresponds to information indicating the size of region E within a data group, i.e., a number of mobile service data packets included in region E within a single data group.

As shown in FIG. 56, each group type is segmented based upon the size of region E. And, exemplary RS frame mode field values and group_extension_mode field values assigned to each group type are shown in the form of a table.

For example, when the RS_Frame_mode field value within the TPC is equal to '01', and when the group_extension_mode field value within the TPC is equal to '010', it can be known that the group type of the corresponding group is group type 2-1.

However, the RS_Frame_mode field value and the group_extension_mode field value within the TPC, shown in FIG. 56, are merely exemplary. Also, the information indicated by the group_extension_mode field may indicate that the number of mobile service data packets included in region E corresponds to any one of a number equal to or greater than 0 and a number equal to or less than 38.

FIG. 57 illustrates a syntax structure of TPC data according to an embodiment of the present invention.

The TPC data are inserted in a signaling information region of each group, so as to be transmitted.

The TPC data may include a Sub-Frame_number field, a Slot_number field, a Parade_id field, a starting_Group_number (SGN) field, a number_of Group (NoG) field, a Parade_repetition_cycle (PRC) field, an RS_Frame_mode field, an RS_code_mode_primary field, an RS_code_mode_secondary field, an SCCC_Block_mode field, an SCCC_outer_code_mode_A field, an SCCC_outer_code_mode_B field, an SCCC_outer_code_mode_C field, an SCCC_outer_code_mode_D field, an SCCC_outer_code_mode_E field, an FIC_version field, a Parade_continuity_counter field, a TNoG field, an overlay_group_status field, a group_extension_mode field, and so on.

The Sub-Frame_number field shall be the current Sub-Frame number within the M/H Frame, which is transmitted for M/H Frame synchronization. Its value shall range from 0 to 4).

The Slot_number field is the current Slot number within the Sub-Frame, which is transmitted for M/H Frame synchronization. Its value shall range from 0 to 15.

The Parade_id field indicates an identifier for identifying a parade to which the corresponding group belongs. According to the embodiment of the present invention, a maximum of 2 parade identifiers may be marked for one data group. For example, when it is assumed that data of a primary parade are allocated (or assigned) to a primary group division of the corresponding data group, and when it is also assumed that data of an overlay parade are assigned to a secondary group division of the corresponding data group, the parade_id field shall indicate the identifier of the primary parade and the identifier of the overlay parade.

The starting_Group_number (SGN) field shall be the first Slot_number for a Parade to which this Group belongs, as determined by Equation 1 (after the Slot numbers for all preceding Parades have been calculated).

The number of Groups (NoG) field shall be the number of Groups in a Sub-Frame assigned to the Parade to which this Group belongs, minus 1, e.g., NoG=0 implies that one Group is allocated to this Parade in a Sub-Frame.

The NoG field value may have a value ranging from 0 to 7. The slot numbers being assigned to the respective parade may be calculated from the SGN and the NoG by using Equation 1.

The PRC field indicates a repetition cycle of a parade being transmitted in M/H frame units.

The RS_Frame_mode field defines the group division configuration of the group through which the primary RS frame and the secondary RS frame are transmitted, as shown in Table 1.

The RS_code_mode_primary field indicates the RS code mode for the primary RS frame.

The RS_code_mode_secondary field indicates the RS code mode for the secondary RS frame.

The SCCC_Block_mode field indicates how the DATA blocks within the group are assigned to the SCCC block.

The SCCC_outer_code_mode_A field indicates the SCCC outer code mode for region A within the group.

The SCCC_outer_code_mode_B field indicates the SCCC outer code mode for region B within the group.

The SCCC_outer_code_mode_C field indicates the SCCC outer code mode for region C within the group.

The SCCC_outer_code_mode_D field indicates the SCCC outer code mode for region D within the group.

The SCCC_outer_code_mode_E field indicates the SCCC outer code mode for region E within the group.

According to the embodiment of the present invention, 2 bits of the TPC are used to indicate the SCCC outer code rate information of region E. According to the embodiment of the present invention, the 2 bits of the TPC will be referred to as the SCCC_outer_code_mode_E field.

The FIC_version field indicates the version of the FIC data.

The Parade_continuity_counter field increases from 0 to 15, and the value is incremented by 1 for each (PRC+1) M/H frame. For example, when PRC=011, the Parade_continuity_counter field value is incremented at each $4^{th}$ M/H frame.

The TNoG field indicates the total number of groups being assigned within a single subframe.

The overlay_group_status field indicates whether or not an overlay parade exists and also indicates the version information of the existing overlay parade. For example, when the overlay_group_status field value is equal to '00', this indicates that no overlay parade exists in the corresponding M/H frame. When the overlay_group_status field value is equal to any one of '01', '10', and '11', this indicates that an overlay parade exists within the corresponding M/H frame and also indicates the version of the current M/H frame.

The group_extension_mode field indicates extended group type information.

The information included in the TPC data are merely exemplary information that are proposed in order to facilitate the understanding of the present invention. Therefore, any addition or deletion of the information included in the TPC data may be easily varied or modified by anyone skilled in the related art. Therefore, the present invention will not be limited only to the examples presented in the description of the present invention set forth herein.

The FIC data transmit cross-layer information for faster mobile service acquisition. Herein, the FIC data may include channel combination information between an ensemble and mobile services.

Figure 58:
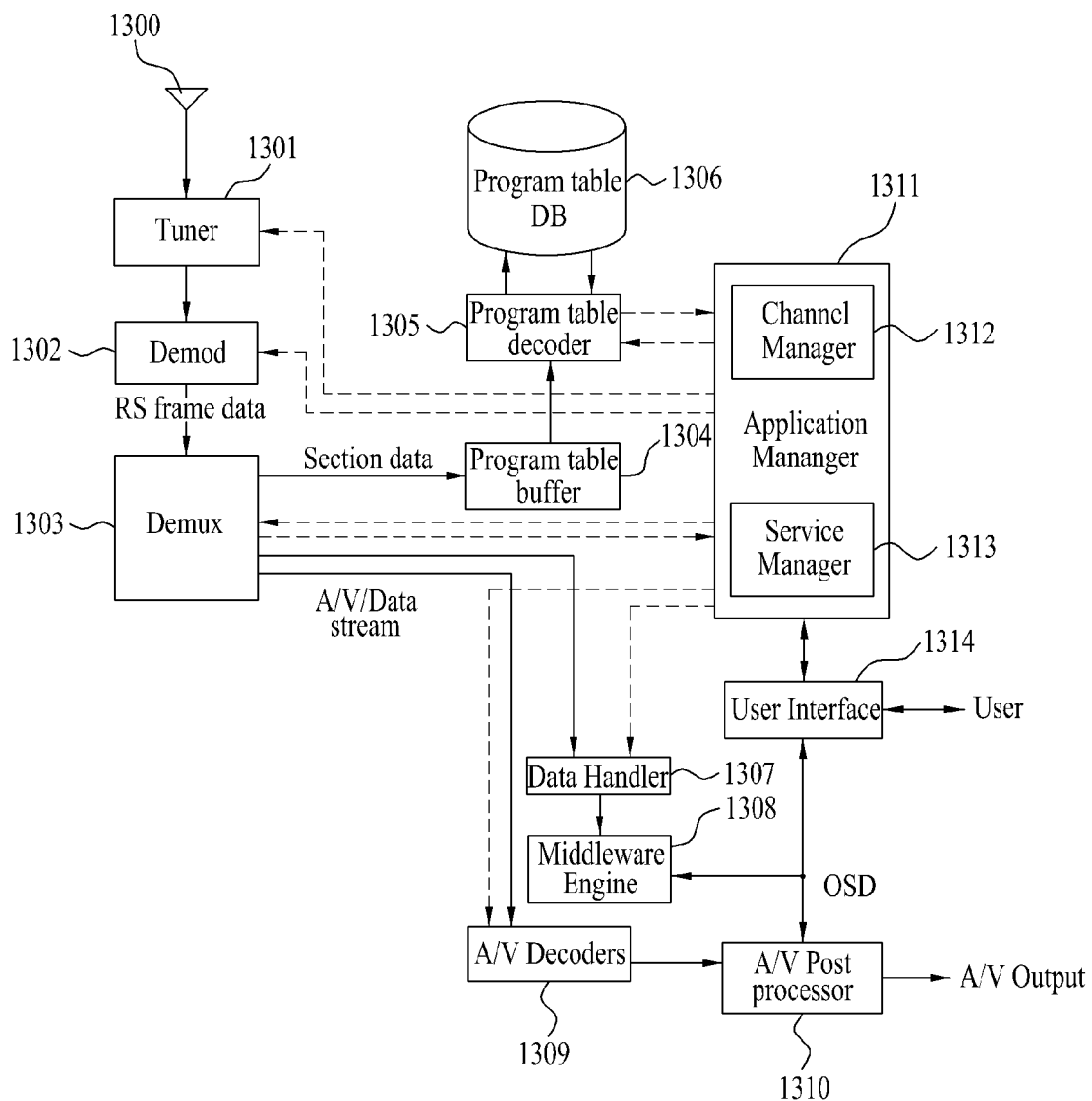
FIG. 58 is a block diagram illustrating a receiving system according to an embodiment of the present invention.

FIG. 58 is a block diagram illustrating a receiving system according to an embodiment of the present invention.

The receiving system of FIG. 58 includes an antenna 1300, a tuner 1301, a demodulating unit 1302, a demultiplexer 1303, a program table buffer 1304, a program table decoder 1305, a program table storage unit 1306, a data handler 1307, a middleware engine 1308, an A/V decoder 1309, an A/V post-processor 1310, an application manager 1311, and a user interface 1314. The application manager 1311 may include a channel manager 1312 and a service manager 1313.

In FIG. 58, solid lines indicate data flows and dotted lines indicate control flows.

The tuner 1301 tunes to a frequency of a specific channel through any of an antenna, a cable, or a satellite and down-converts the frequency to an Intermediate Frequency (IF) signal and outputs the IF signal to the demodulating unit 1302.

In one embodiment of the present invention, the tuner 1301 may select a frequency of a specific mobile broadcasting channel from among broadcasting channels transmitted via the antenna 1300. For example, if it is assumed that the receiving system is a terminal having both a communication function such as a phone function and a broadcast function such as a mobile broadcasting function, the antenna 1300 may be used as a broadcasting antenna, and an additional communication antenna may also be included in the receiving system. That is, the broadcasting antenna may be physically different than the communication antenna. For another example, one antenna may be used as both the broadcasting antenna and the communication antenna. For still another example, a plurality of antennas having different polarization characteristics may be used as a substitute for the broadcasting antenna, so that a multi-path diversity scheme is made available. In this case, although a quality of a received broadcast signal increases in proportion to the number of used antennas, power consumption excessively increases and the size of a space occupied by an overall system also increases. Therefore, it is preferable that a proper number of diversity antennas be used in consideration of the above-mentioned limitations.

Herein, the tuner 1301 is controlled by the channel manager 1312 in the application manager 1311 and reports the result and strength of a broadcast signal of the tuned channel to the channel manager 1312. Data received through the frequency of the specific channel includes main service data, mobile service data, a transmission parameter, and program table information for decoding the main service data and the mobile service data.

The demodulating unit 1302 performs VSB demodulation, channel equalization, etc., on the signal output from the tuner 1301 and identifies and separately outputs main service data and mobile service data. The demodulating unit 1302 will be described in detail in a later.

On the other hand, the transmitter can transmit signaling information (or TPC information) including transmission parameters by inserting the signaling information into at least one of a field synchronization region, a known data region, and a mobile service data region. Accordingly, the demodulating unit 1302 can extract the transmission parameters from the field synchronization region, the known data region, and the mobile service data region.

The transmission parameters may include M/H frame information, sub-frame information, slot information, parade-related information (for example, a parade_id, a parade repeat period, etc.), information of data groups in a sub-frame, RS frame mode information, RS code mode information, SCCC block mode information, SCCC outer code mode information, FIC version information, etc.

The demodulating unit 1302 performs block decoding, RS frame decoding, etc., using the extracted transmission parameters. For example, the demodulating unit 1302 performs block decoding of each region in a data group with reference to SCCC-related information (for example, SCCC block mode information or an SCCC outer code mode) included in the transmission parameters and performs RS frame decoding of each region included in the data group with reference to RS-related information (for example, an RS code mode).

In the embodiment of the present invention, an RS frame including mobile service data demodulated by the demodulating unit 1302 is input to the demultiplexer 1303.

That is, data inputted to the demultiplexer 1303 has an RS frame payload format as shown in FIG. 45. More specifically, the RS frame decoder of the demodulating unit 1302 performs the reverse of the encoding process performed at the RS frame encoder of the transmission system to correct errors in the RS frame and then outputs the error-corrected RS frame payload to a data derandomizer. The data derandomizer then performs derandomizing on the error-corrected RS frame payload through the reverse of the randomizing process performed at the transmission system to obtain an RS frame payload as shown in FIG. 45.

The demultiplexer 1303 may receive RS frame payloads of all parades and may also receive only an RS frame payload of a parade including a mobile service that the user desires to receive through power supply control. For example, when RS frame payloads of all parades are received, the demultiplexer 1303 can demultiplex a parade including a mobile service that the user desires to receive using a parade_id.

When one parade carries two RS frames, the demultiplexer 1303 needs to identify an RS frame carrying an ensemble including mobile service data to be decoded from a parade containing a mobile service that the user desires to receive. That is, when a received single parade or a parade demultiplexed from a plurality of parades carries a primary ensemble and a secondary ensemble, the demultiplexer 1303 selects one of the primary and secondary ensembles.

In an embodiment, the demultiplexer 1303 can demultiplex an RS frame carrying an ensemble including mobile service data to be decoded using an ensemble_id created by adding one bit to a left position of the parade_id.

The demultiplexer 1303 refers to the header of the mobile service data packet within the RS frame payload belonging to the ensemble including the mobile service data that are to be decoded, thereby identifying when the corresponding mobile service data packet is the signaling table information or the IP datagram of the mobile service data. Alternatively, when the signaling table information and the mobile service data are both configured in the form of IP datagrams, the demultiplexer 1303 may use the IP address in order to identify the IP datagram of the program table information and the mobile service data.

Herein, the identified signaling table information is outputted to the program table buffer 1304. And, audio/video/data streams are separated from the IP datagram of mobile service data that are to be selected among the IP datagrams of the identified mobile service data, thereby being respectively outputted to the A/V decoder 1309 and/or the data handler 1307.

According to an embodiment of the present invention, when the stuff_indicator field within the header of the mobile service data packet indicates that stuffing bytes are inserted in the payload of the corresponding mobile service data packet, the demultiplexer 1303 removes the stuffing bytes from the payload of the corresponding mobile service data packet. Then, the demultiplexer 1303 identifies the program table information and the mobile service data. Thereafter, the demultiplexer 1303 identifies A/V/D streams from the identified mobile service data.

The program table buffer 1304 temporarily stores the section-type program table information and then outputs the section-type program table information to the program table decoder 1305.

The program table decoder 1305 identifies tables using a table_id and a section_length in the program table information and parses sections of the identified tables and produces and stores a database of the parsed results in the program table storage unit 1306. For example, the program table decoder 1305 collects sections having the same table identifier (table_id) to construct a table. The program table decoder 1305 then parses the table and produces and stores a database of the parsed results in the program table storage unit 1306.

The A/V decoder 1309 decodes the audio and video streams outputted from the demultiplexer 1303 using audio and video decoding algorithms, respectively. The decoded audio and video data is outputted to the A/V post-processor 1310.

Here, at least one of an AC-3 decoding algorithm, an MPEG 2 audio decoding algorithm, an MPEG 4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm can be used as the audio decoding algorithm and at least one of an MPEG 2 video decoding algorithm, an MPEG 4 video decoding algorithm, an H.264 decoding algorithm, an SVC decoding algorithm, and a VC-1 decoding algorithm can be used as the audio decoding algorithm.

The data handler 1307 processes data stream packets required for data broadcasting among data stream packets separated (or identified) by the demultiplexer 1303 and provides the processed data stream packets to the middleware engine 1310 to allow the middleware engine 1310 to be multiplexed them with A/V data. In an embodiment, the middleware engine 1310 is a Java middleware engine.

The application manager 1311 receives a key input from the TV viewer and displays a Graphical User Interface (GUI) on the TV screen in response to a viewer request through a User Interface (UI). The application manager 1311 also writes and reads information regarding overall GUI control of the TV, user requests, and TV system states to and from a memory (for example, NVRAM or flash memory). In addition, the application manager 1311 can receive parade-related information (for example, a parade_id) from the demodulating unit 1302 to control the demultiplexer 1303 to select an RS frame of a parade including a required mobile service. The application manager 1311 can also receive an ensemble_id to control the demultiplexer 1303 to select an RS frame of an ensemble including mobile service data to be decoded from the parade. The application manager 1311 also controls the channel manager 1312 to perform channel-related operations (for example, channel map management and program table decoder operations).

The channel manager 1312 manages physical and logical channel maps and controls the tuner 1301 and the program table decoder 1305 to respond to a channel-related request of the viewer. The channel manager also requests that the program table decoder 1305 parse a channel-related table of a channel to be tuned and receives the parsing results from the program table decoder 1305.

Figure 59:
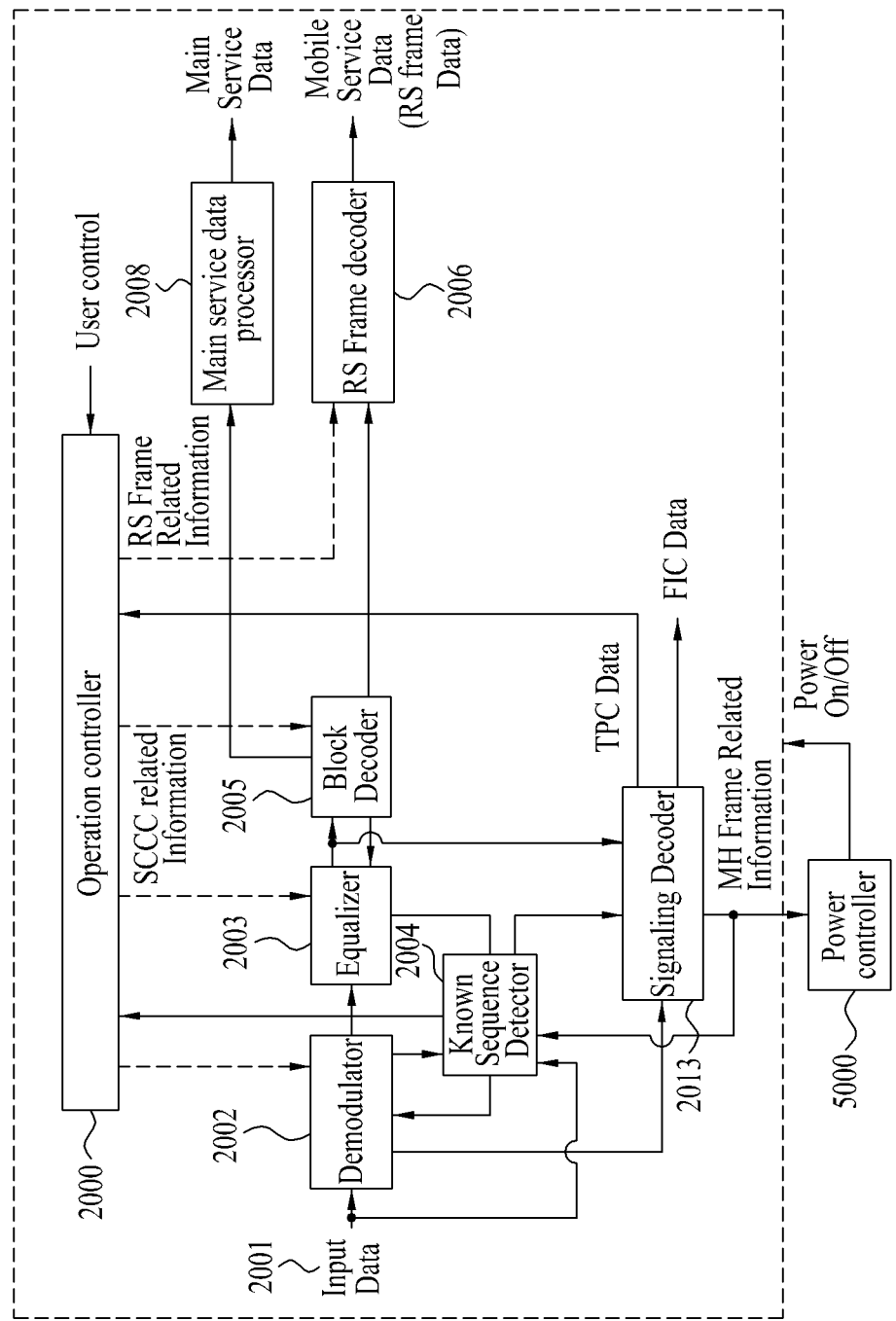
FIG. 59 illustrates an example of a demodulating unit in a digital broadcast receiving system according to the present invention.

FIG. 59 illustrates an example of a demodulating unit in a digital broadcast receiving system according to the present invention.

The demodulating unit of FIG. 59 uses known data information, which is inserted in the mobile service data section and, then, transmitted by the transmitting system, so as to perform carrier synchronization recovery, frame synchronization recovery, and channel equalization, thereby enhancing the receiving performance. Also the demodulating unit may turn the power on only during a slot to which the data group of the designated (or desired) parade is assigned, thereby reducing power consumption of the receiving system.

Referring to FIG. 59, the demodulating unit includes an operation controller 2000, a demodulator 2002, an equalizer 2003, a known sequence detector 2004, a block decoder 2005, and a RS frame decoder 2006. The demodulating unit may further include a main service data processor 2008. The main service data processor 2008 may include a data deinterleaver, a RS decoder, and a data derandomizer. The demodulating unit may further include a signaling decoder 2013. The receiving system also may further include a power controller 5000 for controlling power supply of the demodulating unit.

More specifically, a frequency of a particular channel tuned by a tuner down converts to an intermediate frequency (IF) signal. Then, the down-converted data 2001 outputs the down-converted IF signal to the demodulator 2002 and the known sequence detector 2004. At this point, the down-converted data 2001 is inputted to the demodulator 2002 and the known sequence detector 2004 via analog/digital converter ADC (not shown). The ADC converts pass-band analog IF signal into pass-band digital IF signal.

The demodulator 2002 performs self gain control, carrier recovery, and timing recovery processes on the inputted pass-band digital IF signal, thereby modifying the IF signal to a base-band signal. Then, the demodulator 2002 outputs the newly created base-band signal to the equalizer 2003 and the known sequence detector 2004.

The equalizer 2003 compensates the distortion of the channel included in the demodulated signal and then outputs the error-compensated signal to the block decoder 2005.

At this point, the known sequence detector 2004 detects the known sequence position information inserted by the transmitting end from the input/output data of the demodulator 2002 (i.e., the data prior to the demodulation process or the data after the demodulation process). Thereafter, the position information along with the symbol sequence of the known data, which are generated from the detected position, is outputted to the operation controller 2000, the demodulator 2002, the equalizer 2003, and the signaling decoder 2013. Also, the known sequence detector 2004 outputs a set of information to the block decoder 2005. This set of information is used to allow the block decoder 2005 of the receiving system to identify the mobile service data that are processed with additional encoding from the transmitting system and the main service data that are not processed with additional encoding.

In addition, although the connection status is not shown in FIG. 59, the information detected from the known sequence detector 2004 may be used throughout the entire receiving system and may also be used in the RS frame decoder 2006.

The data demodulated in the demodulator 2002 or the data equalized in the channel equalizer 2003 is inputted to the signaling decoder 2013. The known data position information detected in the known sequence detector 2004 is inputted to the signaling decoder 2013.

The signaling decoder 2013 extracts and decodes signaling information (e.g., TPC information, and FIC information), which inserted and transmitted by the transmitting end, from the inputted data, the decoded signaling information provides to blocks requiring the signaling information.

More specifically, the signaling decoder 2013 extracts and decodes TPC data and FIC data, which inserted and transmitted by the transmitting end, from the equalized data, and then the decoded TPC data and FIC data outputs to the operation controller 2000, the known sequence detector 2004, and the power controller 5000. For example, the TPC data and FIC data is inserted in a signaling information region of each data group, and then is transmitted to a receiving system.

The signaling decoder 2013 performs signaling decoding as an inverse process of the signaling encoder shown in FIG. 52, so as to extract TPC data and FIC data. For example, the signaling decoder 2013 decodes the inputted data using the PCCC method and derandomizes the decoded data, thereby dividing the derandomized data into TPC data and FIC data. At this point, the signaling decoder 2013 performs RS-decoding on the divided TPC data, so as to correct the errors occurring in the TPC data. Subsequently, the signaling decoder 2013 deinterleaves the divided FIC data and then performs RS-decoding on the deinterleaved FIC data, so as to correct the error occurring in the FIC data. The error-corrected TPC data are then outputted to the operation controller 2000, the known sequence detector 2004, and the power controller 5000.

The TPC data may also include a transmission parameter which is inserted into the payload region of an packet by the service multiplexer, and then is transmitted to transmitter.

Herein, the TPC data may include RS frame information, SCCC information, M/H frame information, and so on, as shown in FIG. 57. The RS frame information may include RS frame mode information and RS code mode information. The SCCC information may include SCCC block mode information and SCCC outer code mode information. The M/H frame information may include M/H frame index information, and the TPC data may include sub-frame count information, slot count information, parade_id information, SGN information, NoG information, and so on.

At this time, the signaling information area within the data group can be identified using known data information output from the known data detector 2004. The signaling information area is located from the first segment of data block B4 within the data group to a part of the second segment as shown in FIG. 51. Namely, in the present invention, 276 (=207+69) bytes of the data block B4 of each data group are assigned to an area for inserting signaling information. In other words, the signaling information area includes 207 bytes of the first segment of the data block B4 and first 69 bytes of the second segment of the data block B4. The first known data sequence (i.e., first training sequence) is inserted into the last two segments of the data block B3, and the second known data sequence (i.e., second training sequence) is inserted into the second and third segments of the data block B4. At this time, since the second known data sequence is received subsequently to the signaling information area, the signaling decoder 2013 can decode the signaling information of the signaling information area by extracting the same from the data output from the demodulator 2002 or the channel equalizer 2003.

Figure 60:
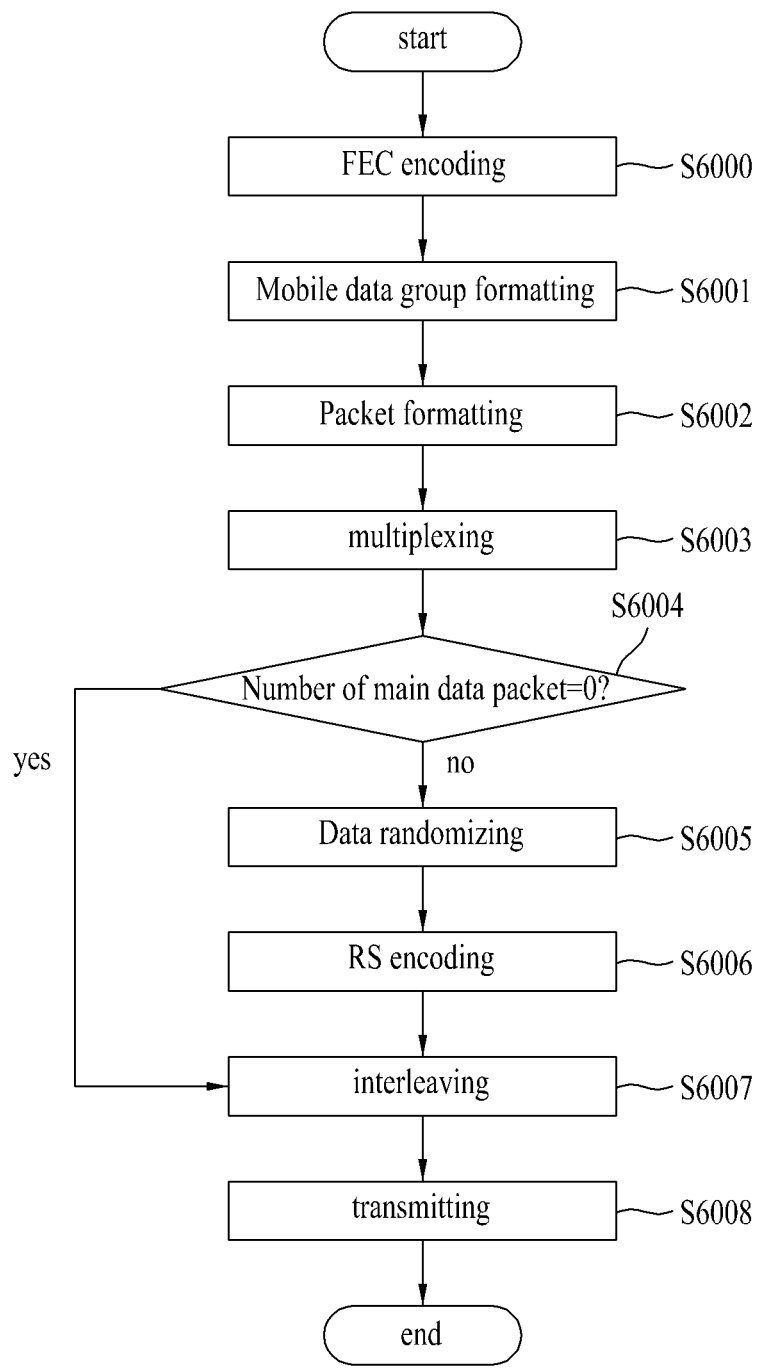
FIG. 60 illustrates a flow chart showing the exemplary operations of the transmitting system according to an embodiment of the present invention.

FIG. 60 illustrates a flow chart showing the exemplary operations of the transmitting system according to an embodiment of the present invention.

When mobile data are inputted, the RS frame encoder 103 performs an encoding process for forward error correction (FEC) on the inputted mobile data (S6000). Subsequently, the group formatter 106 receives the encoded mobile data outputted from the RS frame encoder 103. Then, the group formatter 106 adds known data sequences to the received mobile data so as to configure a data group (S6001).

The packet formatter 107 receives the data group outputted from the group formatter 106. Then, the packet formatter 107 uses data included in the data group so as to configure a specified number of mobile data packets and a first scalable number of mobile data packets (S6002).

When a second scalable number of main data packets is inputted, the packet MUX 108 multiplexes the mobile data packet configured by the packet formatter 107 and the second scalable number of main data packets. (S6003) In this case, a sum of the first and second scalable numbers may be equal to a specified (or specific) value. Herein, the sum may vary depending upon the intentions of the system designer. Furthermore, the second scalable number also has a specified (or specific) value. In the example given according to the embodiment of the present invention, the value of the second scalable number is equal to 9 or 0.

Therefore, the transmitting system determines whether or not the second scalable number is equal to '0' (S6004). When the transmitting system determines the second scalable number to be equal to '0', the data randomizer 110 performs data randomizing on the main data included in the multiplexed data outputted from the packet MUX 108 (S6005). Thereafter, the systematic/non-systematic RS encoder 111 performs systematic RS encoding on the main data and performs non-systematic RS encoding on the mobile data (S6006).

If the second scalable number is equal to '0', the data randomizer 110 and the systematic/non-systematic RS encoder 111 may by-pass the data randomizing, systematic RS encoding, and non-systematic RS encoding processes. The data interleaver 112 performs interleaving on the multiplexed data (S6007). Finally, the transmission unit transmits the interleaved data within a single slot (S6008).

Figure 61:
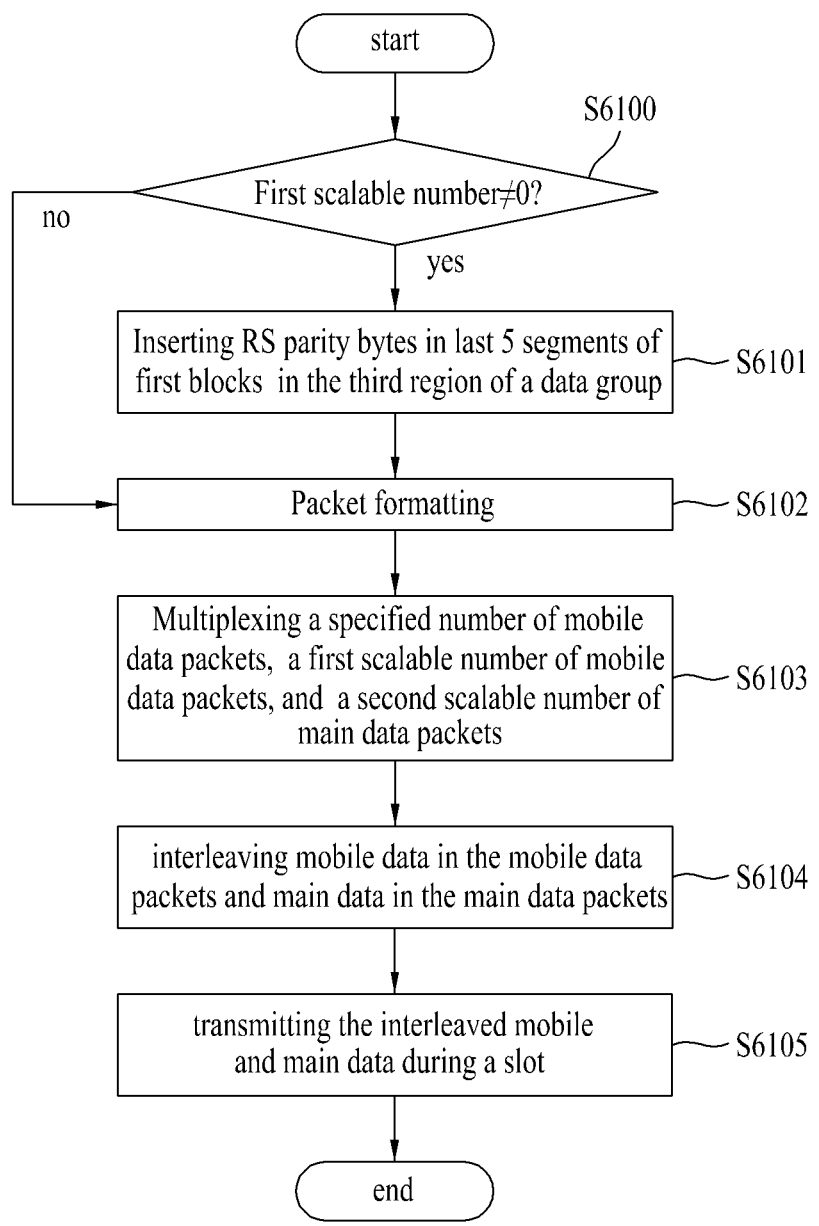
FIG. 61 illustrates a flow chart showing the exemplary operations of the transmitting system according to another embodiment of the present invention.

FIG. 61 illustrates a flow chart showing the exemplary operations of the transmitting system according to another embodiment of the present invention.

The system first decides whether the first scalable number is equal to '0' (S6100). If the first scalable number is equal to '0', this corresponds to a case where region E is not included in the data group. Therefore, in this case, the data group has the format as the data groups shown in FIG. 15 and FIG. 16. Conversely, if the first scalable number is not equal to '0', this corresponds to a case where region E is included in the data group. Therefore, in this case, the data group type of the data group may correspond to the same data group types, group types 1, 2, and 3, as those of the data groups respectively shown in FIG. 17 to FIG. 38.

In this case, the RS parity bytes are assigned to the last 5 segments of the first block included in the third region of the data group (S6101). Herein, the insertion position of the RS parity bytes may be varied depending upon the intentions and design of the system designer.

Hereinafter, the packet formatter 107 uses data included in the data group so as to configure a specified number of mobile data packets and a first scalable number of mobile data packets (S6102).

The packet MUX 108 multiplexes a specified number of mobile data packets, a first scalable number of mobile data packets, and a second scalable number of main data packets (S6103).

The data interleaver 112 performs interleaving on the multiplexed data (S6104). Finally, the transmission unit transmits the interleaved data within a single slot (S6105).

FIG. 61, S6101: Assign RS Parity Bytes to Last 5 Segments of First Block Included in Third Region of Data Group.

As described above, the transmitting system, the receiving system, and the method of processing broadcast signals according to the present invention have the following advantages.

When transmitting mobile service data through a channel, the present invention may be robust against errors and backward compatible with the conventional digital broadcast receiving system.

This invention extends a region for mobile service data in a slot. Thus, the transmitter can transmit more mobile service data.

This invention has an advantage enhancing the reception performance of a broadcast signal at a reception system, and a method for processing a broadcast signal by inserting additional known data in regions C, D and E.

Finally, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for transmitting broadcast signals, the method comprising:
   encoding first service data and second service data, wherein the first service data includes data of a core mode, and the second service data includes data of the core mode and data of an extended mode, and wherein the data of the core and extended modes of the second service data are encoded by different code rates;
   interleaving the first service data and the second service data, wherein the interleaved first service data and the interleaved second service data include groups, respectively, and a number of the groups is variable based on an amount of the interleaved first service data or the interleaved second service data;
   building at least one signal frame including the interleaved first service data and the interleaved second service data; and
   transmitting broadcast signals including the built at least one signal frame.

2. The method of claim 1, wherein the built at least one signal frames includes signaling information which includes information for fast service acquisition.

3. The method of claim 2, wherein the built at least one signal frame includes frame number information indicating a number of sub-frames included in the built at least one signal frame, and version information indicating a version of the signaling information.

4. The method of claim 3, wherein the built at least one signal frame includes known data, and the known data is used for channel equalization.

5. The method of claim 4, wherein the known data is inserted by a specific pattern.

6. The method of claim 5, wherein each of the known data is spaced apart regularly.

7. An apparatus for transmitting broadcast signals, the apparatus comprising:
   an encoder to encode first service data and second service data, wherein the first service data includes data of a core mode, and the second service data includes data of the core mode and data of an extended mode, and wherein the data of the core and extended modes of the second service data are encoded by different code rates;
   an interleaver to interleave the first service data and the second service data, wherein the interleaved first service data and the interleaved second service data include groups, respectively, and a number of groups is variable based on amount of the interleaved first service data or the interleaved second service data;
   a builder to build at least one signal frame including the interleaved first service data and the interleaved second service data; and
   a transmitter to transmit broadcast signals including built at least one signal frame.

8. The apparatus of claim 7, wherein the built at least one signal frame includes signaling information which includes information for fast service acquisition.

9. The apparatus of claim 8, wherein the built at least one signal frame includes frame number information indicating a number of sub-frames included in the built at least one signal frame, and version information indicating a version of the signaling information.

10. The apparatus of claim 7, wherein the built at least one signal frame includes known data, and the known data is used for channel equalization.

11. The apparatus of claim 10, wherein the known data is inserted by a specific pattern.

12. The apparatus of claim 11, wherein each of the known data is spaced apart regularly.

* * * * *